(12) United States Patent
Mizutani et al.

(10) Patent No.: US 6,479,213 B2
(45) Date of Patent: Nov. 12, 2002

(54) POSITIVE PHOTORESIST COMPOSITION

(75) Inventors: Kazuyoshi Mizutani, Shizuoka (JP); Shoichiro Yasunami, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/020,958

(22) Filed: Dec. 19, 2001

(65) Prior Publication Data

US 2002/0106581 A1 Aug. 8, 2002

Related U.S. Application Data

(62) Division of application No. 09/671,177, filed on Sep. 28, 2000, now Pat. No. 6,387,590.

(30) Foreign Application Priority Data

| Sep. 28, 1999 | (JP) | 11-275332 |
| Sep. 28, 1999 | (JP) | 11-275335 |
| Sep. 29, 1999 | (JP) | 11-277016 |
| Sep. 29, 1999 | (JP) | 11-277017 |

(51) Int. Cl.$^7$ ............................................. G03F 7/004
(52) U.S. Cl. ..................... 430/270.1; 522/148
(58) Field of Search ..................... 430/270.1; 522/148

(56) References Cited

U.S. PATENT DOCUMENTS

| 4,722,881 A | | 2/1988 | Ueno et al. | |
| 5,882,844 A | * | 3/1999 | Tsuchiya et al. | 430/288.1 |
| 6,087,064 A | * | 7/2000 | Lin et al. | 430/270.1 |
| 6,187,505 B1 | * | 2/2001 | Lin et al. | 430/270.1 |
| 6,303,268 B1 | * | 10/2001 | Namba et al. | 430/270.1 |

FOREIGN PATENT DOCUMENTS

| JP | A-61-144639 | 7/1986 |
| JP | A-61-256347 | 11/1986 |
| JP | A-62-136638 | 6/1987 |
| JP | A-62-159141 | 7/1987 |
| JP | A-62-191849 | 8/1987 |
| JP | A-62-220949 | 9/1987 |
| JP | A-62-229136 | 10/1987 |
| JP | A-63-90534 | 4/1988 |
| JP | A-63-91654 | 4/1988 |
| JP | A-8-160605 | 6/1996 |
| JP | A-8-160620 | 6/1996 |
| JP | A-8-160621 | 6/1996 |
| JP | A-8-160623 | 6/1996 |
| JP | A-9-87391 | 3/1997 |
| JP | A-9-274319 | 10/1997 |
| JP | B-2736939 | 1/1998 |
| JP | A-11-302382 | 11/1999 |

OTHER PUBLICATIONS

PAJ (JP–A–8–160605).
PAJ (JP–A–8–160620).
PAJ (JP–A–8–160621).
PAJ (JP–A–8–160623).
PAJ (JP–A–9–087391).
PAJ (JP–A–11–302382).
CA abstract 131:82236, Vlasova, N.N. et al. "Organosilicon complexing solvents for rare–earth elements", 364(4), 1996, 492–494.

* cited by examiner

*Primary Examiner*—Rosemary Ashton
(74) *Attorney, Agent, or Firm*—Sughrue Mion, PLLC

(57) ABSTRACT

Disclosed is a positive photoresist composition comprising an alkali-soluble polysiloxane containing as a copolymerization component at least a structural unit represented by the following formula (I') and a positive photoresist composition comprising an acid-decomposable polysiloxane containing as a copolymerization component at least a structural unit represented by the following formula (I"):

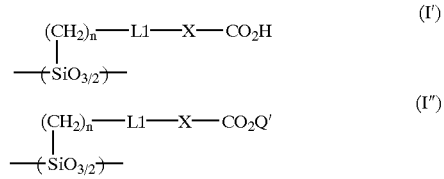

wherein L1 represents at least one divalent linking group selected from —A—OCO—, —A—COO—, —A—NHCO—, —A—NHCOO—, —A—NHCONH—, —A—CONH—, —A—OCONH— and —A—S—, A represents a single bond or an arylene group, X represents a divalent linking group, and n represents an integer of 1 to 6.

9 Claims, No Drawings

POSITIVE PHOTORESIST COMPOSITION

This is a divisional application of U.S. patent application Ser. No. 09/671,177, filed Sep. 28, 2000, now U.S. Pat. No. 6,387,590, the entire disclosure of which is incorporated herein by reference.

FIELD OF THE INVENTION

The present invention relates to a positive photoresist composition for use in the production of semiconductor integrated circuit device, mask for the production of integrated circuit, printed wiring board, liquid crystal panel and the like.

BACKGROUND OF THE INVENTION

In the formation of a pattern for the production of electric parts of semiconductor device, magnetic bubble memory, integrated circuit and the like, a method of using a photoresist sensitive to ultraviolet ray or visible light has heretofore been widely used in practice. The photoresist includes a negative type photoresist where the area irradiated with light is insolubilized in the developer and a positive type photoresist where the area is solubilized. The negative type is a predominant photoresist until recent years because the sensitivity is high as compared with the positive type and excellent properties necessary for the wet etching are ensured, namely, adhesive property to the substrate and resistance against-chemicals.

However, with the progress of the semiconductor device and the like toward higher densification and higher integration, the pattern is extremely reduced in the line width or space. Furthermore, dry etching is employed for the etching of the substrate and to keep up with this, the photoresist is demanded to have high resolution and high dry etching resistance. Because of these reasons, the positive photoresist occupies the major part at present. Particularly, out of the positive photoresists, an alkali development-type positive photoresist using as a base an alkali-soluble novolak resin described, for example, in J. C. Strieter, *Kodak Microelectronics Seminar Proceedings*, 116 (1976), is excellent in the sensitivity, resolution and dry etching resistance and therefore, predominating in the current process.

However, in recent years, the electronic equipment tends to have multiple functions and higher performance and in order to attain higher densification and higher integration, the pattern is strongly demanded to be finer.

More specifically, the integrated circuit is not so much reduced in the vertical dimension as compared with the reduction in the transverse direction, therefore, the ratio of the height to the width of the resist pattern must be necessarily large. Due to this, as the pattern becomes finer, the resist pattern on a wafer having a complicated structure with different heights encounters more difficulties in suppressing its dimensional change.

Furthermore, in various exposure systems, a problem arises accompanying the reduction of the minimum dimension. For example, in the exposure by light, the interference action of the reflected light ascribable to the difference in height on a substrate greatly affects the dimensional precision and in the electronic beam exposure, the ratio of the height to the width of a fine resist pattern cannot be increased due to the proximity effect generated by the back scattering of electrons.

It has been found that a large number of these problems can be solved by using a multi-layer resist system. The multi-layer resist system is generally described in *Solid State Technology*, 74 (1981) and other publications also report the studies on this system.

In general, the multi-layer resist system includes a three-layer resist system and a two-layer resist system. The three-layer resist system is a method of coating an organic flattening film on a substrate having different heights, superposing thereon an inorganic intermediate layer and a resist, patterning the resist, dry-etching the inorganic intermediate layer using the resist as the mask, and patterning the organic flattening film by $O_2$RIE (reactive ion etching) using the inorganic intermediate layer as the mask. In this system, conventional techniques can be fundamentally used, therefore, studies thereon have been started from an early time. However, this system has problems in that the process is very complicated or since three layers different in the physical properties, namely, organic film, inorganic film and organic film, are superposed, cracks or pinholes are readily generated in the intermediate layer.

As compared with this three-layer resist system, the two-layer resist system uses a resist having the properties both of the resist and the inorganic intermediate layer of the three-layer resist system, namely, a resist having resistance against oxygen plasma, therefore, cracks or pinholes are prevented from occurring. Furthermore, the reduction from three layers to two layers simplifies the process. However, unlike the three-layer resist system where a conventional resist can be used as the upper layer resist, the two-layer resist system must disadvantageously develop a new resist having resistance against oxygen plasma.

Under these circumstances, it has been demanded to develop a high-sensitivity and high-resolution positive photoresist having excellent oxygen plasma resistance and capable of being used as the upper layer resist in the two-layer resist system and the like, particularly an alkali development-system resist for which the current process can be used without any change.

For this, a photosensitive composition obtained by combining an alkali solubility-imparted silicon polymer such as polysiloxane and polysilyl methylene, with a conventional orthoquinonediazide photosensitive material has been proposed and examples thereof include photo-sensitive compositions described in JP-A-61-144639 (the term "JP-A" as used herein means an "unexamined published Japanese patent application"), JP-A-61-256347, JP-A-62-159141, JP-A-62-191849, JP-A-62-220949, JP-A-62-229136, JP-A-63-90534, JP-A-63-91654 and U.S. Pat. No. 4,722,881, and a photosensitive composition obtained by combining an effective amount of an onium salt to a polysiloxane/carbonate block copolymer described in JP-A-62-136638.

These silicon polymers all are imparted with the alkali solubility by the introduction of a phenolic OH group or a silanol group ($\equiv$Si—OH). In the case of imparting the alkali solubility by the introduction of a phenolic OH group, the production is very difficult and in the case of imparting the alkali solubility by the silanol group, the aging stability is not sufficiently high or the film loss after the development is disadvantageously large and a rectangular shape cannot be obtained.

Japanese Patent No. 2736939 and JP-A-9-274319 disclose a photoresist containing polysiloxane having within the molecule a group capable of decomposing under the action of an acid. However, these photoresists are disadvantageous in that the resolution is low, a rectangular shape cannot be formed, and the dimensional shift increases at the transfer of the pattern to the lower layer in the subsequent oxygen plasma etching step.

SUMMARY OF THE INVENTION

One object of the present invention is to provide a positive photoresist composition for use in the production of a semiconductor device, which gives a photoresist having high sensitivity and high resolution of 0.2 μm or less and at the same time, having a rectangular shape.

Another object of the present invention is to provide a positive photoresist composition which is, when used as an upper layer resist in the two-layer resist system, reduced in the dimensional shift at the transfer of the pattern to the lower layer in the oxygen plasma etching step.

Still another object of the present invention is to provide a polysiloxane capable of imparting the above-described excellent properties to a positive photoresist composition.

According to the present invention, the following polysiloxanes and positive photoresist compositions are provided and by these, the above-described objects of the present invention can be attained.

(1) A positive photoresist composition comprising a polysiloxane 1 containing as a copolymerization component at least a structural unit represented by the following formula (I):

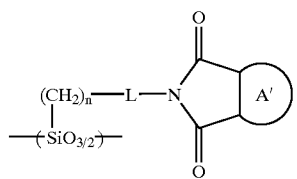

wherein L represents a single bond or an arylene group, A' represents an aromacyclic or alicyclic structure which may have a substituent, and n represents an integer of 1 to 6.

(2) The positive photoresist composition as described in (1) above, wherein the structural unit represented by formula (I) is derived from a monomer component synthesized by the reaction of a silane compound having an amino group with an aromatic acid anhydride or an alicyclic acid anhydride.

(3) The positive photoresist composition as described in (1) above, wherein the polysiloxane 1 further contains as a copolymerization component an alkali-soluble siloxane structural unit represented by the following formula (II):

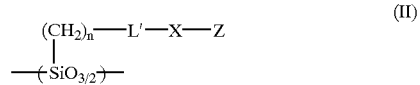

wherein L' represents —A—OCO—, —A—COO—, —A—NHCO—, —A—NHCOO—, —A—NHCONH—, —A—CONH— or —A—S—, A represents a single bond or an arylene group, X represents a divalent linking group, Z represents

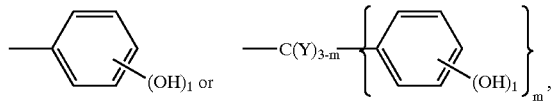

Y represents hydrogen atom, a linear, branched or cyclic alkyl group, an aryl group or an aralkyl group, 1 represents an integer of 1 to 3, m represents an integer of 1 to 3, and n represents an integer of 1 to 6.

(4) The positive photoresist composition as described in (1) above, wherein the polysiloxane 1 further contains as a copolymerization component an alkali-soluble siloxane structural unit represented by the following formula (III):

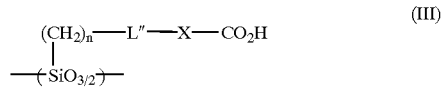

wherein L' represents —B—OCO—, —B—COO—, —B—NHCO—, —B—NHCOO—, —B—NHCONH—, —B—CONH— or —B—S—, B represents a single bond or an arylene group, X represents a divalent linking group, and n represents an integer of 1 to 6.

(5) The positive photoresist composition as described in (1) above, wherein the polysiloxane 1 contains as copolymerization components both the alkali-soluble siloxane structural unit represented by formula (II) and the alkali-soluble siloxane structural unit represented by formula (III).

(6) A positive photoresist composition comprising:

(a) the polysiloxane 1 described in any one of (1) to (5) above, (b) a compound which decomposes upon exposure to generate an acid, and (c) a phenolic compound in which phenolic hydroxyl groups contained within the molecule are partially or completely protected by a group capable of decomposing by an acid, or an aromatic or aliphatic carboxylic acid compound in which carboxyl groups contained within the molecule are partially or completely protected by a group capable of decomposing by an acid.

(7) A positive photoresist composition comprising a polysiloxane 2 containing at least a siloxane structural unit represented by the following formula (I) and a siloxane structural unit having a group capable of decomposing by an acid to generate an alkali-soluble group:

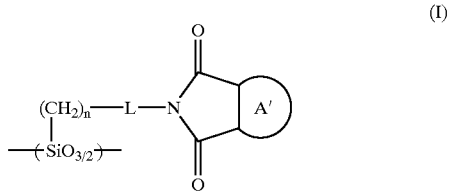

wherein L represents a single bond or an arylene group, A' represents an aromacyclic or alicyclic structure which may have a substituent, and n represents an integer of 1 to 6.

(8) The positive photoresist composition as described in (7) above, wherein the structural unit represented by formula (I) is derived from a monomer component synthesized by the reaction of a silane compound having an amino group with an aromatic acid anhydride or an alicyclic acid anhydride.

(9) The positive photoresist composition as described in (7) above, wherein the polysiloxane 2 contains a structural unit represented by the following formula (II') as the siloxane structural unit having a group capable of decomposing by an acid to generate an alkali-soluble group:

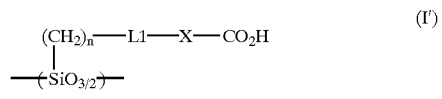

wherein L1 represents at least one divalent linking group selected from —A—OCO—, —A—COO—, —A—NHCO—, —A—NHCOO—, —A—NHCONH—, —A—CONH—, —A—OCONH— and —A—S—, A represents a single bond or an arylene group, X represents a divalent linking group, and n represents an integer of 1 to 6.

(15) The positive photoresist composition as described in (14) above, wherein in the structural unit represented by formula (I'), X is an aromacyclic or alicyclic group.

(16) The positive photoresist composition as described in (14) above, wherein the alkali-soluble polysiloxane 3 further contains as a copolymerization component a structural unit represented by the following formula (II''):

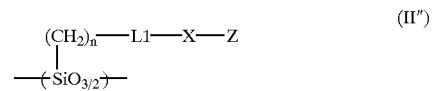

wherein L1 represents at least one divalent linking group selected from —A—OCO—, —A—COO—, —A—NHCO—, —A—NHCOO—, —A—NHCONH—, —A—CONH—, —A—OCONH— and —A—S—, A represents a single bond or an arylene group, X represents a divalent linking group, Z represents

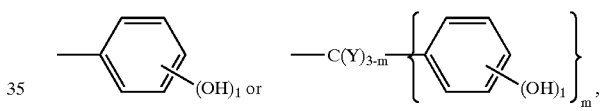

Y represents hydrogen atom, a linear, branched or cyclic alkyl group, an aryl group or an aralkyl group, l represents an integer of 1 to 3, m represents an integer of 1 to 3, and n represents an integer of 1 to 6.

(17) A positive photoresist composition comprising:
(a) the polysiloxane 3 described in any one of (14) to (16) above,
(b) a compound which decomposes upon exposure to generate an acid, and
(c) a phenolic compound in which phenolic hydroxyl groups contained within the molecule are partially or completely protected by a group capable of decomposing by an acid, or an aromatic or aliphatic carboxylic acid compound in which carboxyl groups contained within the molecule are partially or completely protected by a group capable of decomposing by an acid.

(18) A positive photoresist composition comprising an acid-decomposable polysiloxane 4 containing at least a structural unit represented by the following formula (I''):

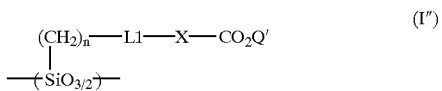

wherein L1 represents at least one divalent linking group selected from —A—OCO—, —A—COO—, —A—NHCO—, —A—NHCOO—, —A—NHCONH—, —A—CONH—, —A—OCONH— and —A—S—, A represents a single bond or an arylene group, X represents a

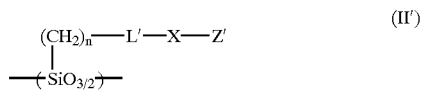

wherein L' represents at least one divalent linking group selected from —A—OCO—, —A—COO—, —A—NHCO—, —A—NHCOO—, —A—NHCONH—, —A—CONH— and —A—S—, A represents a single bond or an arylene group, X represents a divalent linking group, Z' represents

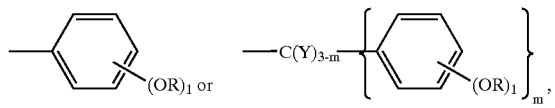

R represents a group capable of decomposing by an acid, Y represents hydrogen atom, a linear, branched or cyclic alkyl group, an aryl group or an aralkyl group, l represents an integer of 1 to 3, m represents an integer of 1 to 3, and n represents an integer of 1 to 6.

(10) The positive photoresist composition as described in (7) above, wherein the polysiloxane 2 contains a structural unit represented by the following formula (III') as the siloxane structural unit having a group capable of decomposing by an acid to generate an alkali-soluble group:

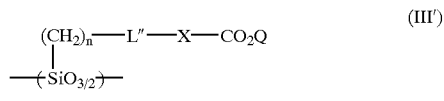

wherein L'' represents at least one divalent linking group selected from —B—OCO—, —B—COO—, —B—NHCO—, —B—NHCOO—, —B—NHCONH—, —B—CONH— and —B—S—, B represents a single bond or an arylene group, X represents a divalent linking group, Q represents an acid-decomposable group, and n represents an integer of 1 to 6.

(11) The positive photoresist composition as described in (7) above, wherein the polysiloxane 2 contains both the structural unit represented by formula (II') and the structural unit represented by formula (III') as the siloxane unit having a group capable of decomposing by an acid to generate an alkali-soluble group.

(12) A positive photoresist composition comprising:
(a) the acid-decomposable polysiloxane 2 described in any one of (7) to (11) above, and
(b) a compound which decomposes upon exposure to generate an acid.

(13) The positive photoresist composition as described in (12) above, which further contains (c) a phenolic compound (c1) in which at least a part of phenolic hydroxyl groups contained within the molecule are protected by an acid-decomposable group, or an aromatic or aliphatic carboxylic acid compound in which at least a part of carboxyl groups contained within the molecule are protected by an acid-decomposable group.

(14) A positive photoresist composition comprising an alkali-soluble polysiloxane 3 containing as a copolymerization component at least a structural unit represented by the following formula (I'):

divalent linking group, Q' represents hydrogen atom or an acid-decomposable group, provided that all Q' in the polysiloxane 4 containing the structural unit represented by formula (I") are not hydrogen atom at the same time, and n represents an integer of 1 to 6.

(19) The positive photoresist composition as described in (18) above, wherein in the structural. unit represented by formula (I"), X is an aromacyclic or alicyclic group.

(20) The positive photoresist composition as described in (18), wherein the acid-decomposable polysiloxane 4 contains both a structural unit represented by formula (I") and a structural unit represented by the following formula (II'''):

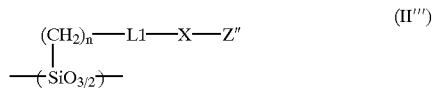
(II''')

wherein L1 represents at least one divalent linking group selected from —A—OCO—, —A—COO—, —A—NHCO—, —A—NHCOO—, —A—NHCONH—, —A—CONH—, —A—OCONH— and —A—S—, A represents a single bond or an arylene group, X represents a divalent linking group, Z" represents

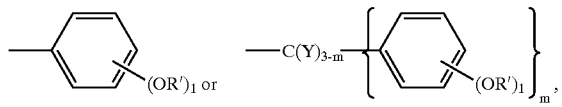

R' represents hydrogen atom or a group capable of decomposing by an acid, Y represents hydrogen atom, a linear, branched or cyclic alkyl group, an aryl group or an aralkyl group, l represents an integer of 1 to 3, m represents an integer of 1 to 3, and n represents an integer of 1 to 6.

(21) A positive photoresist composition comprising:
(a) the acid-decomposable polysiloxane 4 described in any one of (18) to (20) above, and
(b) a compound which decomposes upon exposure to generate an acid.

(22) The positive photoresist composition as described in (21) above, which further contains (c) a phenolic compound in which phenolic hydroxyl groups contained within the molecule are partially or completely protected by a group capable of decomposing by an acid, or an aromatic or aliphatic carboxylic acid compound in which carboxyl groups contained within the molecule are partially or completely protected by a group capable of decomposing by an acid.

DETAILED DESCRIPTION OF THE INVENTION

The polysiloxanes of the present invention are described below.

In formula (I), L represents a single bond or an arylene group.

The arylene group is preferably an arylene group having from 6 to 11 carbon atoms including those in the substituent and specific examples thereof include an ortho-, meta- or para-phenylene group which may have a substituent and a naphthylene group which may have a substituent. Among these, preferred are paraphenylene group and naphthylene group.

A' represents an aromacyclic or alicyclic group, preferably a benzene ring which may have a substituent, a naphthalene ring which may have a substituent, or a cycloolefin ring which may have a substituent, more preferably a benzene ring, an alkyl-substituted benzene ring, a naphthalene ring, a cyclohexane ring, a cyclohexene ring, an alkyl-substituted cyclohexane ring, a norbornane ring or a norbornene ring.

In formulae (II) and (II'), L' represents at least one divalent linking group selected from the group consisting of —A—OCO—, —A—COO—, —A—NHCO—, —A—NHCOO—, —A—NHCONH—, —A—CONH—, and —A—S— (wherein A represents a single bond or an arylene group), preferably —OCO— or —$C_6H_4$—OCO—, more preferably —OCO—.

The arylene group is preferably an arylene group having from 6 to 11 carbon atoms including those in the substituent and specific examples thereof include an ortho-, meta- or para-phenylene group which may have a substituent and a naphthylene group which may have a substituent. Among these, preferred are paraphenylene group and naphthylene group.

In formulae (II), (II'), (III) and (III'), X represents a single bond or a divalent linking group. Examples of the divalent linking group include a linking group comprising one or a combination of two or more, selected from a linear alkylene group having from 1 to 6 carbon atoms, a branched alkylene group having from 1 to 6 carbon atoms, a cycloalkylene group having from 6 to 10 carbon atoms, an arylene group having from 6 to 10 carbon atoms and an aralkylene group having from 7 to 11 carbon atoms. X may contain one or more group selected from —O—, —CO—, —S—, —$SO_2$— and —CH=CH—, between X and Z or Z', Preferred examples of the alkylene group include methylene, ethylene, propylene and butylene; preferred examples of the cycloalkylene group include cyclohexylene; preferred examples of the arylene group include phenylene and naphthylene; and preferred examples of the aralkylene group include phenylenemethylene.

In formulae (II) and (II'), Y represents hydrogen atom, an alkyl group, an aryl group or an aralkyl group. The alkyl group may be linear, branched or cyclic. The alkyl group preferably has from 1 to 10 carbon atoms, the aryl group preferably has from 6 to 10 carbon atoms, and the aralkyl group preferably has from 7 to 11 carbon atoms.

Specific examples of Y include hydrogen atom, a methyl group, an ethyl group, a n-propyl group, an i-propyl group, a n-butyl group, an i-butyl group, a t-butyl group, a n-pentyl group, an i-pentyl group, a n-hexyl group, a cyclohexyl group, a phenyl group, a naphthyl group, a benzyl group, a phenethyl group and a naphthylmethyl group. Among these, hydrogen atom and a methyl group are preferred.

In formulae (I), (II), (II'), (III) and (III'), n represents an integer of 1 to 6, preferably from 1 to 3. In formulae (II) and (II'), l represents an integer of 1 to 3, preferably 1 or 2, and m represents an integer of 1 to 3, preferably 1 or 2.

In the case where a phenolic hydroxyl group of an alkali-soluble polysiloxane represented by formula (II') is protected to form an acid-decomposable polysiloxane, examples of the acid-decomposable group as the protective group include a group represented by —$CR^1R^2(OR^3)$, a tert-butoxycarbonyl group, a tert-butoxycarbonylmethyl group, a tert-butyl group, a tert-amyl group, a 1-methylcyclohexyl group, a trimethylsilyl group and a tert-butyldimethylsilyl group. $R^1$ and $R^2$, which may be the same or different, each represents hydrogen atom or a linear or branched alkyl group having from 1 to 6 carbon atoms, and $R^3$ represents a linear, branched or cyclic alkyl group having from 1 to 10 carbon atoms. $R^2$ and $R^3$ may combine to form a ring structure, preferably a 6-membered ring structure.

Specific preferred examples of the acid-decomposable group include a tert-butoxycarbonyl group, a tert-butyl group, a trimethylsilyl group, a tert-butyldimethylsilyl group and a group represented by the following formulae:

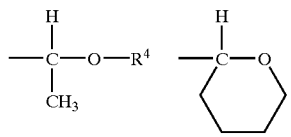

wherein $R^4$ represents a methyl, ethyl, n-propyl, i-propyl, n-butyl, i-butyl or tert-butyl group.

In formula (II'), R is an acid-decomposable group described above and may be a combination of two or more different acid-decomposable groups.

In the case where a carboxyl group of an alkali-soluble polysiloxane represented by formula (III') is protected to form an acid-decomposable polysiloxane, examples of the acid-decomposable group as the protective group include a group represented by —$CR^5R^6(OR^7)$, a tetrahydropyranyl group, a methoxymethyl group, an ethoxymethyl group, a tert-butyl group, a tert-amyl group, a 1-methylcyclohexyl group, a trimethylsilyl group and a tert-butyldimethylsilyl group. $R^5$ and $R^6$, which may be the same or different, each represents hydrogen atom or a linear or branched alkyl group having from 1 to 6 carbon atoms, and $R^7$ represents a linear, branched or cyclic alkyl group having from 1 to 10 carbon atoms. $R^6$ and $R^7$ may combine to form a ring structure, preferably a 6-membered ring structure.

Specific preferred examples of the acid-decomposable group include a tert-butyl group, a trimethylsilyl group, a tert-butyldimethylsilyl group, an ethoxymethyl group and a group represented by the following formulae:

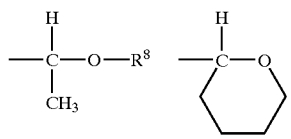

wherein $R^8$ represents a methyl, ethyl, n-propyl, i-propyl, n-butyl, i-butyl or tert-butyl groups In formula (III'), Q is an acid-decomposable group described above and may be a combination of two or more different acid-decomposable groups.

The siloxane unit having a group capable of decomposing by an acid to generate an alkali-soluble group includes, in addition to the siloxane units represented by formulae (II') and (III'), siloxane units represented by the following formulae (IV) and (V):

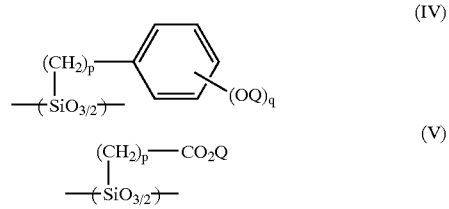

wherein Q has the same meaning as Q above, p represents an integer of 1 to 6, and q represents an integer of 1 to 3.

In order to control the solvent solubility or alkali solubility, the polysiloxane of the present invention may be co-condensed with a structural unit represented by the following formula (VI) and/or (VII):

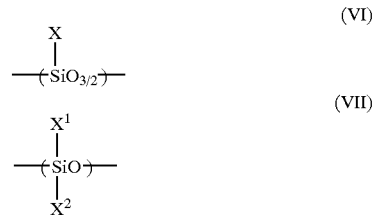

wherein X, $X^1$ and $X^2$ each represents a group having neither alkali solubility nor acid decomposability. More specifically, X, $X^1$ and $X^2$ each represents a linear alkyl group having from 1 to 10 carbon atoms, which may have a substituent, a branched alkyl group having from 3 to 10 carbon atoms, which may have a substituent, or a cyclic alkyl group having from 6 to 10 carbon atoms, which may have a substituent, an aryl group having from 6 to 10 carbon atoms, which may have a substituent, or an aralkyl group having from 7 to 11 carbon atoms, which may have a substituent.

Specific preferred examples of these groups include methyl, ethyl, n-propyl, i-propyl, n-butyl, i-butyl, tert-butyl, n-pentyl, n-hexyl, n-heptyl, n-octyl, n-nonyl, n-decyl, cyclohexyl, phenyl, naphthyl, benzyl and naphthylmethyl.

Examples of the substituent of these groups include a halogen atom, an alkoxy group having from 1 to 6 carbon atoms, a phenoxy group and a hydroxyl group. $X^1$ and $X^2$ may be the same or different.

The polysiloxane 2 of the present invention can be obtained by mixing at least trialkoxysilane of giving a structure represented by formula (I) with trialkoxysilane separately synthesized to have a group capable of decomposing by an acid to generate an alkali-soluble group, adding, if desired, monosubstituted trialkoxysilane or disubstituted dialkoxysilane for giving a structural unit represented by formula (VI) and/or (VII), and condensation-polymerizing these in the presence of water and an acid catalyst or water and a base catalyst. The trialkoxysilane of giving a structural unit represented by formula (I) can be obtained from a monosubstituted trialkoxysilane having an amino group at the terminal and a cyclic acid anhydride More specifically, this trialkoxysilane can be obtained by the reaction of an acid anhydride selected from a cyclohexanedicarboxylic acid anhydride, a methylcyclohexyldicarboxylic acid anhydride, a tetrahydrophthalic acid anhydride, a norbornenedicarboxylic acid anhydride, a norbornanedicarboxylic acid anhydride, cantharidin, methylnorbornenedicarboxylic acid anhydride, phthalic acid anhydride, methylphthalic acid anhydride, dichlorophthalic acid anhydride, tetrachlorophthalic acid anhydride, hydroxyphthalic acid anhydride, nitrophthalic acid anhydride and naphthalenedicarboxylic acid anhydride, with a monosubstituted trialkoxysilane having an amino group at the terminal (e.g., aminopropyltrimethoxysilane, aminopropyltriethoxysilane, aminophenyltrimethoxysilane).

The alkali-soluble polysiloxane 1 which further has a structural unit represented by formula (II) can be obtained, when L' is —OCO—, by reacting (chloroalkyl)trialkoxysilane with a carboxylic acid compound containing a phenol structure at the terminal in the presence of a base catalyst (at this time, a salt such as potassium iodide may be added to accelerate the reaction), adding a siloxane unit (trialkoxysilane compound) for giving a structural unit represented by formula (I), which is separately prepared from a monosubstituted trialkoxysilane having an amino group at the terminal and a cyclic acid anhydride, and if desired, a monosubstituted alkoxysilane or disubstituted dialkoxysilane for giving a structural unit represented by formula (IV) and/or (V), and condensation-polymerizing these in the presence of water and an acid catalyst or water and a base catalyst. In another method, the condensation-polymerization product of these alkoxysilanes may be reacted with a carboxylic acid containing a phenol structure at the terminal.

The polysiloxane 1 can be obtained by preparing respectively corresponding siloxane unit having a structural unit represented by formula (II) (trialkoxysilane compound) from trialkoxysilane having an amino group at the terminal when L' is —NHCO—, —NHCOO— or —NHCONH—, from trialkoxysilane having a mercapto group at the terminal when L' is —S—, and from trialkoxysilane having a carboxyl group at the terminal when L' is —COO— or —CONH—, adding a siloxane unit (trialkoxysilane compound) for giving a structural unit represented by formula (I), which is separately prepared, and if desired, a monosubstituted alkoxysilane or disubstituted dialkoxysilane for giving a structural unit represented by formula (IV) and/or (V), and condensation-polymerizing these in the presence of water and an acid catalyst or water and a base catalyst.

The trialkoxysilane compound having a group capable of decomposing by an acid to generate an alkali-soluble group can be obtained, for example, when L' in formula (II') is —OCO—, by reacting (chloroalkyl)trialkoxysilane with a carboxylic acid compound containing a phenol group at the terminal in the presence of a base catalyst (at this time, a salt such as potassium iodide and ammonium tetramethyl iodide may be added to accelerate the reaction), and then protecting the phenolic hydroxyl group by an acid-decomposable group. When L" in formula (III') is —B—OCO— and B is a single bond, the compound may be obtained by reacting trialkoxysilane having an amino group at the terminal with a cyclic acid anhydride at room temperature or less and then protecting the remaining carboxyl group by an acid-decomposable group.

In another method, the polysiloxane 2 of the present invention may be obtained by reacting the condensation-polymerization product of the alkoxysilanes with a carboxylic acid containing a phenol structure at the terminal in the same manner to obtain an alkali-soluble polysiloxane and then subjecting the alkali-soluble polysiloxane to a known reaction such as an acid catalyst reaction with a vinyl ether compound corresponding to the acid-decomposable group, or a base catalyst reaction with di-tert-butyl dicarbonate, trimethylsilyl chloride or tert-butyldimethylsilyl chloride.

When L' is —COO—, —NHCO—, —NHCOO—, —NHCONH—, —CONH— or —S—, the polysiloxane 2 may be obtained in the same manner using trialkoxysilane having a carboxyl group, an amino group or a mercapto group at the terminal.

In the present invention, the content ratio of the structural unit of formula (I) to the structural unit of formula (II) and/or (III) is preferably from 30/70 to 80/20 (by mol), more preferably from 40/60 to 60/40 (by mol).

Specific examples of the constituent unit of polysiloxane 1, namely, alkali-soluble polysiloxane, of the present invention are set forth below, however, the present invention is by no means limited thereto.

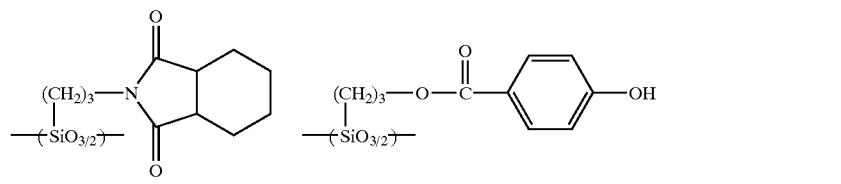

C1-1

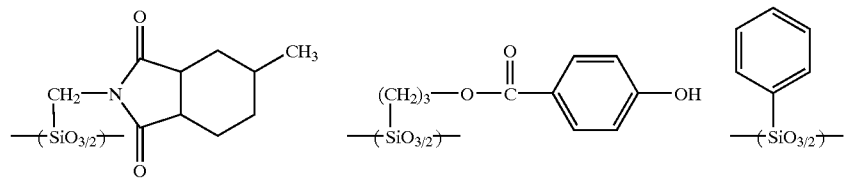

C1-2

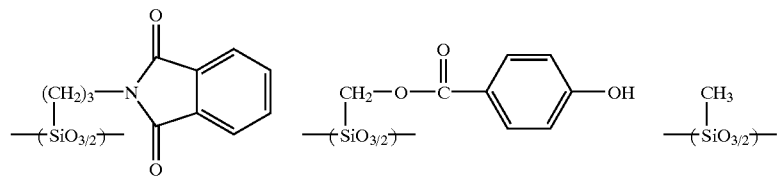

C1-3

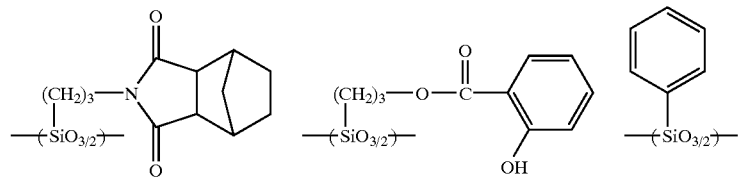

C1-4

-continued
C1-5
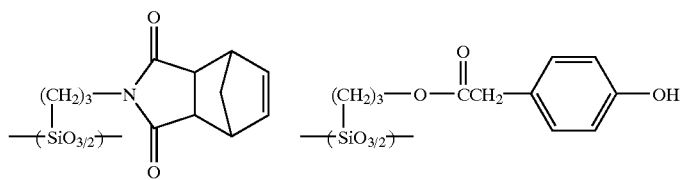
C1-6
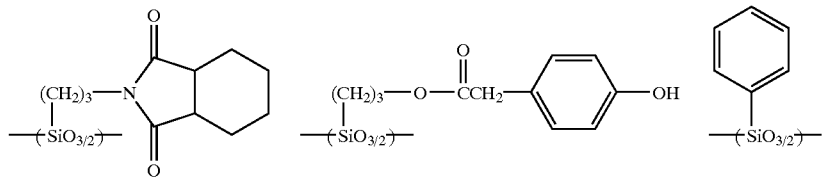
C1-7
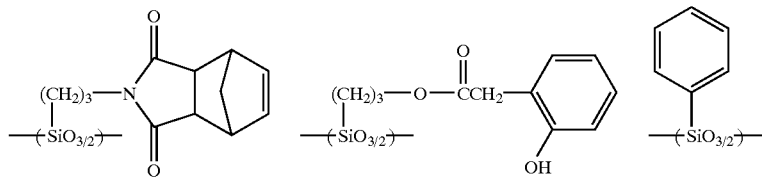
C1-8
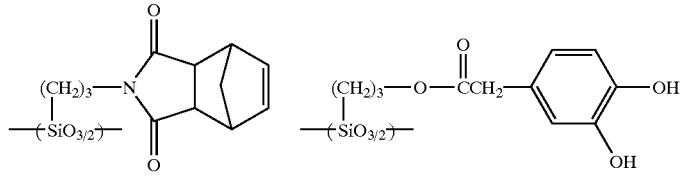
C1-9
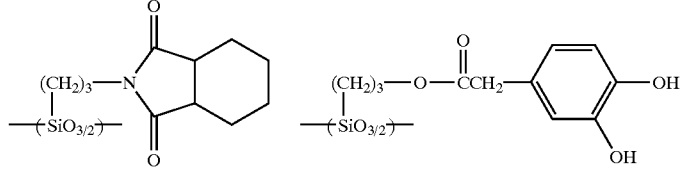
C1-10
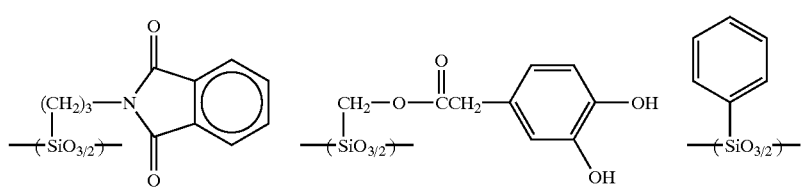
C1-11
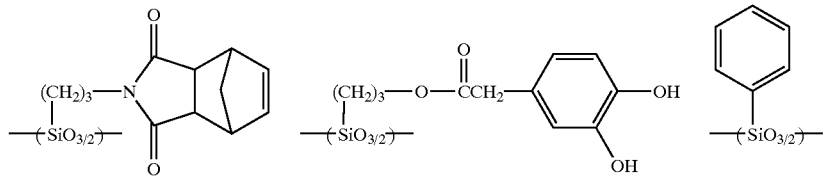
C1-12
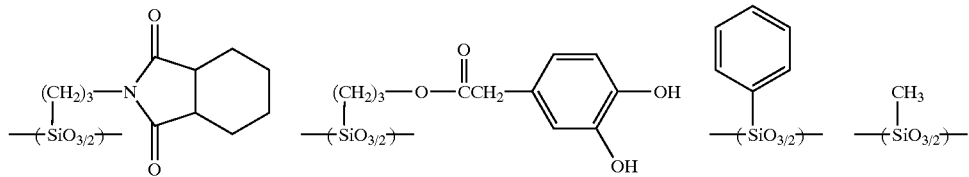

-continued
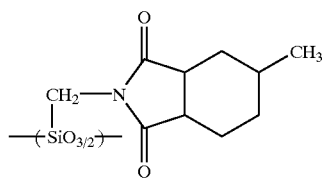 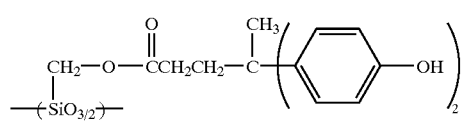
C1-13
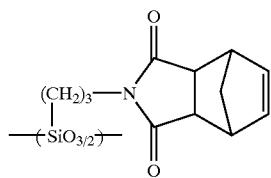 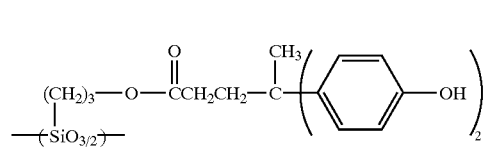
C1-14
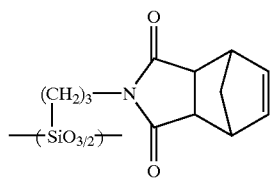 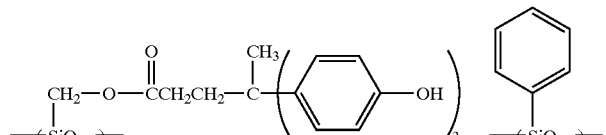
C1-15
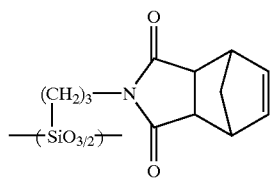 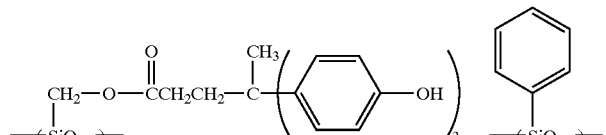
C1-16
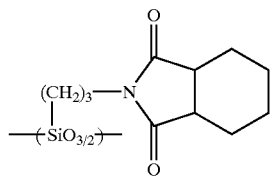 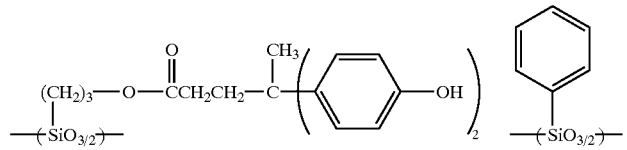
Cl-17
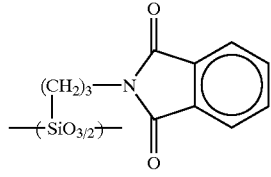 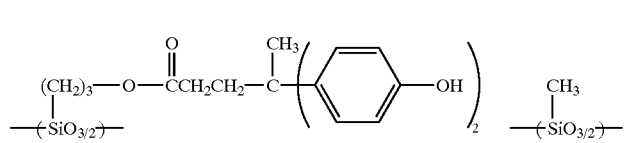
C1-18
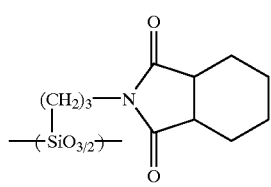 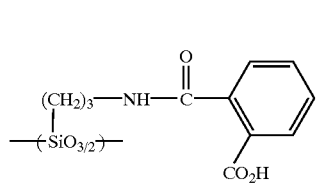
C1-19
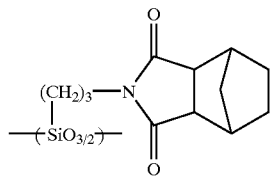 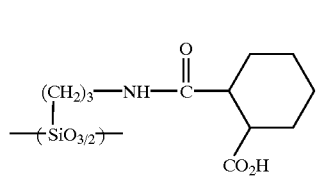
C1-20
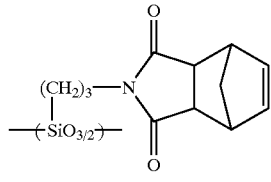 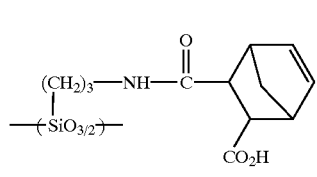

-continued
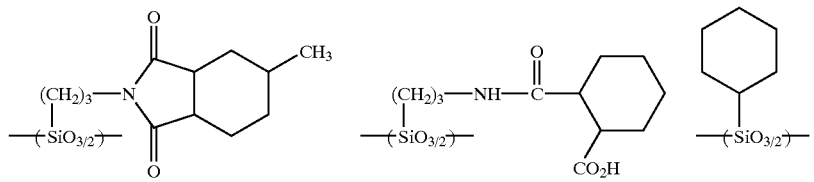
C1-21
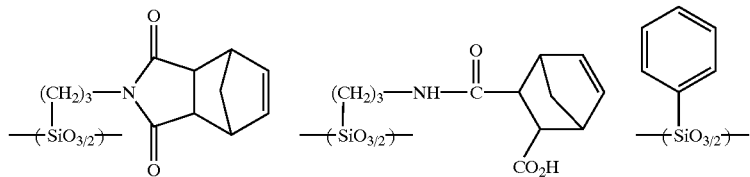
C1-22
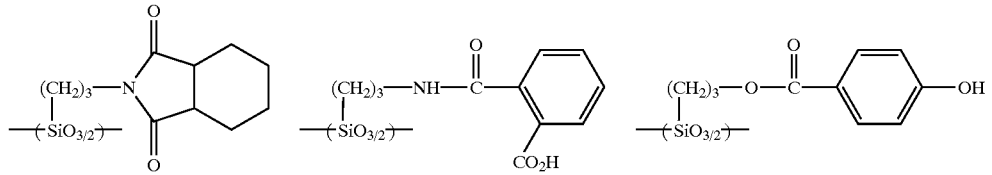
C1-23
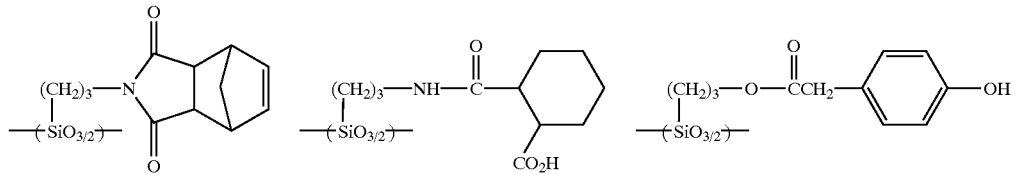
C1-24
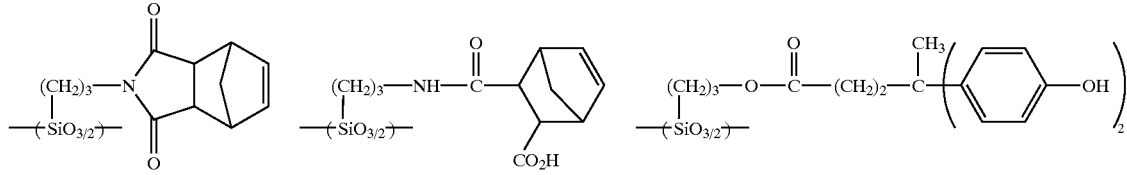
C1-25
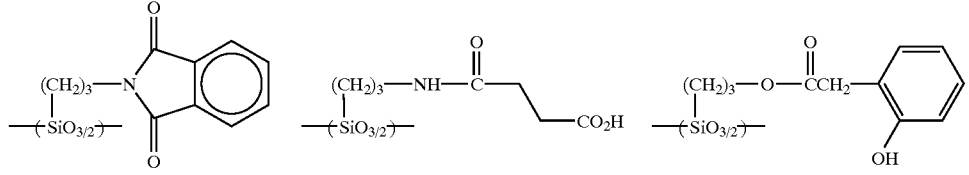
C1-26
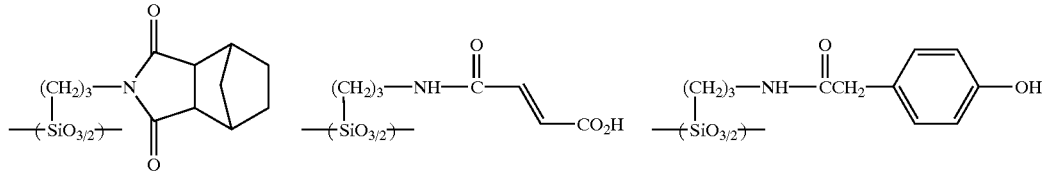
C1-27
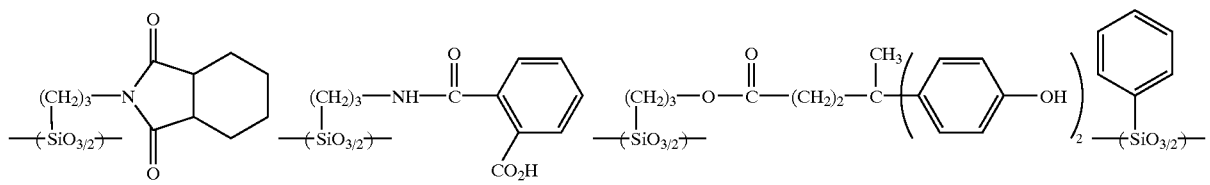
C1-28

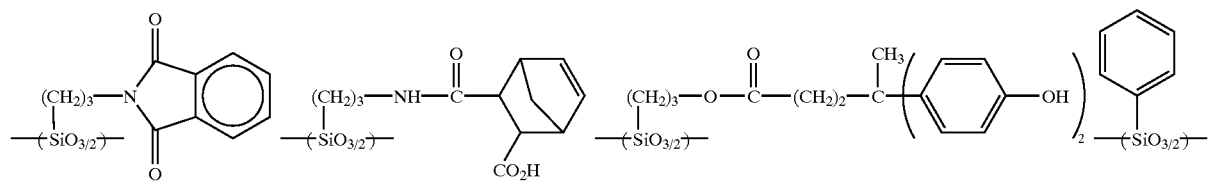

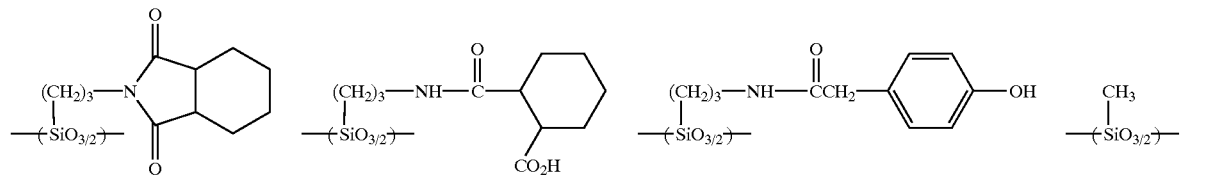

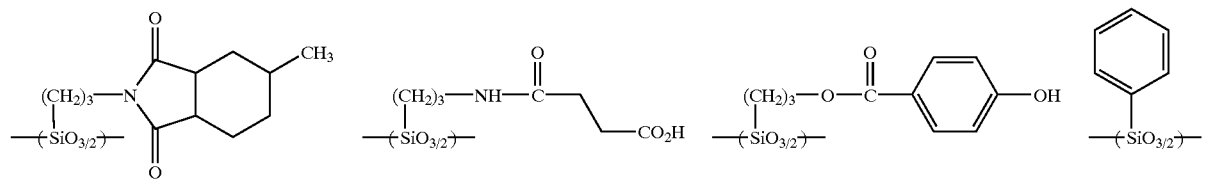

In the present invention, the content ratio of the structural unit of formula (I') to the structural unit of formula (III) and/or (III') is preferably from 30/70 to 80/20 (by mol), more preferably from 40/60 to 60/40 (by mol).

Specific examples of the constituent unit of polysiloxane 2, namely, alkali-soluble polysiloxane and acid-decomposable polysiloxane, of the present invention are set forth below, however, the present invention is by no means limited thereto.

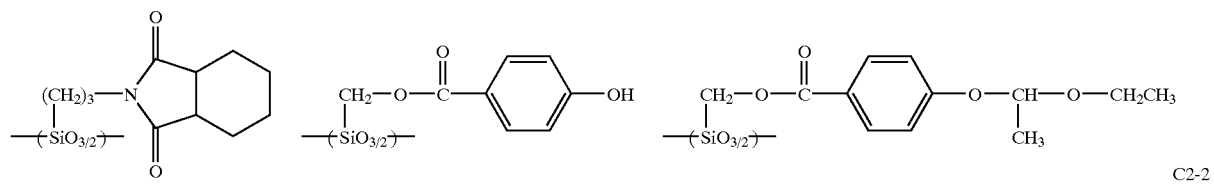

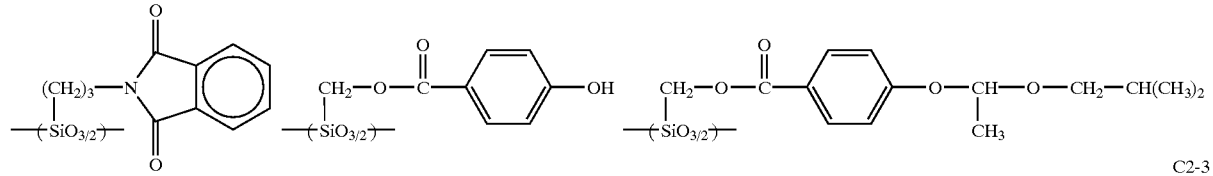

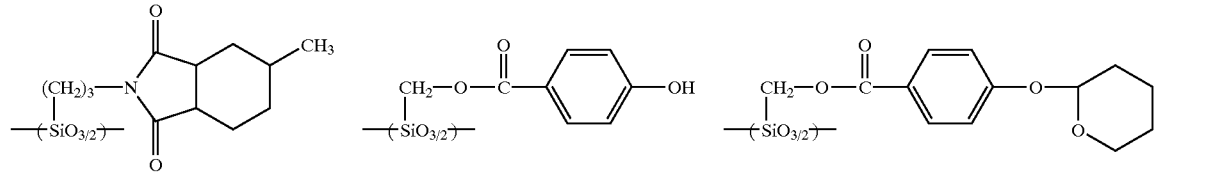

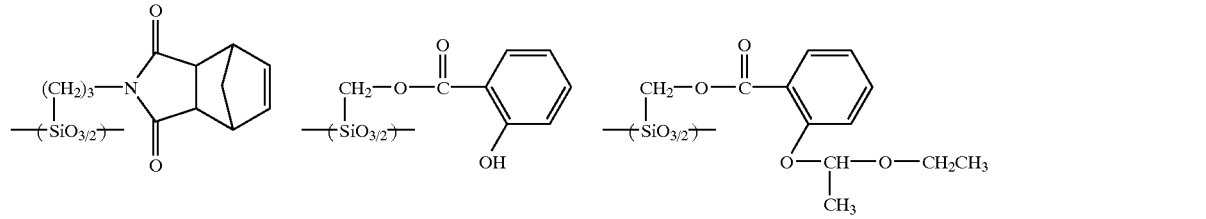

-continued
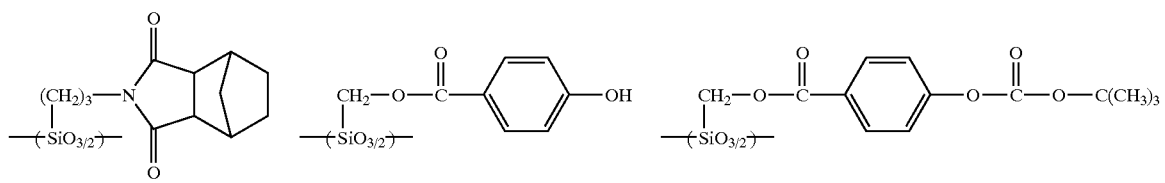
C2-5
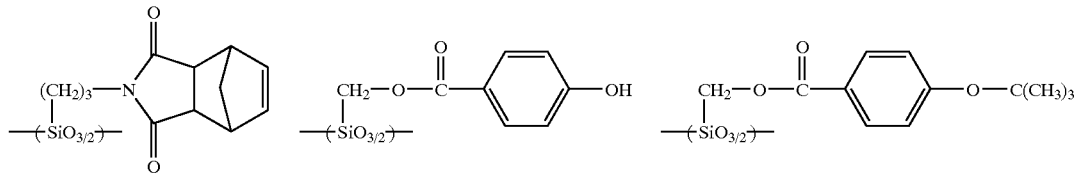
C2-6
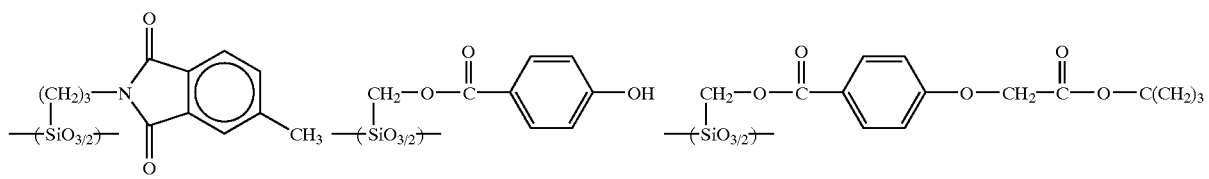
C2-7
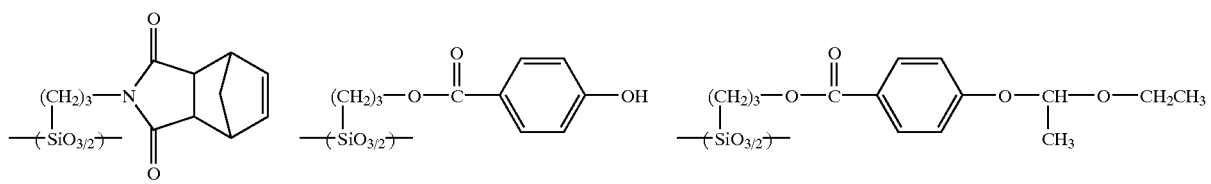
C2-8
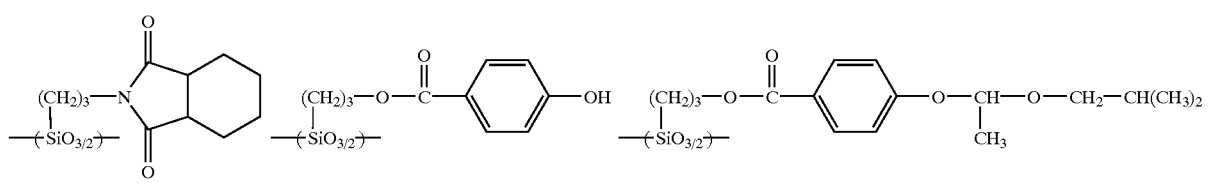
C2-9
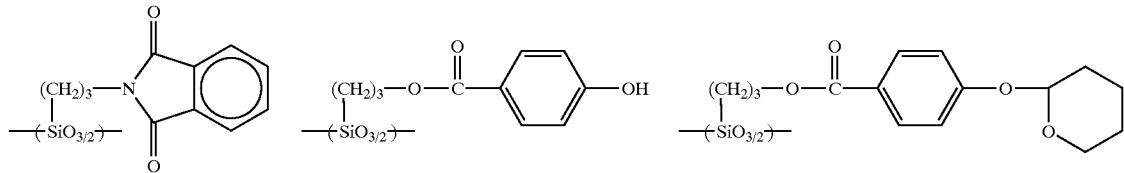
C2-10
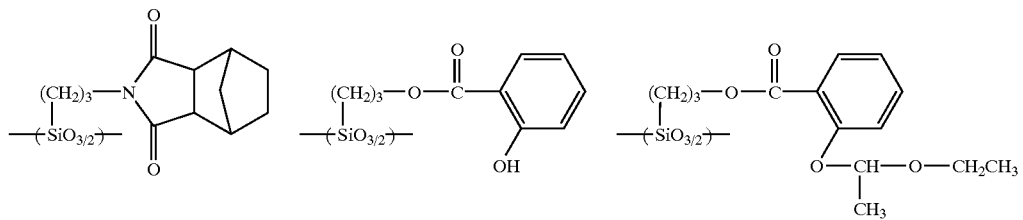
C2-11
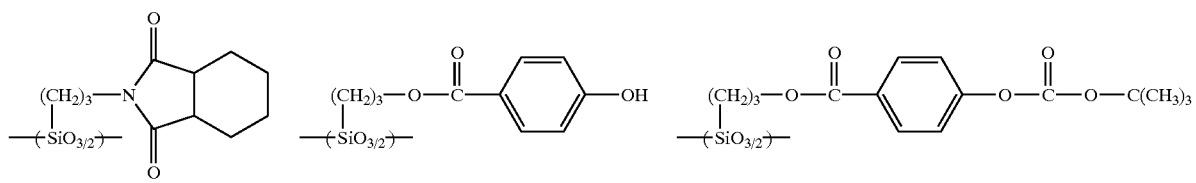
C2-12

-continued
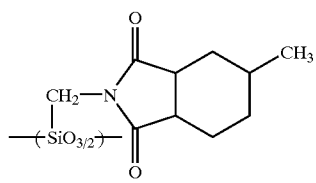 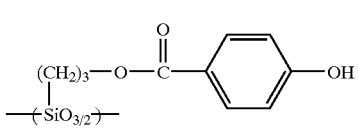 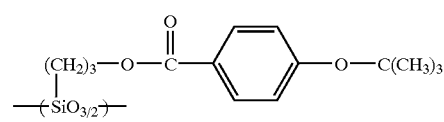
C2-13
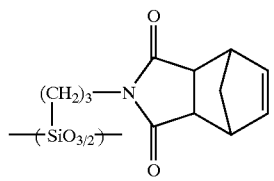 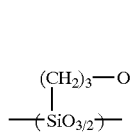 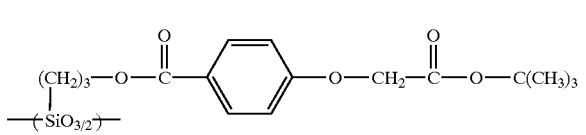
C2-14
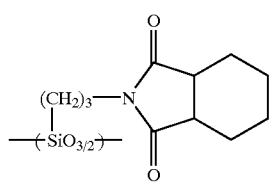 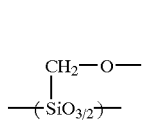 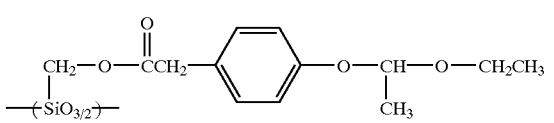
C2-15
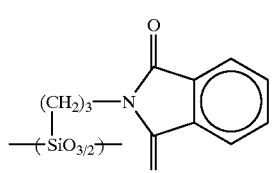 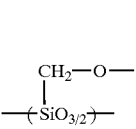 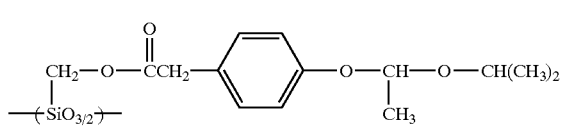
C2-16
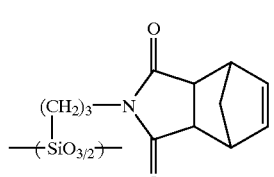 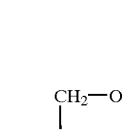 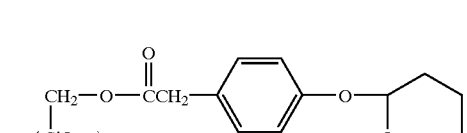
C2-17
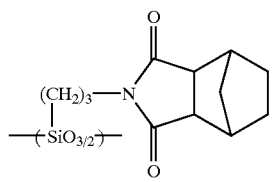 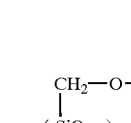 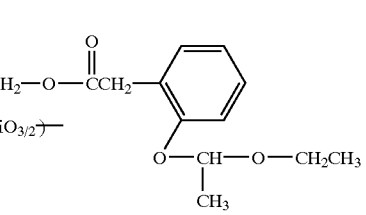
C2-18
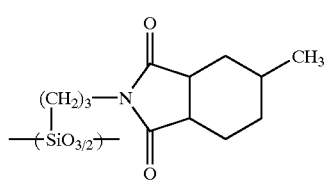 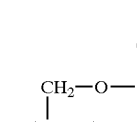 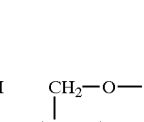
C2-19
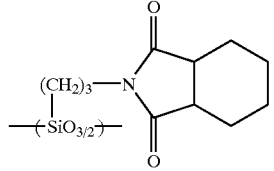 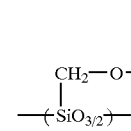 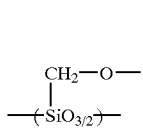
C2-20

-continued
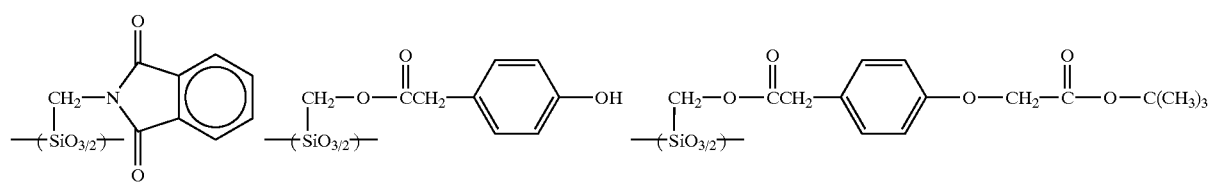
C2-21
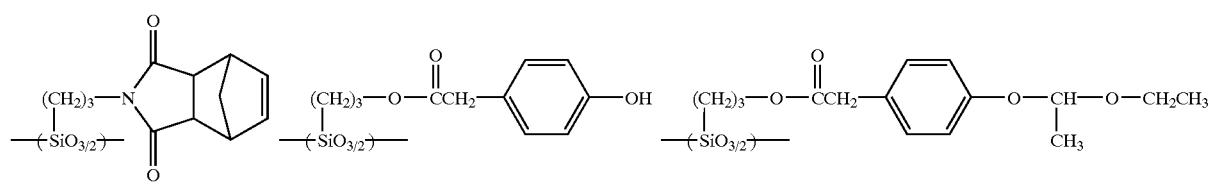
C2-22
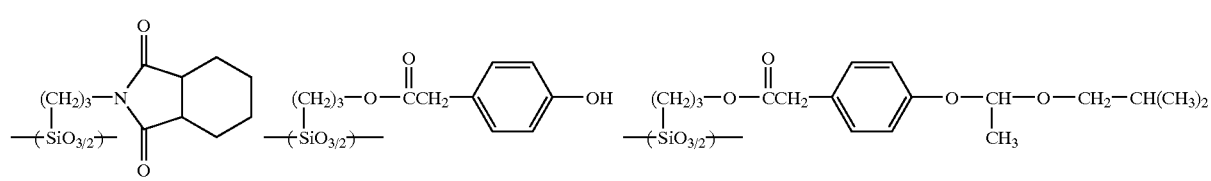
C2-23
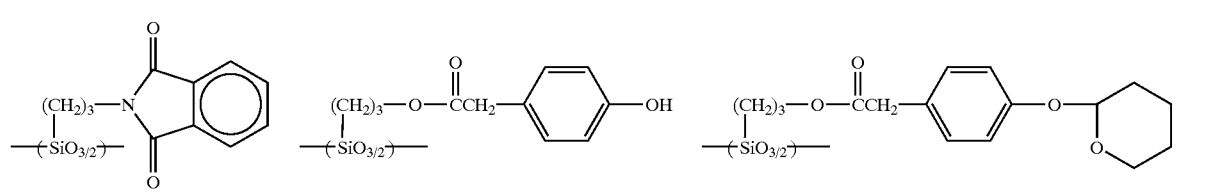
C2-24
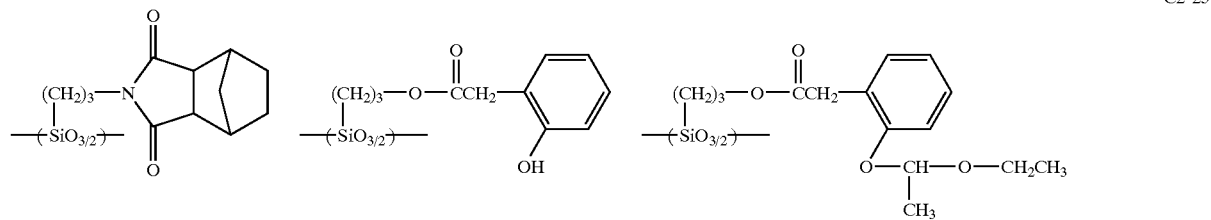
C2-25
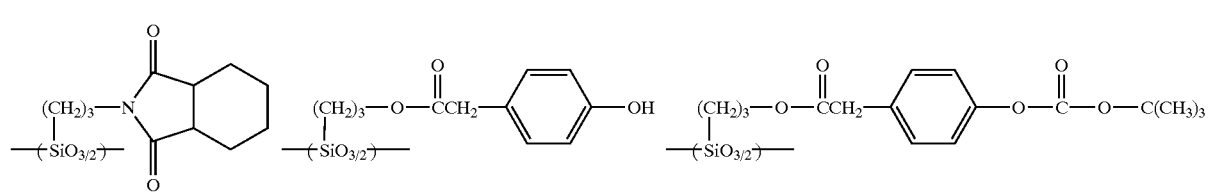
C2-26
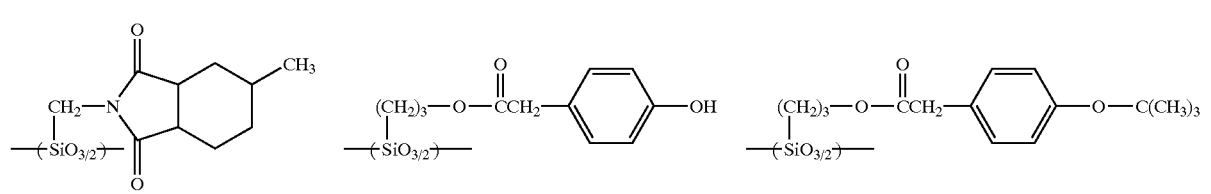
C2-27
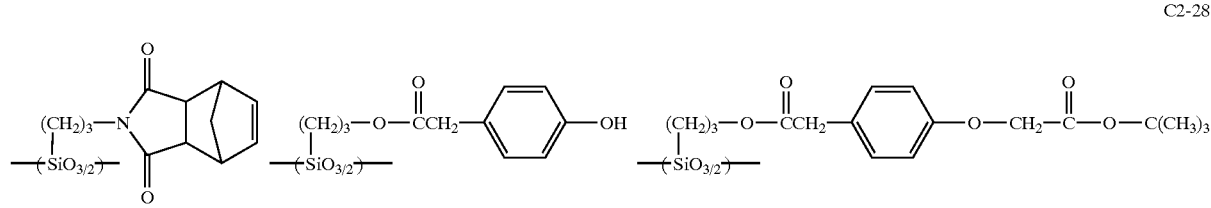
C2-28

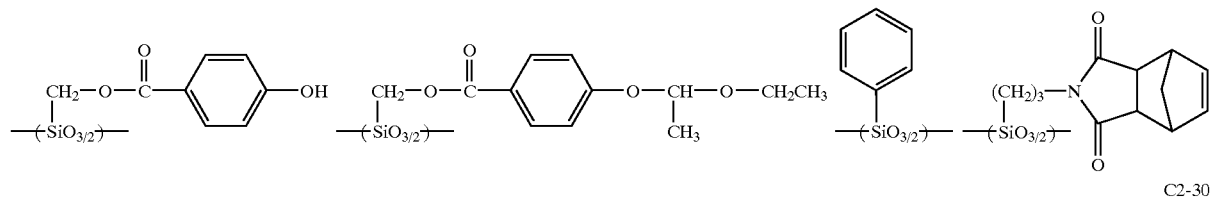
C2-29
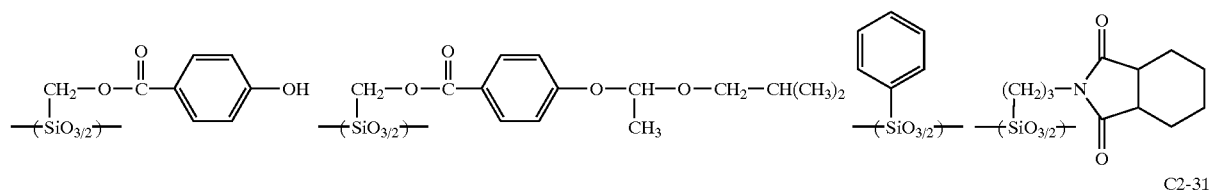
C2-30
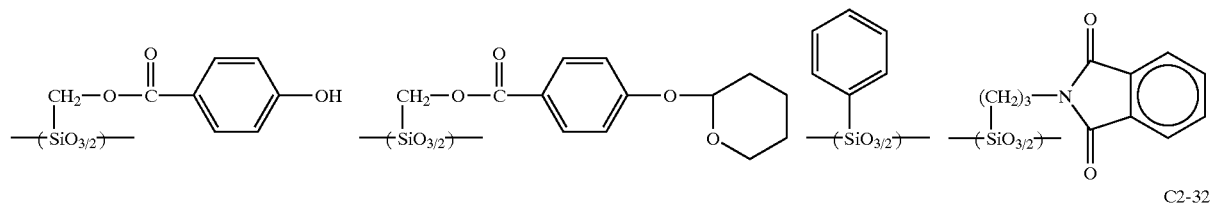
C2-31
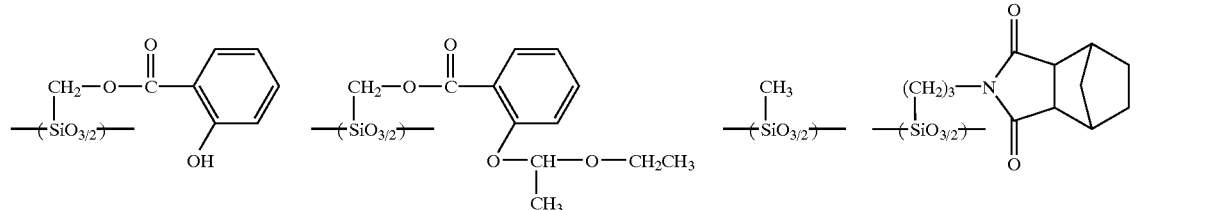
C2-32
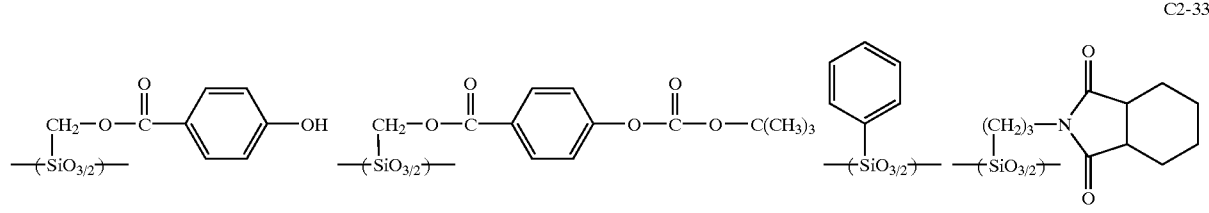
C2-33
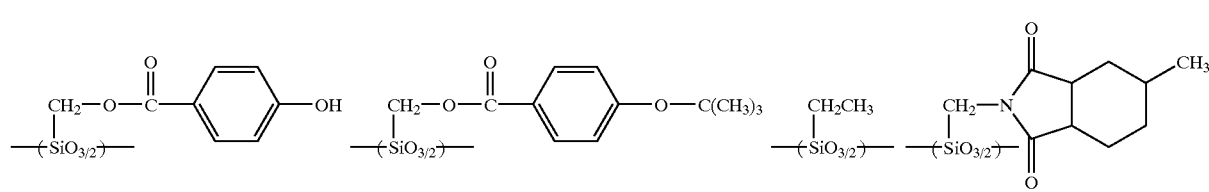
C2-34
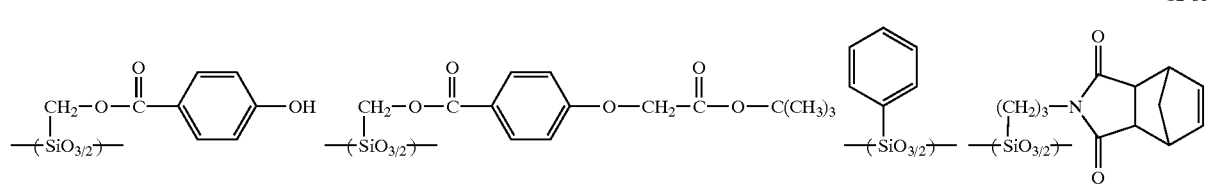
C2-35
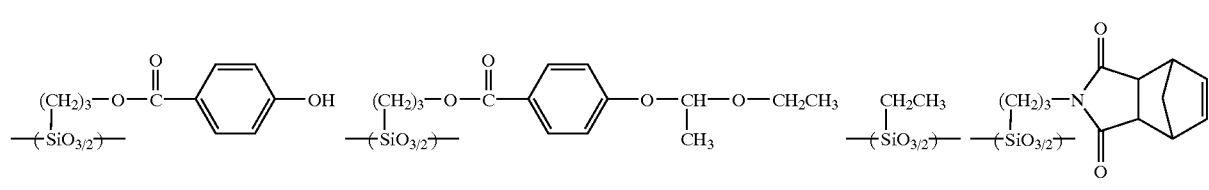
C2-36

-continued
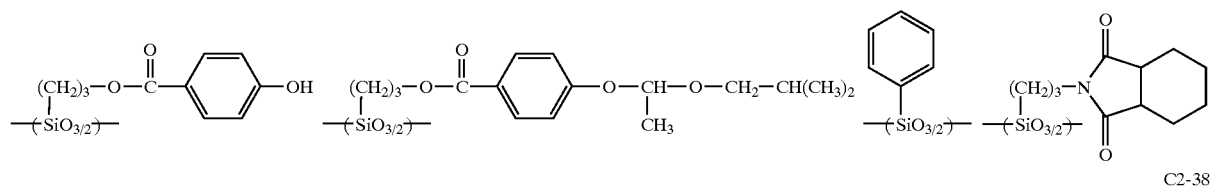
C2-37
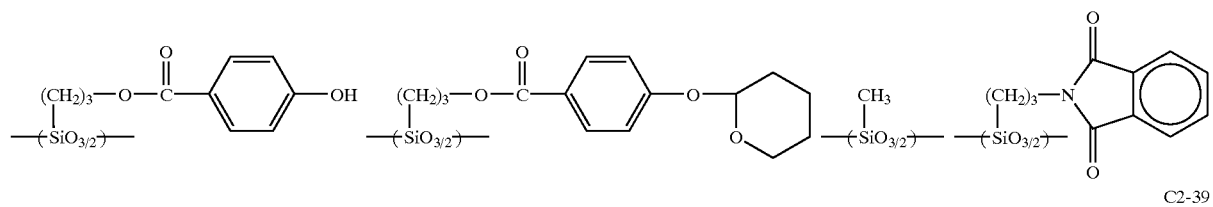
C2-38
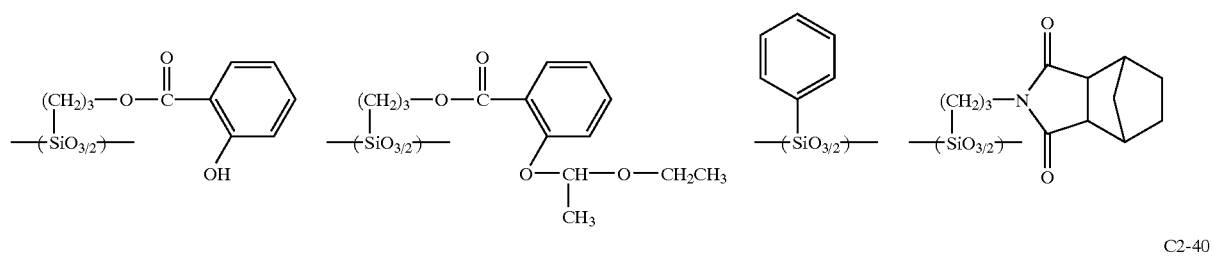
C2-39
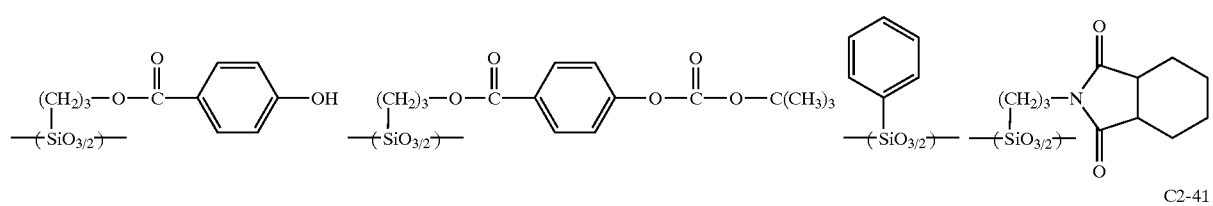
C2-40
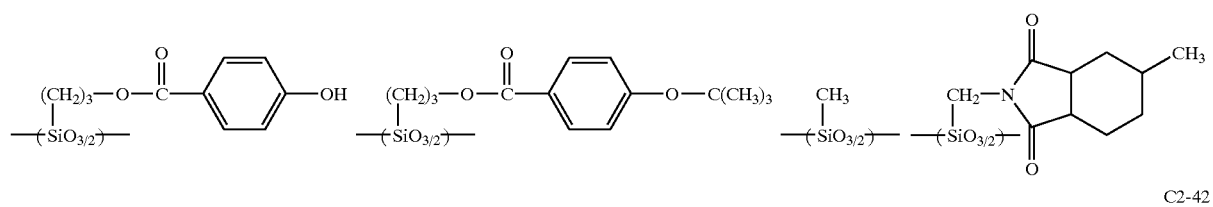
C2-41
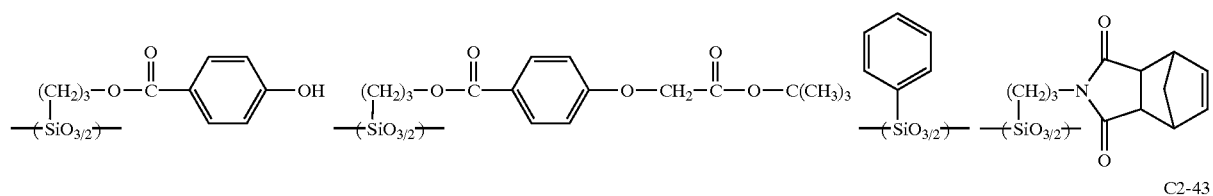
C2-42
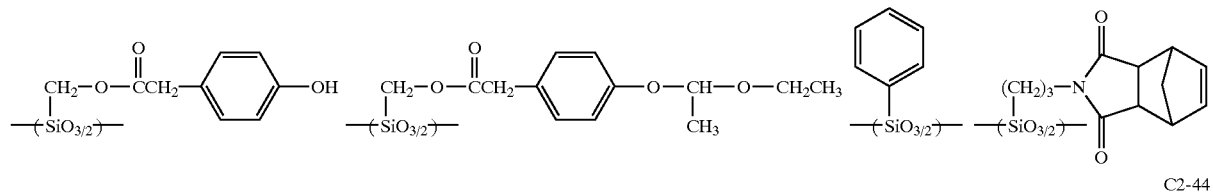
C2-43
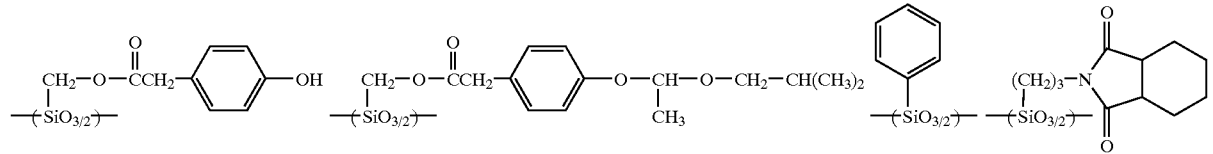
C2-44

-continued
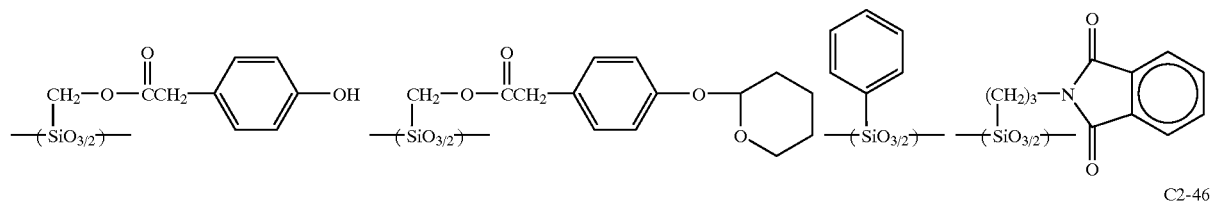
C2-45
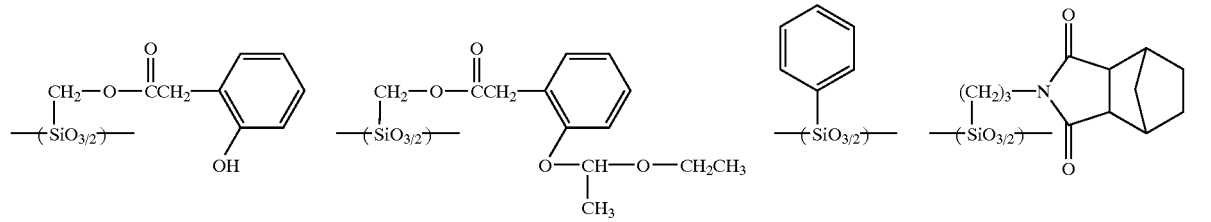
C2-46
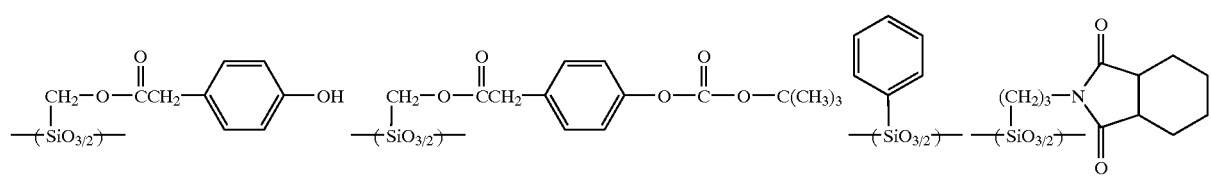
C2-47
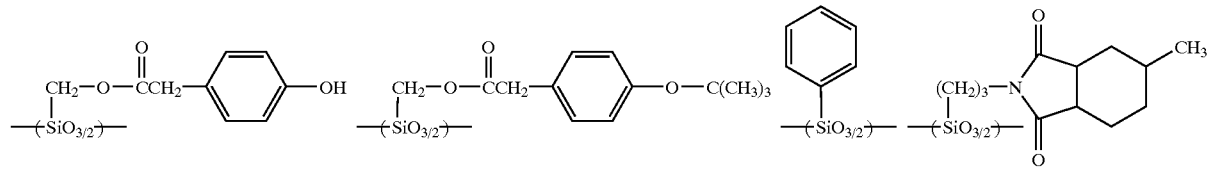
C2-48
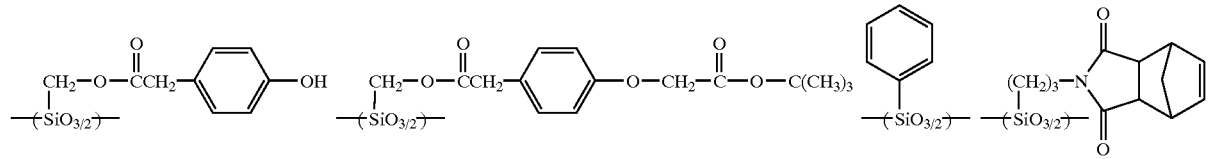
C2-49
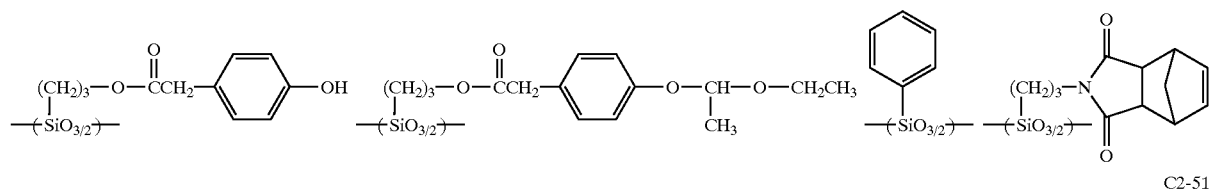
C2-50
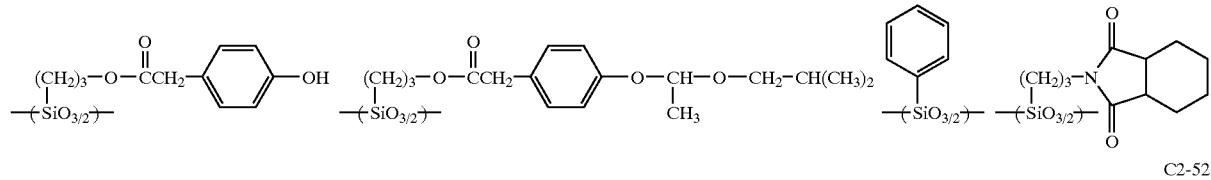
C2-51
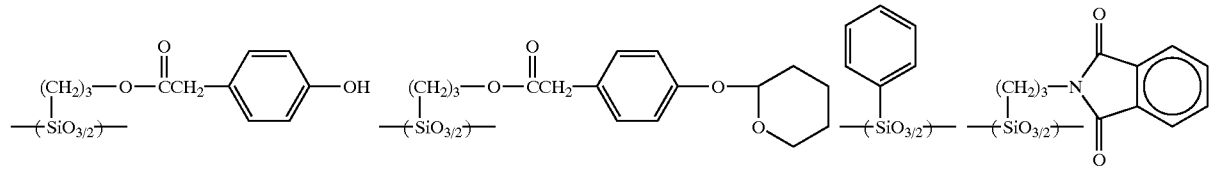
C2-52

-continued
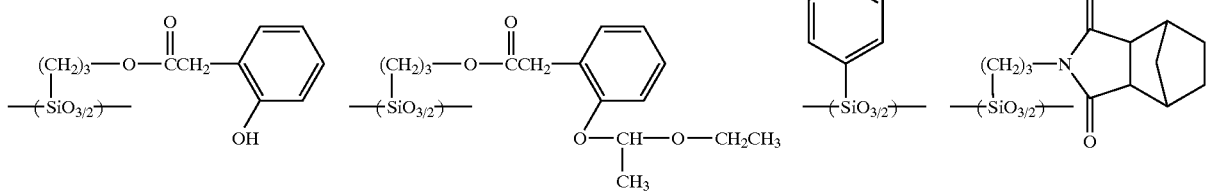
C2-53
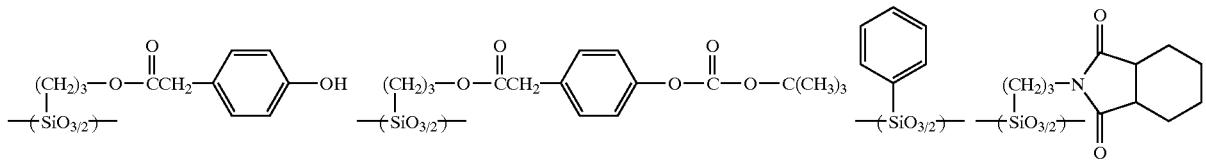
C2-54
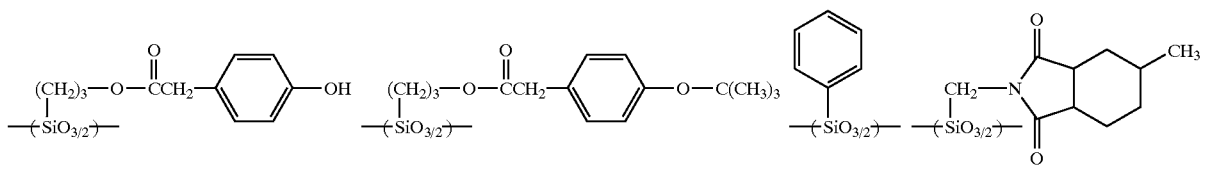
C2-55
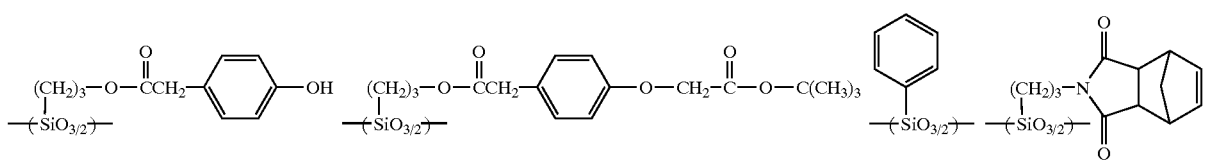
C2-56
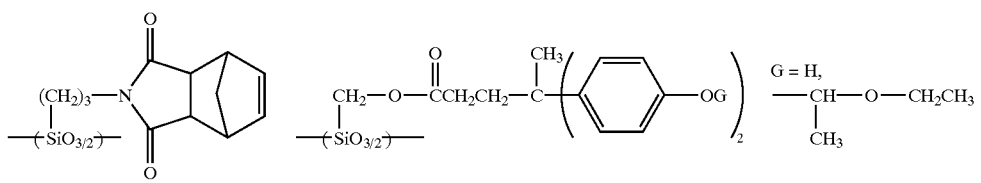
C2-57
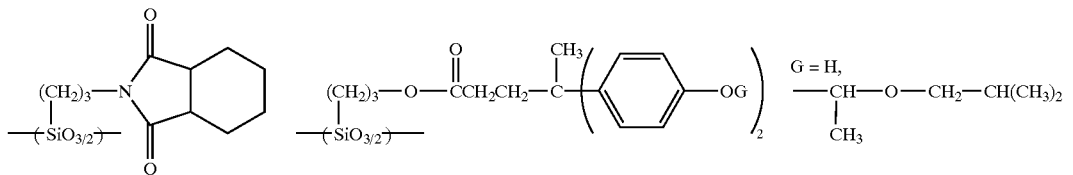
C2-58
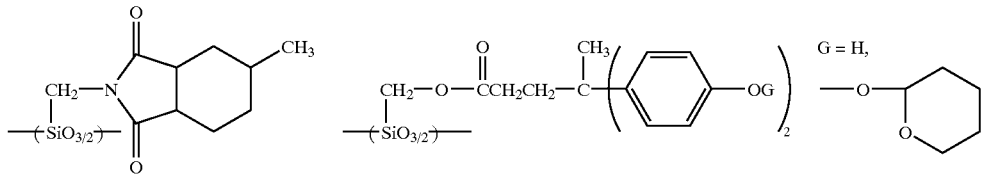
C2-59
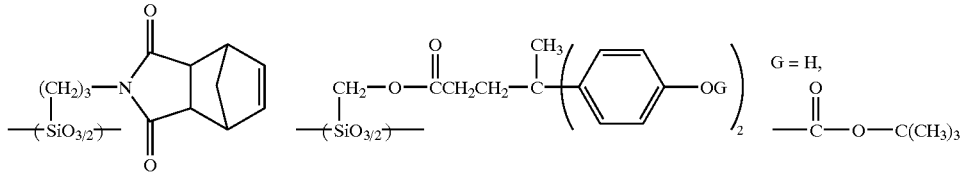
C2-60

-continued
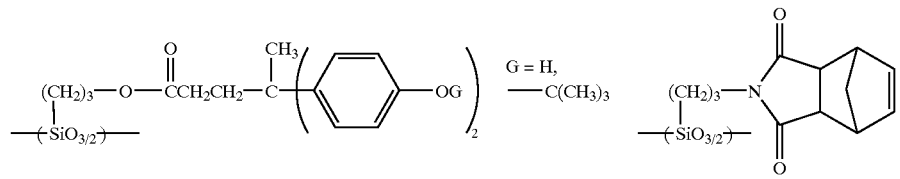
C2-61
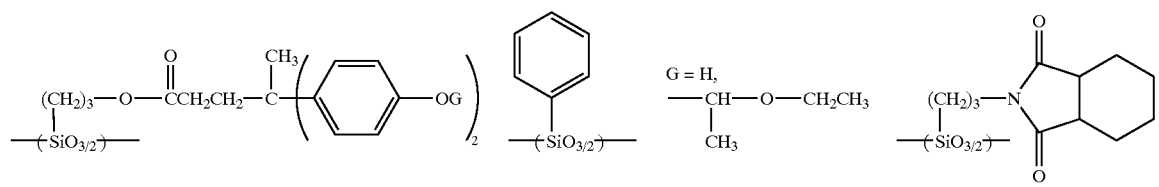
C2-62
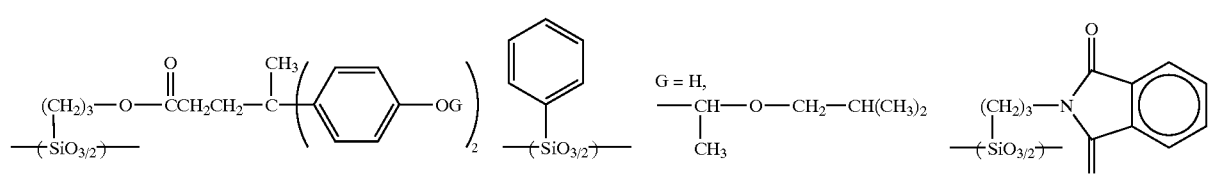
C2-63
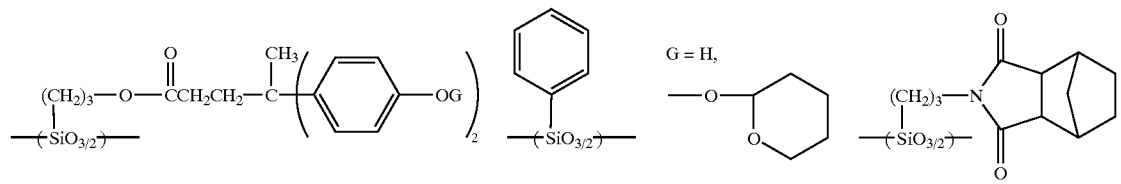
C2-64
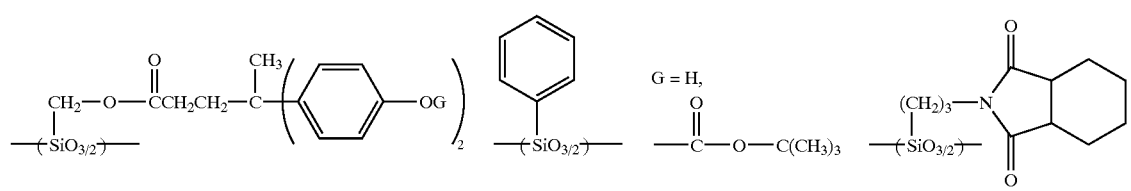
C2-65
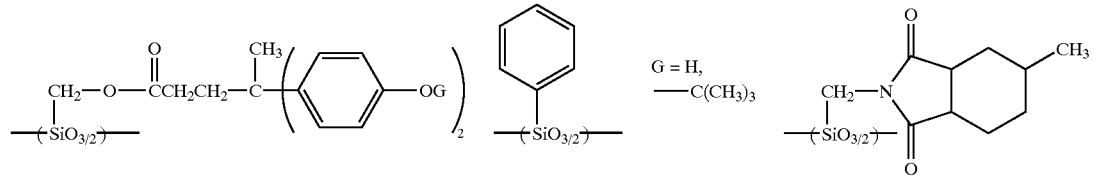
C2-66
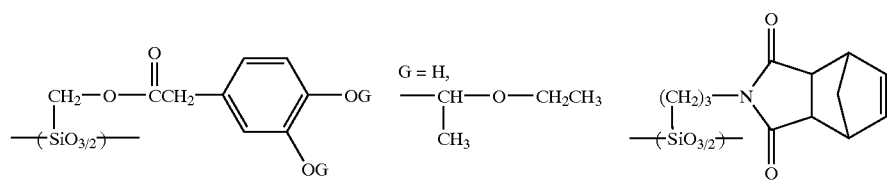
C2-67
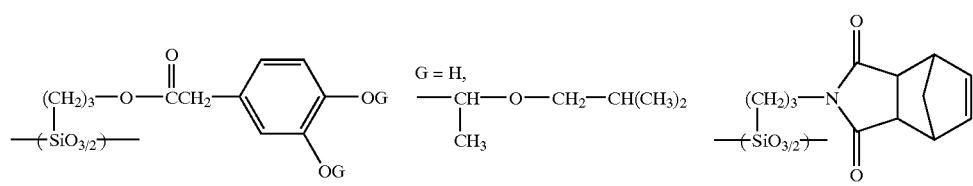
C2-68

-continued
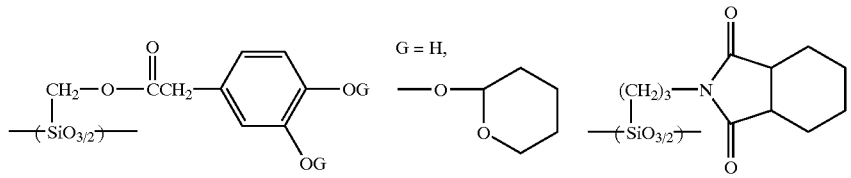
C2-69
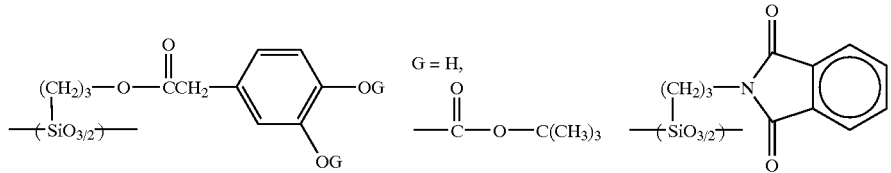
C2-70
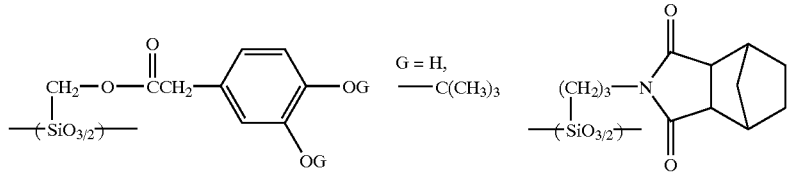
C2-71
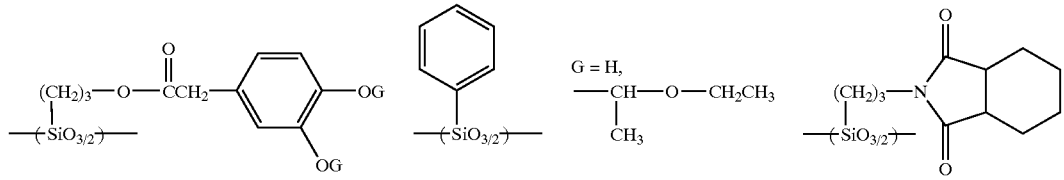
C2-72
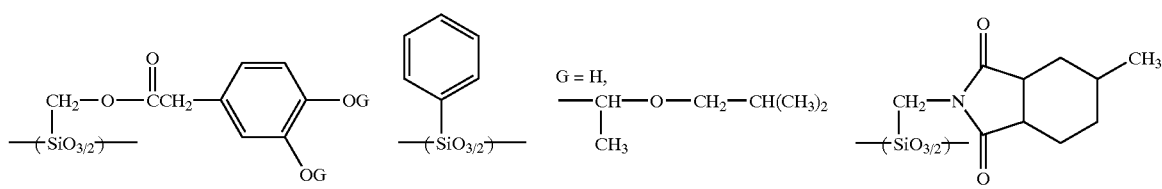
C2-73
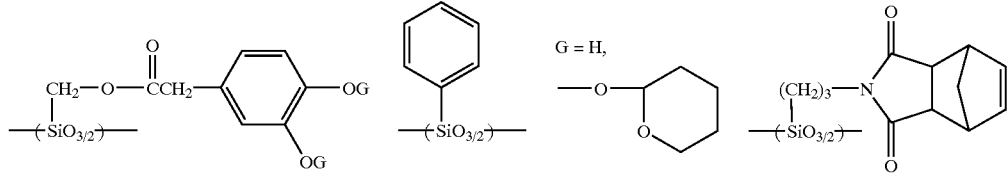
C2-74
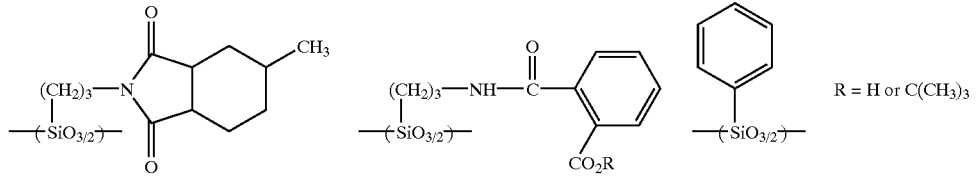
C2-75
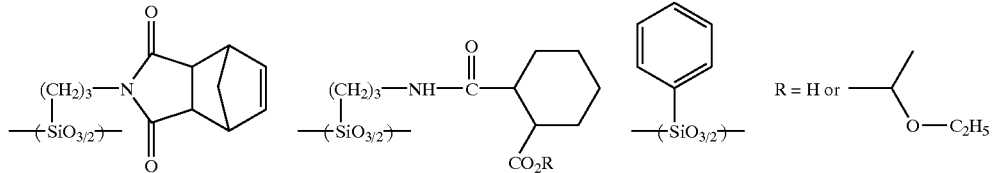
C2-76

-continued
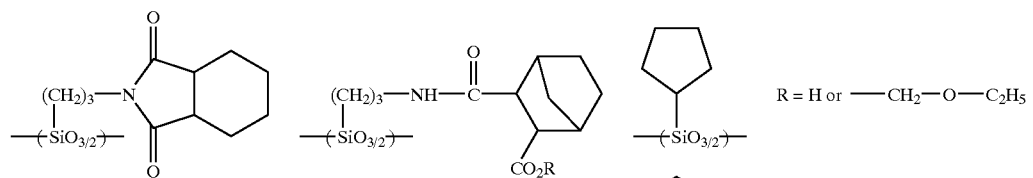
C2-77
R = H or —CH₂—O—C₂H₅
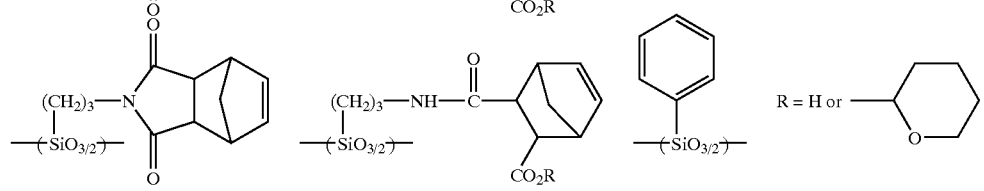
C2-78
R = H or 2-tetrahydropyranyl
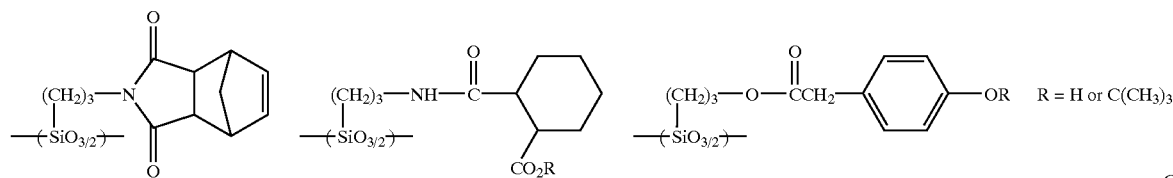
C2-79
R = H or C(CH₃)₃
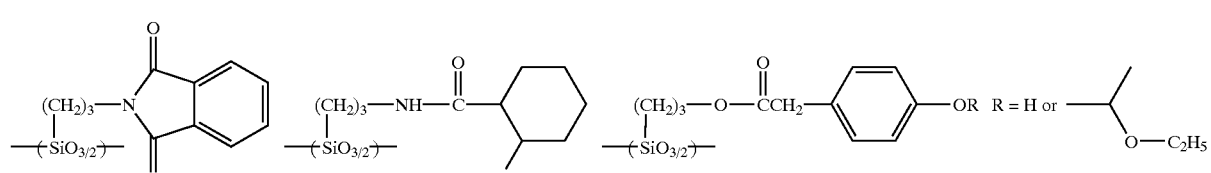
C2-80
R = H or -CH(CH₃)-O-C₂H₅
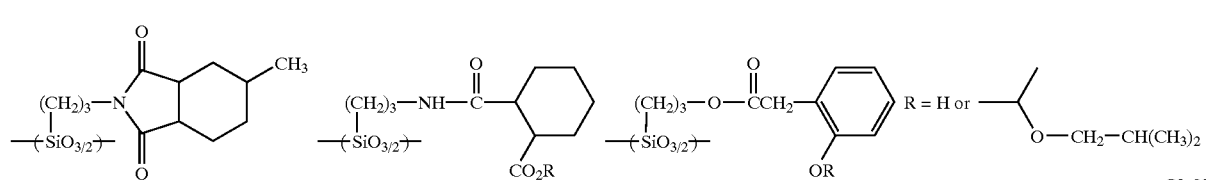
C2-81
R = H or -CH(CH₃)-O-CH₂-CH(CH₃)₂
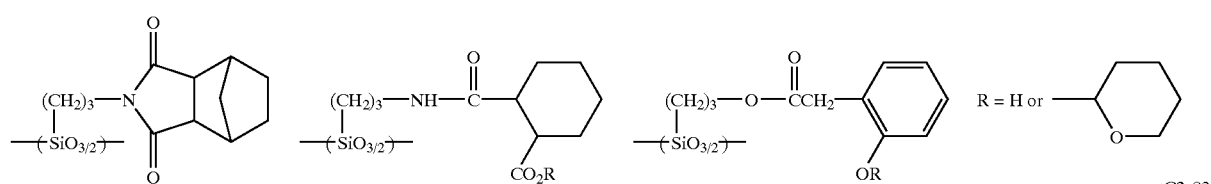
C2-82
R = H or 2-tetrahydropyranyl
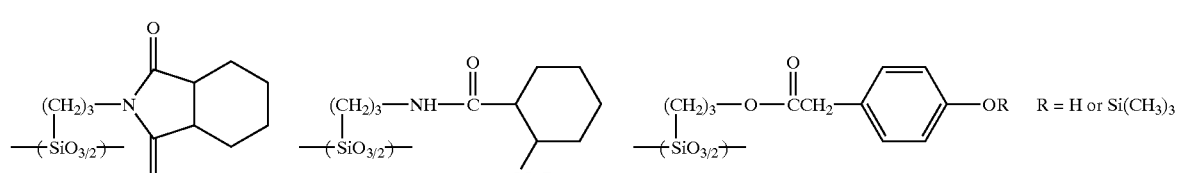
C2-83
R = H or Si(CH₃)₃
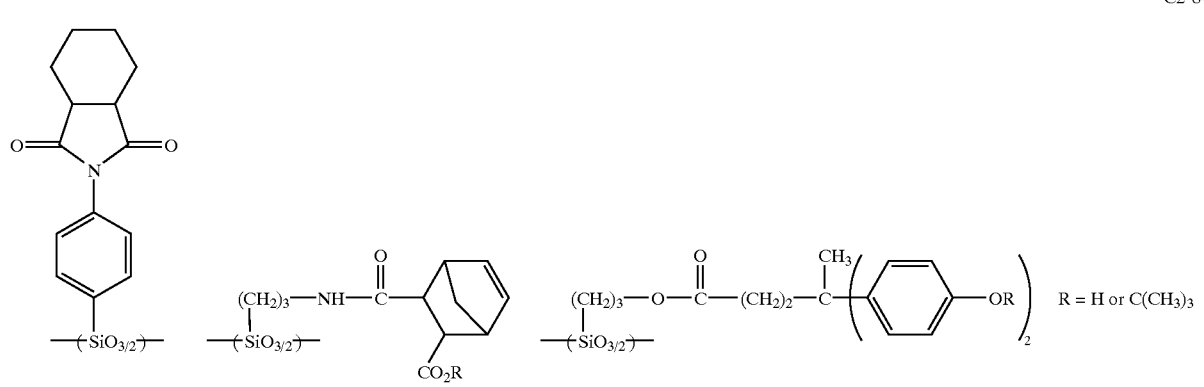
C2-84
R = H or C(CH₃)₃

-continued
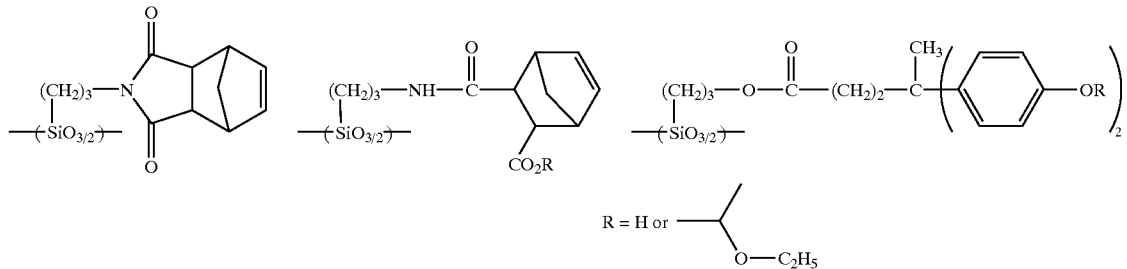
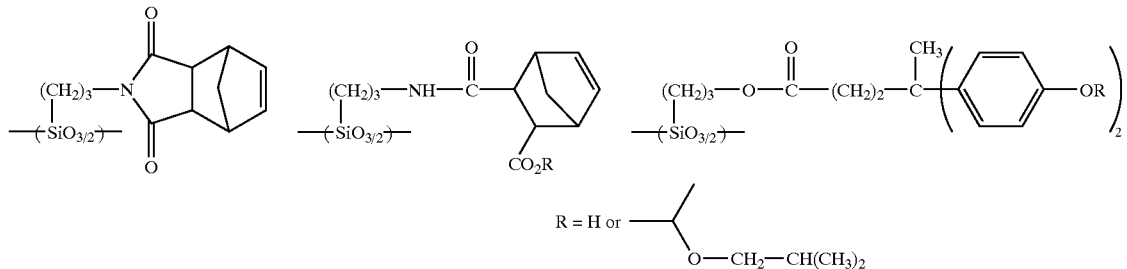
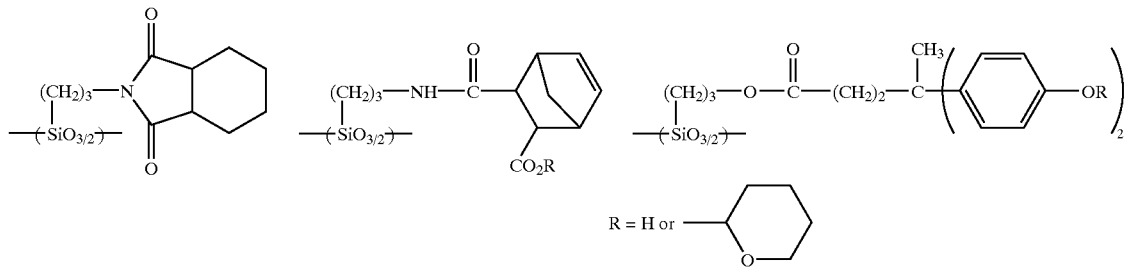
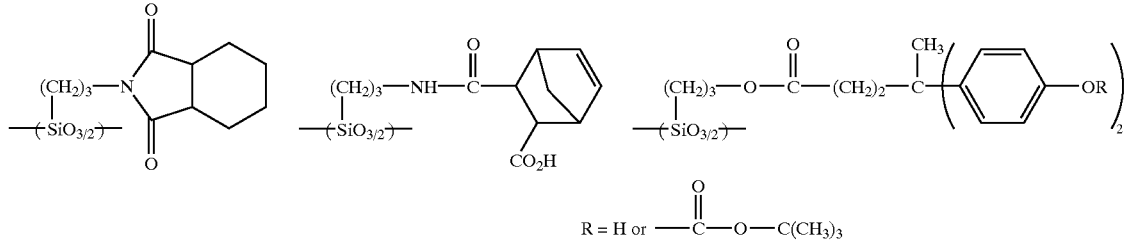
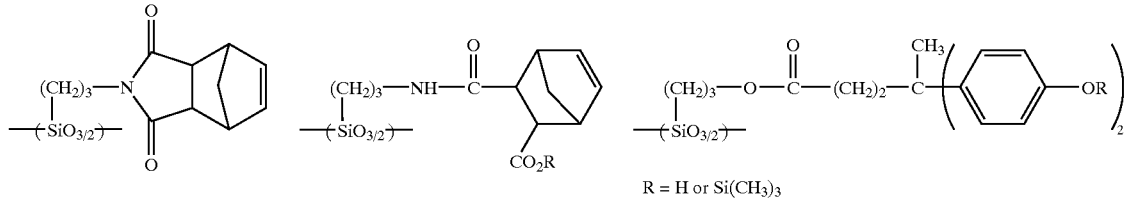
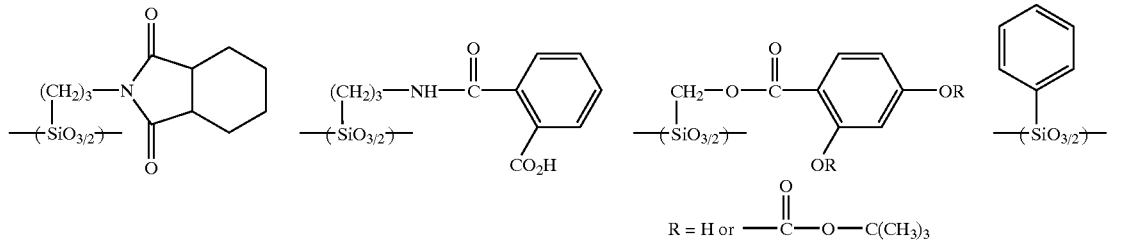

-continued

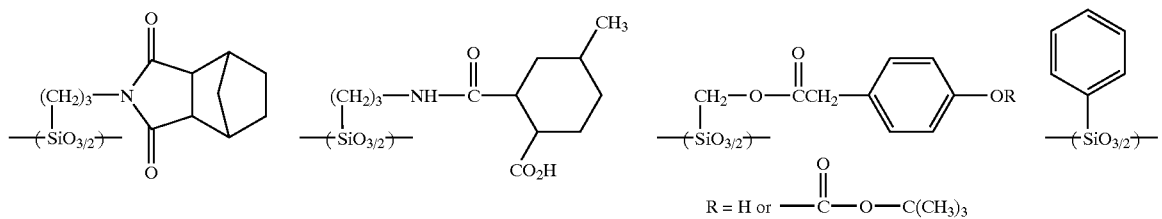

C2-91

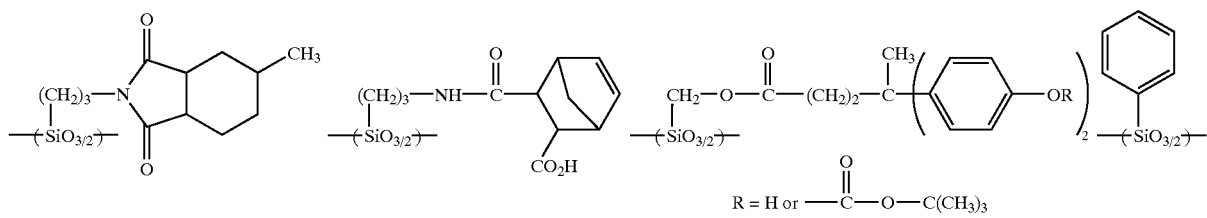

C2-92

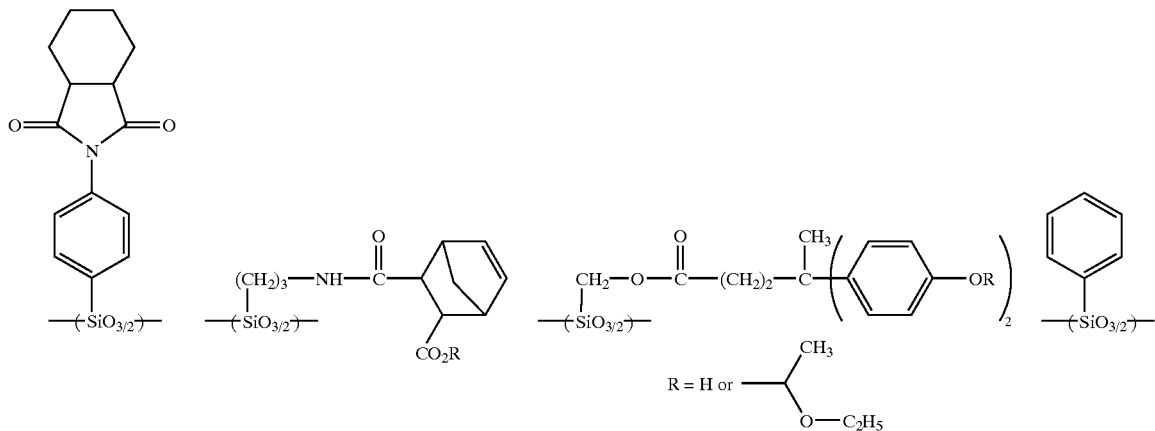

C2-93

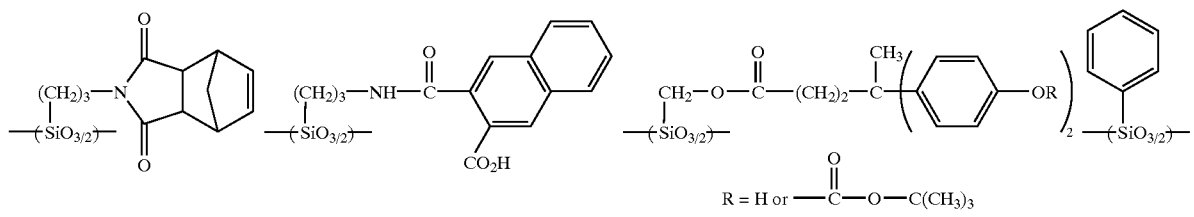

C2-94

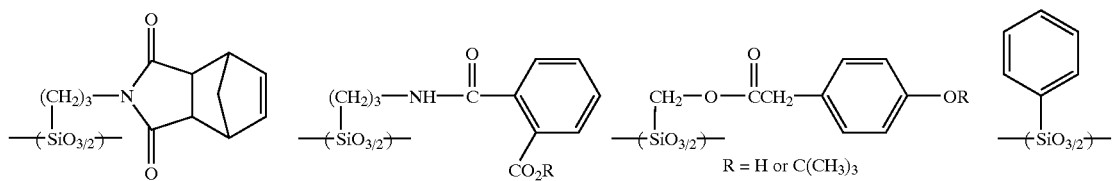

C2-95

In formulae (I'), (I''), (II') and (II'''), L1 represents a divalent linking group selected from the group consisting of —A—OCO—, —A—COO—, —A—NHCO—, —A—NHCOO—, —A—NHCONH—, —A—CONH—, —A—OCONH— and —A—S— (wherein A represents a single bond or an arylene group). Among these, —NHCO— and —NHCONH— are preferred, and —NHCO— is more preferred.

The arylene group is preferably an arylene group having from 6 to 11 carbon atoms including the substituent. Specific examples thereof include an ortho-, meta- or para-phenylene group which may have a substituent, and a naphthylene group which may have a substituent. Among these, preferred are para-phenylene group and naphthylene group.

In formulae (I'), (II''), (II') and (II'''), X represents a single bond or a divalent linking group. Specific examples of the divalent linking group include a linking group comprising at least one selected from a linear alkylene group having from 1 to 6 carbon atoms, a branched alkylene group having from 1 to 6 carbon atoms, an alicyclic group having from 6 to 10 carbon atoms, an aromacyclic group having from 6 to 10 carbon atoms and an aralkylene group having from 7 to 11 carbon atoms, and a linking group comprising a combination of two or more thereof. X may contain one or more group selected from —O—, —CO—, —S—, —SO$_2$— and —CH=CH—, between X and Z or Z".

Preferred examples of the alkylene group include methylene, ethylene, propylene and butylene. Preferred examples of the alicyclic group include a cyclohexylene group and a norbornene group. Preferred examples of the aromacyclic group include a phenylene group and a naphthylene group. Preferred examples of the aralkylene group include a phenylenemethylene group.

In formula (II") and (II'"), Y represents hydrogen atom, an alkyl group, an aryl group or an aralkyl group. The alkyl group may be a linear, branched or cyclic alkyl group. The alkyl group preferably has from 1 to 10 carbon atoms, the aryl group preferably has from 6 to 10 carbon atoms, and the aralkyl group preferably has from 7 to 11 carbon atoms.

Specific examples of Y include hydrogen atom, a methyl group, an ethyl group, a n-propyl group, i-propyl group, a n-butyl group, i-butyl group, a tert-butyl group, a n-pentyl group, i-pentyl group, a n-hexyl group, a cyclohexyl group, a phenyl group, a naphthyl group, a benzyl group, a phenethyl group and a naphthylmethyl group. Among these, hydrogen atom and a methyl group are preferred.

In formulae (I'), (I"), (II") and (II'"), n represents an integer of 1 to 6, preferably from 1 to 3.

In formulae (II") and (II'"), 1 represents an integer of 1 to 3, preferably 1 or 2, and m represents an integer of 1 to 3, preferably 1 or 2.

Examples of the acid-decomposable group in the acid-decomposable polysiloxane represented by formula (III) include a group represented by —CR$^1$R$^2$(OR$^3$), a methoxymethyl group, an ethoxymethyl group, a tert-butyl group, a tert-amyl group, a 1-methylcyclohexyl group, a trimethylsilyl group and a tert-butyldimethylsilyl group. R$^1$ and R$^2$, which may be the same or different, each represents hydrogen atom or a linear or branched alkyl group having from 1 to 6 carbon atoms, and R$^3$ represents a linear, branched or cyclic alkyl group having from 1 to 10 carbon atoms. R$^2$ and R$^3$ may combine to form a ring structure, preferably a 6-membered ring structure.

Specific preferred examples of the acid-decomposable group include a tert-butyl group, a trimethylsilyl group, a tert-butyldimethylsilyl group, an ethoxymethyl group and a group represented by the following formulae:

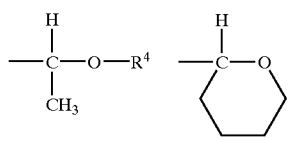

wherein R$^4$ represents a methyl, ethyl, n-propyl, i-propyl, n-butyl, i-butyl or tert-butyl group.

Examples of the acid-decomposable group in the acid-decomposable polysiloxane represented by formula (II'") include a group represented by —CR$^5$R$^6$(OR$^7$), a tert-butoxycarbonyl group, a tert-butoxycarbonylmethyl group, a tert-butyl group, a tert-amyl group, a 1-methylcyclohexyl group, a trimethylsilyl group and a tert-butyldimethylsilyl group. R$^5$ and R$^6$, which may be the same or different, each represents hydrogen atom or a linear or branched alkyl group having from 1 to 6 carbon atoms, and R$^7$ represents a linear, branched or cyclic alkyl group having from 1 to 10 carbon atoms. R$^6$ and R$^7$ may combine to form a ring structure, preferably a 6-membered ring structure.

Specific preferred examples of the acid-decomposable group include a tert-butoxycarbonyl group, a tert-butyl group, a trimethylsilyl group, a tert-butyldimethylsilyl group and a group represented by the following formulae:

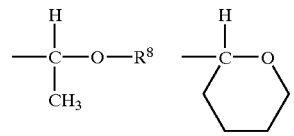

wherein R$^8$ represents a methyl, ethyl, n-propyl, i-propyl, n-butyl, i-butyl or tert-butyl group.

The alkali-soluble polysiloxane 3 of the present invention preferably contains the structural unit represented by formula (I') in a proportion of 10 to 100 mol %, more preferably from 30 to 100 mol %.

In the case of a polysiloxane containing both the structural unit represented by formula (I') and the structural unit represented by formula (II'), the structural units of formulae (I') and (II') are preferably contained in total in a proportion of 20 to 100 mol %, more preferably from 50 to 100 mol %.

In the case of an acid-decomposable polysiloxane containing both the structural unit represented by formula (I') and the structural unit represented by formula (II"), the structural unit represented by formula (I') is preferably contained in a proportion of 0 to 90 mol % and the structural unit represented by formula (II") where at least a part of phenolic hydroxyl groups are protected by an acid-decomposable group is preferably contained in a proportion of 10 to 90 mol %.

The acid-decomposable polysiloxane 4 of the present invention preferably contains the structural unit represented by formula (I") where at least a part of carboxyl groups are protected by an acid-decomposable group in a proportion of 10 to 100 mol %, more preferably from 30 to 70 mol %. In the case of an acid-decomposable polysiloxane containing both structural units of formulae (I") and (II'"), the structural unit represented by formula (I") is preferably contained in a proportion of 10 to 90 mol % and the structural unit represented by formula (II'") where at least a part of phenolic hydroxyl groups are protected by an acid-decomposable group is preferably contained in a proportion of 10 to 90 mol %.

In order to control the solvent solubility or alkali solubility, the polysiloxanes 3 and 4 of the present invention each may be co-condensed with the structural unit of formula (VI) and/or (VII).

The alkali-soluble polysiloxane having a structural unit represented by formula (I') can be obtained, when L1 is —NHCO—, by reacting a monosubstituted trialkoxysilane having an amino group at the terminal with a cyclic acid anhydride, adding, if desired, a monosubstituted trialkoxysilane or disubstituted dialkoxysilane for giving a structural unit represented by formula (VI) and/or (VII), and then condensation-polymerizing these in the presence of water and an acid catalyst or water and a base catalyst.

Examples of the acid anhydride which can be used include a succinic acid anhydride, a methylsuccinic acid anhydride, a dimethylsuccinic acid anhydride, a cyclohexanedicrboxylic acid anhydride, a methylcyclohexyldicarbonic acid anhydride, an itaconic acid anhydride, a tetrahydrophthalic acid anhydride, a norbornenedicarboxylic acid anhydride, cantharidin, a methylnorbornenedicarboxylic acid anhydride, a maleic acid anhydride, a citraconic acid anhydride, a bromomaleic acid anhydride, a dichloromaleic acid anhydride, an aconitic acid anhydride, a glutaric acid anhydride, a methylglutaric acid anhydride, a dimethylglutaric acid anhydride, an ethyl methyl glutaric acid anhydride, a tetramethyleneglutaric acid anhydride, a phthalic acid anhydride, a methylphthalic acid anhydride, a dichlorophthalic acid anhydride, a tetrachlorophthalic acid anhydride, a hydroxyphthalic acid anhydride, a nitrophthalic acid anhydride and a naphthalenedicarboxylic acid anhydride.

Specific examples of the constituent unit of the polysiloxane 3, namely, alkali-soluble polysiloxane, of the present invention are set forth below, however, the present invention is by no means limited thereto.

C3-1
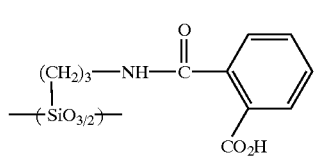

C3-2
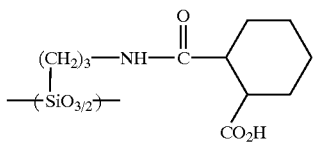

C3-3
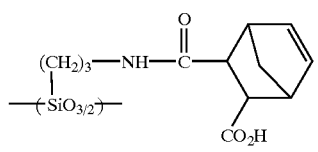

C3-4
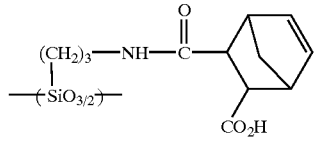

C3-5
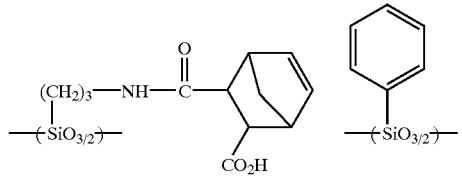

C3-6
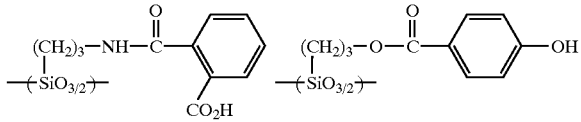

C3-7
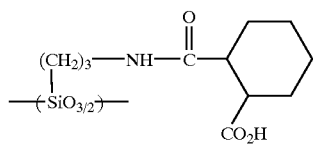
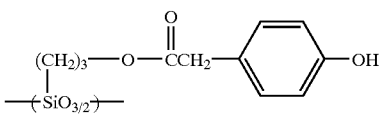

C3-8
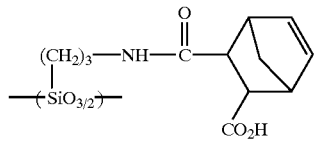

C3-9
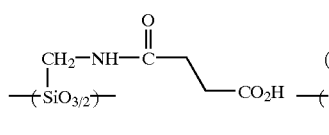
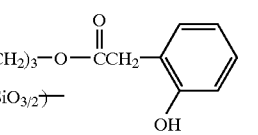

C3-10

C3-11
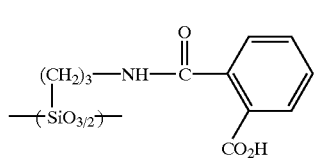

C3-12
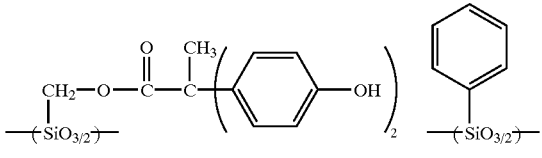

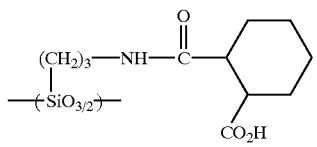 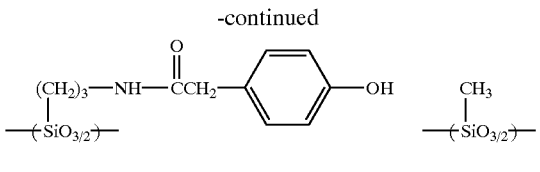

C3-13

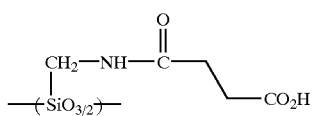 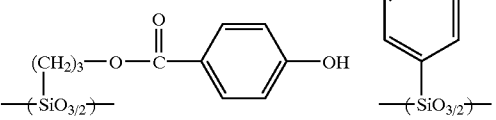 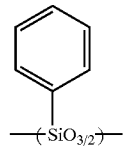

C3-14

The acid-decomposable polysiloxane 4 having a structural unit represented by formula (I″) can be obtained, when L1 is —NHCO—, by reacting a monosubstituted trialkoxysilane having an amino group at the terminal with an acid anhydride, adding, if desired, a monosubstituted trialkoxysilane or disubstituted dialkoxysilane for giving a structural unit represented by formula (VI) and/or (VII), condensation-polymerizing these in the presence of water and an acid catalyst or water and a base catalyst to obtain an alkali-soluble polysiloxane, and protecting it by an acid-decomposable group.

Examples of the acid anhydride which can be used include a succinic acid anhydride, a methylsuccinic acid anhydride, a dimethylsuccinic acid anhydride, a cyclohexanedicrboxylic acid anhydride, a methylcyclohexyldicarbonic acid anhydride, an itaconic acid anhydride, a tetrahydrophthalic acid anhydride, a norbornenedicarboxylic acid anhydride, cantharidin, a methylnorbornenedicarboxylic acid anhydride, a maleic acid anhydride, a citraconic acid anhydride, a bromomaleic acid anhydride, a dichloromaleic acid anhydride, an aconitic acid anhydride, a glutaric acid anhydride, a methylglutaric acid anhydride, a dimethylglutaric acid anhydride, an ethyl methyl glutaric acid anhydride, a tetramethyleneglutaric acid anhydride, a phthalic acid anhydride, a methylphthalic acid anhydride, a dichlorophthalic acid anhydride, a tetrachlorophthalic acid anhydride, a hydroxyphthalic acid anhydride, a nitrophthalic acid anhydride and a naphthalenedicarboxylic acid anhydride.

The acid-decomposable polysiloxane having structural units represented by formulae (I″) and (II‴) can be obtained, for example, when L1 is —OCO—, by reacting (chloroalkyl)trialkoxysilane with a carboxylic acid compound having a phenol structure at the terminal in the presence of a base catalyst (at this time, a salt such as potassium iodide may be added to accelerate the reaction), adding trialkoxysilane for giving a structural unit of formula (I″) and, if desired, a monosubstituted trialkoxysilane or disubstituted dialkoxysilane for giving a structural unit represented by formula (VI) and/or (VII), condensation-polymerizing these in the presence of water and an acid catalyst or water and a base catalyst, and then introducing an acid-decomposable group.

When L1 is —COO—, —NHCO—, —NHCOO—, —NHCONH—, —CONH—, —OCONH— or —S—, the acid-decomposable polysiloxane may be obtained using trialkoxysilane having a carboxyl group, an amino group or a mercapto group at the terminal.

For the introduction of the acid-decomposable group, a known reaction such as an acid catalyst reaction with a vinyl ether compound corresponding to the acid-decomposable group, or a base catalyst reaction with di-tert-butyl dicarbonate, trimethylsilyl chloride or tert-butyldimethylsilyl chloride may be used.

Specific examples of the constituent unit of polysiloxane 4, namely, acid-decomposable polysiloxane, of the present invention are set forth below, however, the present invention is by no means limited thereto.

C4-1

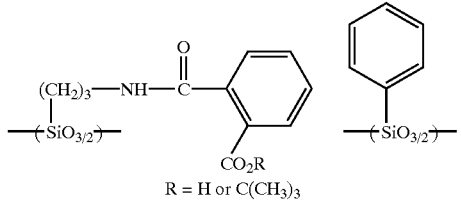

R = H or C(CH$_3$)$_3$

C4-2

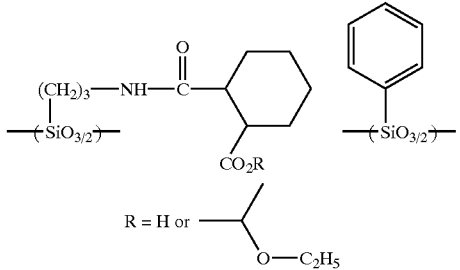

R = H or —CH(CH$_3$)—O—C$_2$H$_5$

C4-3

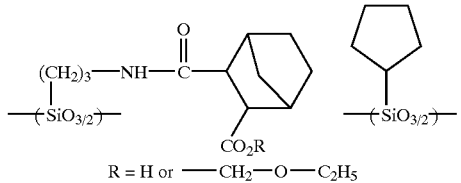

R = H or —CH$_2$—O—C$_2$H$_5$

C4-4

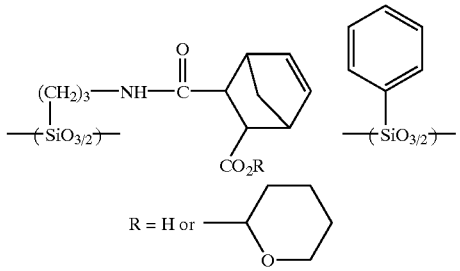

R = H or tetrahydropyranyl

-continued
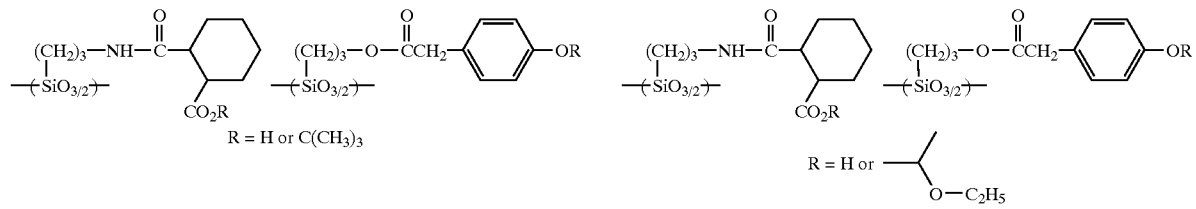
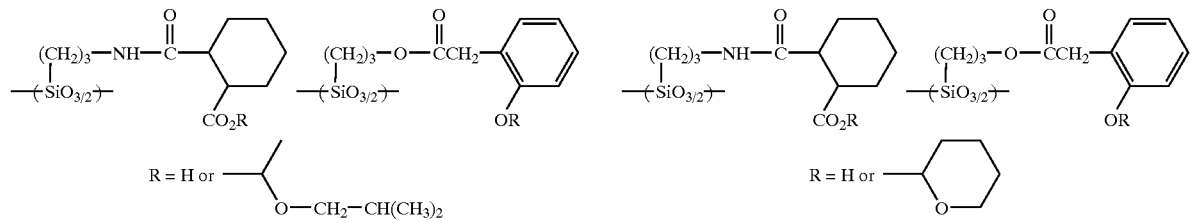
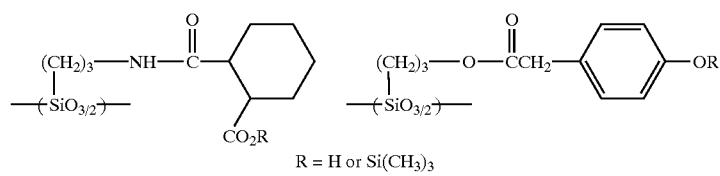
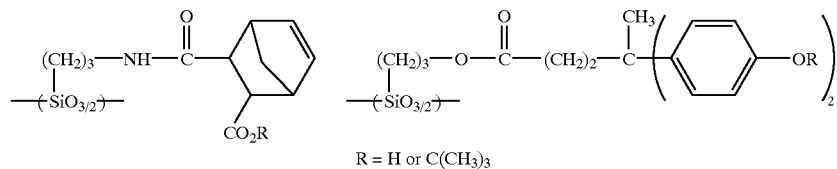
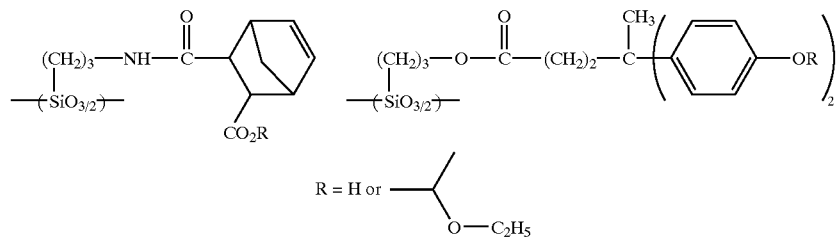
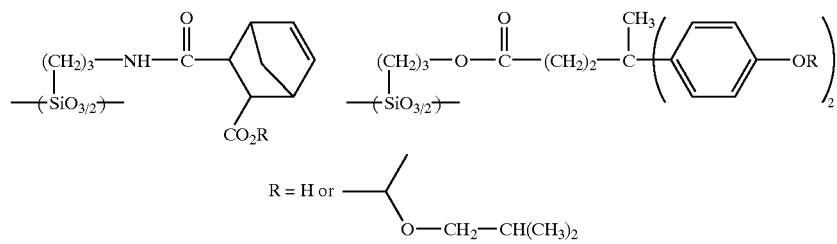
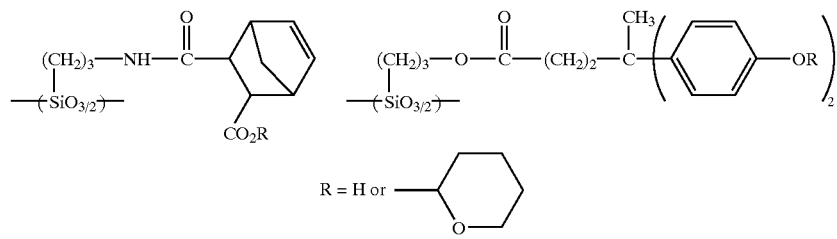

-continued
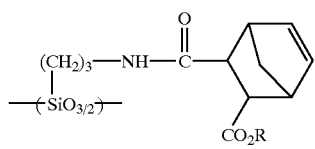 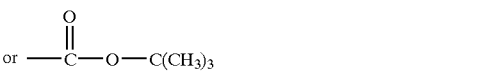
C4-14
R = H or —C(=O)—O—C(CH₃)₃
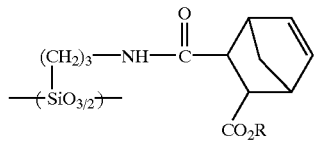 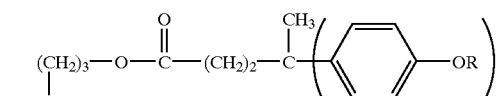
C4-15
R = H or Si(CH₃)₃
C4-16
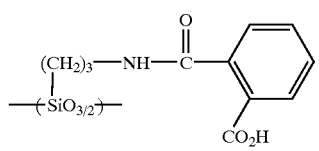 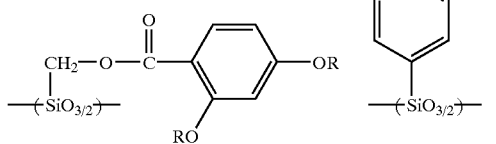 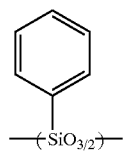
R = H or —C(=O)—O—C(CH₃)₃
C4-17
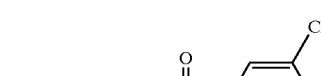 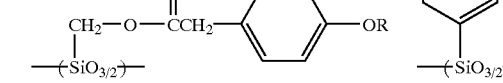 
R = H or —C(=O)—O—C(CH₃)₃
C4-18
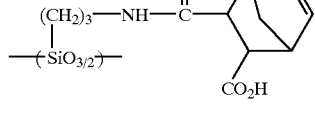 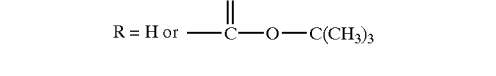 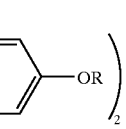
R = H or —C(=O)—O—C(CH₃)₃
C4-19
 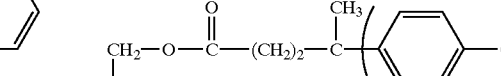 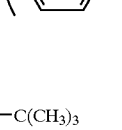
R = H or —CH(CH₃)—O—C₂H₅
C4-20
R = H or —C(=O)—O—C(CH₃)₃

-continued

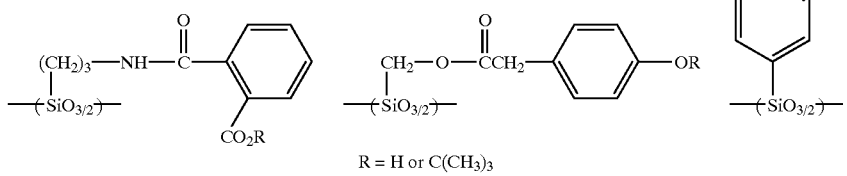

R = H or C(CH₃)₃

The weight-average molecular weight of the polysiloxane of the present invention is preferably, in terms of polystyrene measured by the gel permeation chromatography method, from 500 to 100,000, more preferably from 700 to 50,000, still more preferably from 800 to 20,000.

The positive photoresist composition of the present invention is described below.

The positive photoresist composition of the present invention comprises:
(a) the polysiloxane 1, 2, 3 or 4, and
(b) a compound which decomposes upon exposure and generates an acid (photo-acid generator).

The positive photoresist composition of the present invention may further contain:
(c) (c1) a phenolic compound in which at least a part of phenolic hydroxyl groups contained within the molecule are protected by an acid-decomposable group or
(c2) an aromatic or aliphatic carboxylic acid group in which at least a part of carboxyl groups contained within the molecule are protected by an acid-decomposable group.

The alkali-soluble polysiloxane 1 of the present invention is preferably a polysiloxane having a structural unit represented by formula (II) in view of the solvent solubility, sensitivity, resolution and rectangularity of the pattern.

The acid-decomposable polysiloxane 2 is preferably a polysiloxane having a structural unit represented by formula (III') in view of the solvent solubility, sensitivity, resolution and rectangularity of the pattern. This polysiloxane may contain an alkali-soluble polysiloxane in. which the acid-decomposable groups in the acid-decomposable polymer of the present invention all are released, in the range of 50 wt % or less based on the composition.

The alkali-soluble polysiloxane 3 of the present invention preferably has a polysiloxane structure such that the structural units represented by formula (VI) and/or (VII) is copolymerized, in view of the solvent solubility, sensitivity, resolution and rectangularity of the pattern.

The polysiloxane 4 of the present invention is preferably a polysiloxane having a structural unit represented by formula (VI) and/or (VII) in view of the solvent solubility, sensitivity, resolution and rectangularity of the pattern. This polysiloxane may contain an alkali-soluble polysiloxane in which the acid-decomposable groups in the acid-decomposable polysiloxane 4 of the present invention all are released, in the range from 5 to 50 wt % based on the composition.

The photo-acid generator (b) for use in the present invention is a compound which generates an acid upon irradiation with actinic ray or radiation.

Examples of the compound capable of generating an acid upon irradiation with actinic ray or radiation for use in the present invention include a photocationic polymerization initiator, a photoradical polymerization initiator, a photo-decoloring agent for dyes, a photo-discoloring agent and a compound capable of generating an acid upon irradiation with a known ray used for microresist or the like (for example, ultraviolet or far ultraviolet ray of 200 to 400 nm, preferably g-line, h-line, i-line and KrF excimer laser ray), an ArF excimer laser ray, an electron beam, an X ray, a molecular beam or an ion beam. The compound may be appropriately selected from these and a combination thereof.

Other examples of the compound capable of generating an acid upon irradiation with actinic ray or radiation for use in the present invention include onium salts such as diazonium salts described in S. I. Schlesinger, Photogr. Sci. Eng., 18, 387 (1974), T. S. Bal et al., Polymer, 21, 423 (1980), etc., ammonium salts described in U.S. Pat. Nos. 4,069,055, 4,069,056 and Re27,992, JP-A-3-140140, etc., phosphonium salts described in D. C. Necker et al., Macromolecules, 17, 2468 (1984), C. S. Wen et al., Teh, Proc. Conf. Rad. Curing ASIA, p. 478, Tokyo, Oct. (1988), U.S. Pat. Nos. 4,069,055 and 4,069,056, etc., iodonium salts described in J. V. Crivello et al., Macromolecules, 10 (6) 1307 (1977), Chem. & Eng. News, Nov. 28, p. 31 (1988), European Patents 104,143, 339,049 and 410,201, JP-A-2-150848, JP-A-2-296514, etc., sulfonium salts described in J. V. Crivello et al., Polymer J., 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), European Patents 370,693, 161,811, 410,201, 339,049, 233,567, 297,443 and 297,442, U.S. Pat. Nos. 3,902,114, 4,933,377, 4,760,013, 4,734,444 and 2,833,827, German Patent 2,904, 626, 3,604,580 and 3,604,581, JP-A-7-28237, JP-A-8-27102, etc., selenonium salts described in J. V. Crivello et al., Macromolecules, 10 (6), 1307 (1977), J. V. Crivello et al., J. Polymer Sci., Polymer Chem. Ed., 17, 1047 (1979), etc., and arsonium salts described in C. S. Wen et al., Teh, Proc. Conf. Rad. Curing ASIA, p. 478, Tokyo, Oct. (1988), etc.; organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, etc.; organic metals/organic halides described in K. Meier et al., J. Rad. Curing, 13 (4), 26 (1986), T. P. Gill et al., Inorg. Chem., 19, 3007 (1980), D. Astruc, Acc. Chem. Res., 19 (12), 377 (1896), JP-A-2-161445, etc.; photo-acid generators having an O-nitrobenzyl type protective group described in S. Hayase et al., J. Polymer Sci., 25, 753 (1987), E. Reicbmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem. Soc., 3571 (1965), P. M. Collins et al., J. Chem. Soc., Perkin I, 1695 (1975), M. Rudinstein et al., Tetrahedron Lett., (17), 1445 (1975), J. W. Walker et al., J.

Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), European Patents 0,290,750, 046,083, 156,535, 271,851 and 0,388, 343, U.S. Pat. Nos. 3,901,710 and 4,181,531, JP-A-60-198538, JP-A-53-133022, etc.; compounds which are photochemically decomposed to generate sulfonic acid, represented by iminosulfonate, described in M. TUNOOKA et al., Polymer Preprints Japan, 35 (8), G. Berner et al., J. Rad. Curing, 13 (4), W. J. Mijs et al., Coating Technol., 55 (697), 45 (1983), Akzo, H. Adachi et al., Polymer Preprints, Japan, 37 (3), European Patents 0,199,672, 84,515, 044,115, 618,564 and 0,101,122, U.S. Pat. Nos. 4,371,605 and 4,431, 774, JP-A-64-18143, JP-A-2-245756, JP-A-3-140109, etc.; disulfone compounds described in JP-A-61-166544, JP-A-2-71270, etc.; and diazoketosulfone and diazosulfone compounds described in JP-A-3-103854, JP-A-3-103856 and JP-A-4-210960, etc.

In addition, compounds in which the above-described group or compound capable of generating an acid by light is introduced in the main chain or side chain may also be used and examples thereof include the compounds described in M. E. Woodhouse et al., J. Am. Chem. Soc., 104, 5586 (1982), S. P. Pappas et al., J. Imaging Sci., 30 (5), 218 (1986), S. Kondo et al., Makromol. Chem., Rapid Commun., 9, 625 (1988), Y. Yamada et al., Makromol. Chem., 152, 153, 163 (1972), J. V. Crivello et al., J. Polymer Sci., Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, JP-A-63-146029, etc.

Furthermore, the compounds capable of generating an acid by light described in V. N. R. Pillai, Synthesis, (1), 1 (1980), A. Abad et al., Tetrahedron Lett., (47) 4555 (1971), D. H. R. Barton et al., J. Chem. Soc., (C), 329 (1970), U.S. Pat. No. 3,779,778, European Patent 126,712, etc. may also be used.

Among these compounds capable of decomposing upon irradiation with actinic ray or radiation and thereby generating an acid, particularly effective compounds are described below.

(1) Oxazole Derivative Represented by Formula (PAG1) and S-Triazine Derivative Represented by Formula (PAG2), Substituted by Trihalomethyl Group:

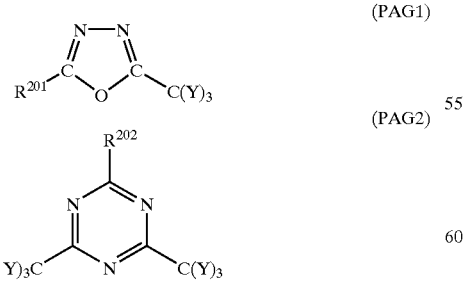

wherein $R^{201}$ represents a substituted or unsubstituted aryl group or a substituted or unsubstituted alkenyl group, $R^{202}$ represents a substituted or unsubstituted aryl group, a substituted or unsubstituted alkenyl group, a substituted or unsubstituted alkyl group or $-C(Y)_3$, and Y represents chlorine atom or bromine atom.

Specific examples thereof include the following compounds, however, the present invention is by no means limited thereto.

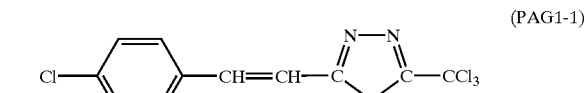
(PAG1-1)

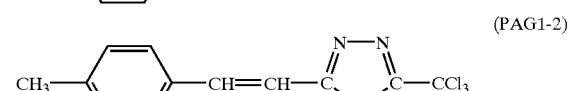
(PAG1-2)

(PAG1-3)

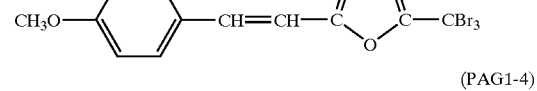
(PAG1-4)

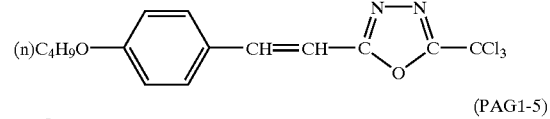
(PAG1-5)

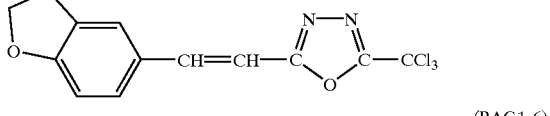
(PAG1-6)

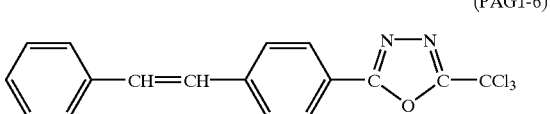
(PAG1-7)

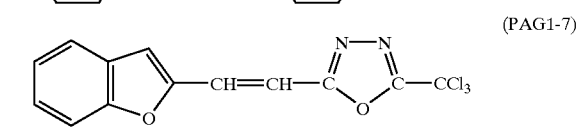
(PAG1-8)

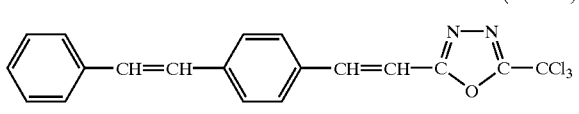
(PAG2-1)

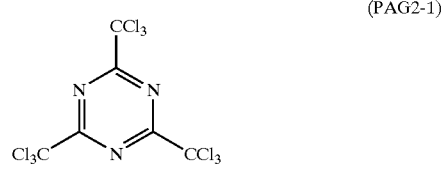
(PAG2-2)

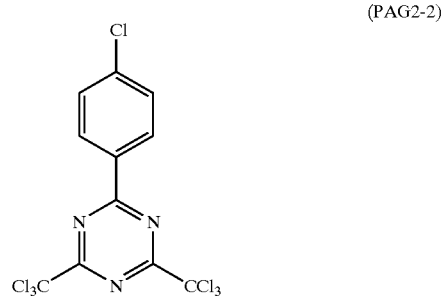

(PAG2-3) 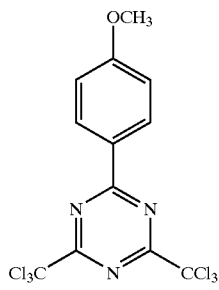

(PAG2-4) 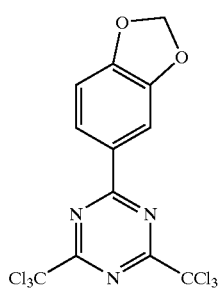

(PAG2-5) 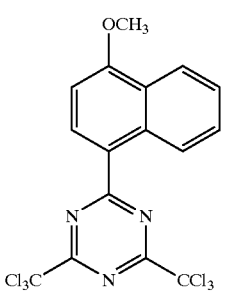

(PAG2-6) 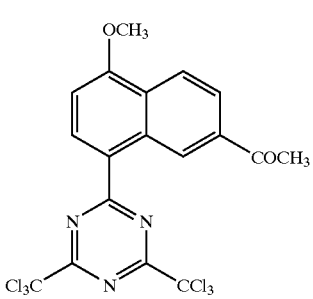

(PAG2-7) 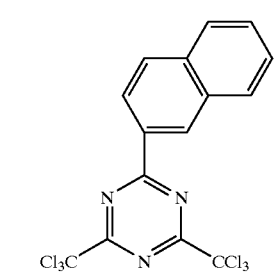

(PAG2-8) 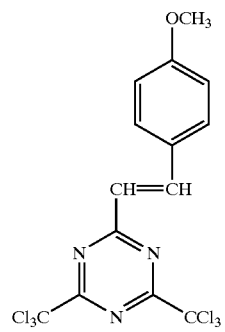

(PAG2-9) 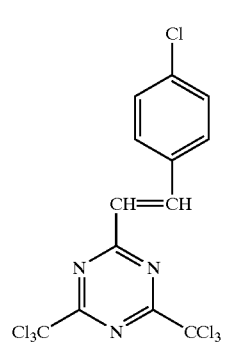

(PAG2-10) 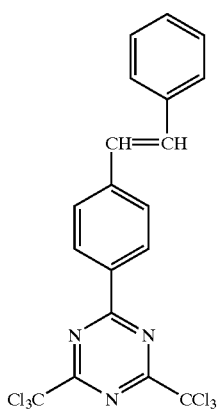

(2) Iodonium Salt Represented by Formula (PAG3) and Sulfonium Salt Represented by Formula (PAG4):

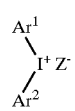
(PAG3)

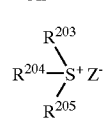
(PAG4)

wherein $Ar^1$ and $Ar^2$ each independently represents a substituted or unsubstituted aryl group (the substituent is preferably an alkyl group, a haloalkyl group, a cycloalkyl group, an aryl group, an alkoxy group, a nitro group, a carboxyl group, an alkoxycarbonyl group, a hydroxy group, a mercapto group or a halogen atom), $R^{203}$, $R^{204}$ and $R^{205}$ each independently represents a substituted or unsubstituted alkyl group or a substituted or unsubstituted aryl group, and preferably an aryl group having from 6 to 14 carbon atoms, an alkyl group having from 1 to 8 carbon atoms or a substituted derivative thereof (the substituent of the aryl group is preferably an alkoxy group having from 1 to 8 carbon atoms, an alkyl group having from 1 to 8 carbon atoms, a nitro group, a carboxyl group, a hydroxy group or a halogen atom, and the substituent of the alkyl group is preferably an alkoxy group having from 1 to 8 carbon atoms, a carboxyl group or an alkoxycarbonyl group), and $Z^-$ represents a counter anion (for example, $BF_4^-$, $AsF_6^-$, $PF_6^-$, $SbF_6^-$, $SiF_6^{2-}$, $ClO_4^-$, perfluoroalkane sulfonate anion such as $CF_3SO_3^-$, pentafluorobenzene sulfonate anion, condensed polynuclear aromatic sulfonate anion such as naphthalene-1-sulfonate anion, anthraquinone sulfonate anion and sulfonic acid group-containing dye, but the anion is not limited thereto).

Two of $R^{203}$, $R^{204}$ and $R^{205}$, or $Ar^1$ and $Ar^2$ may be bonded through a single bond or a substituent.

Specific examples thereof include the following compounds, however, the present invention is by no means limited thereto.

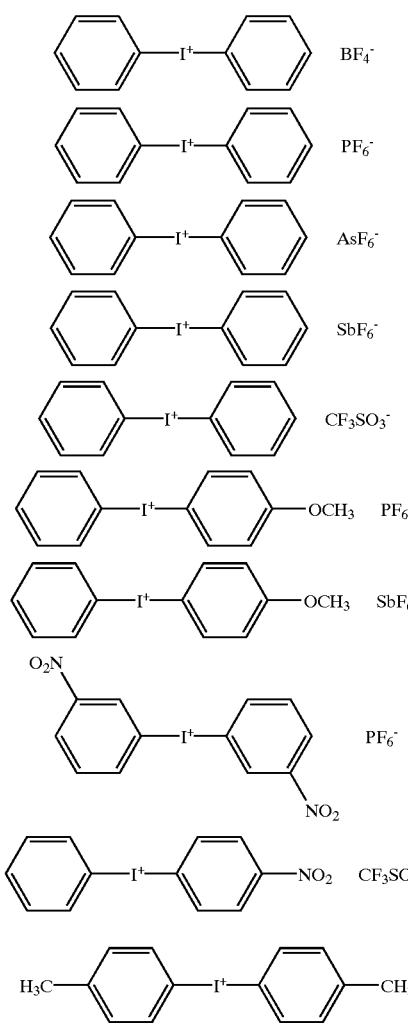

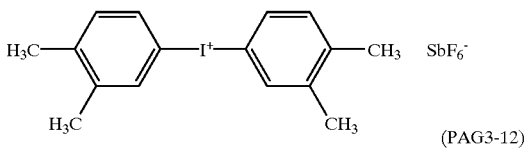

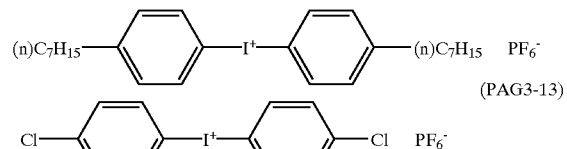

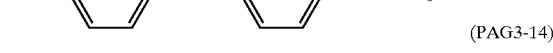

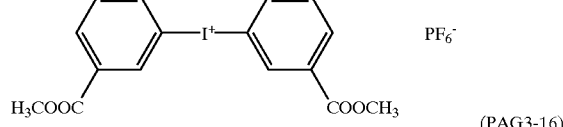

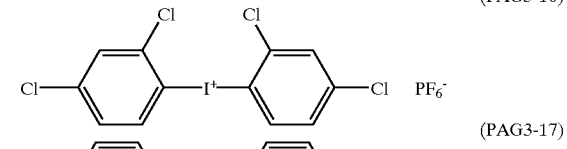

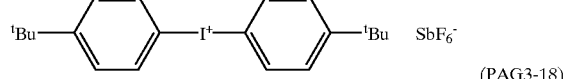

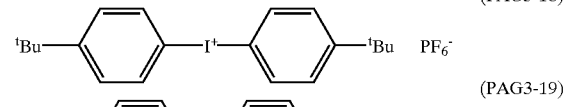

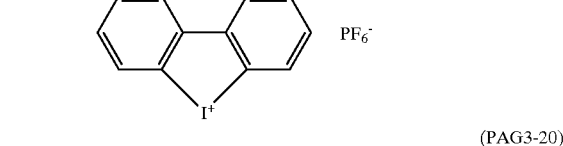

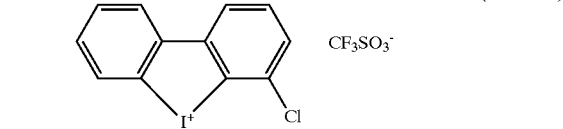

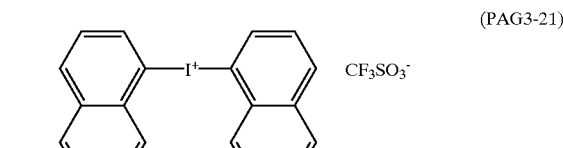

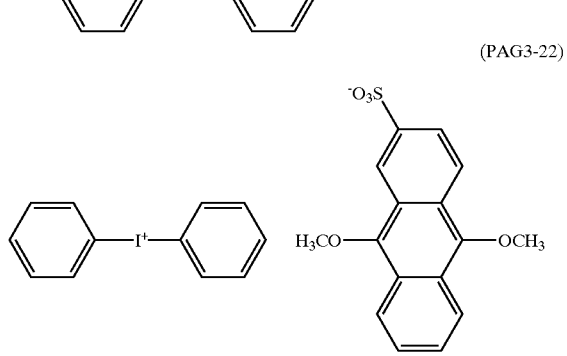

(PAG3-23)
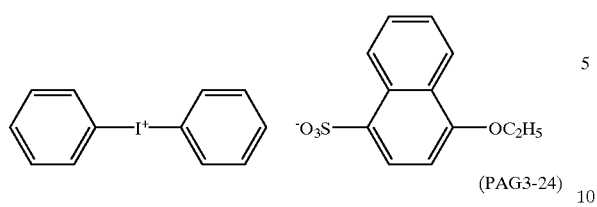
(PAG3-24)
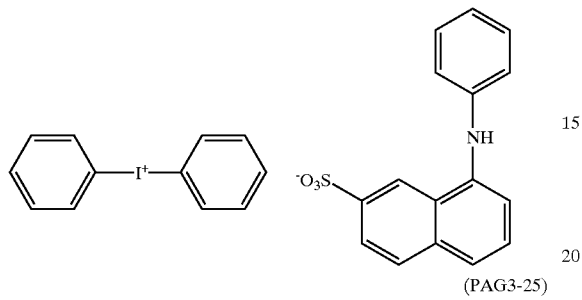
(PAG3-25)
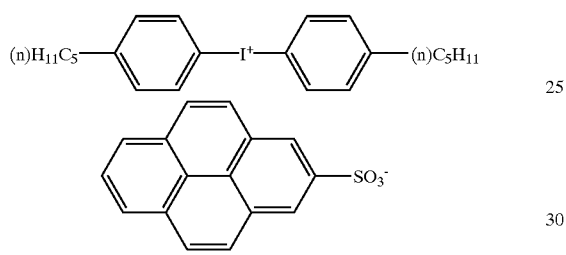
(PAG3-26)
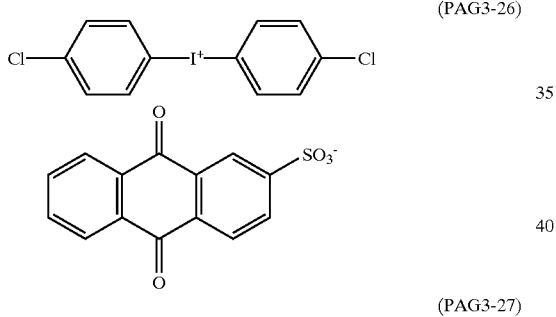
(PAG3-27)
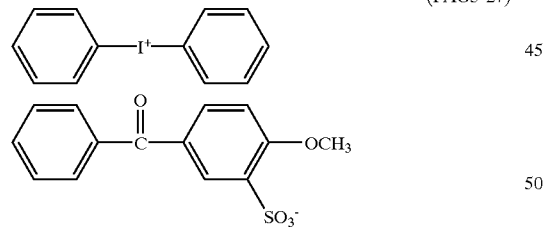
(PAG3-28)
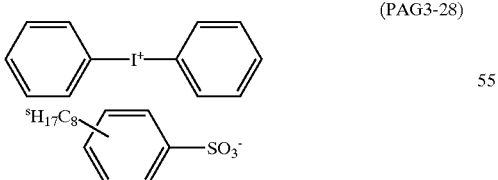
(PAG3-29)
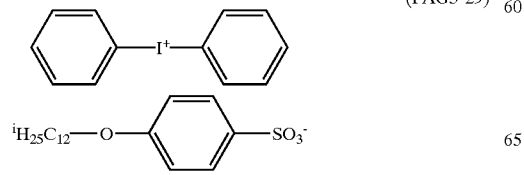
(PAG3-30)
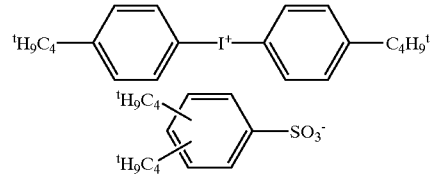
(PAG3-31)
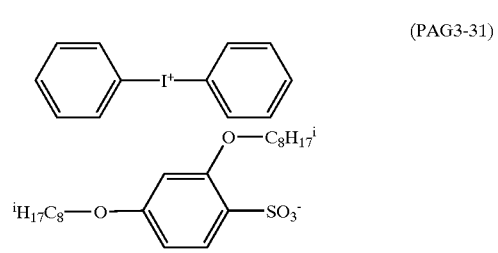
(PAG3-32)
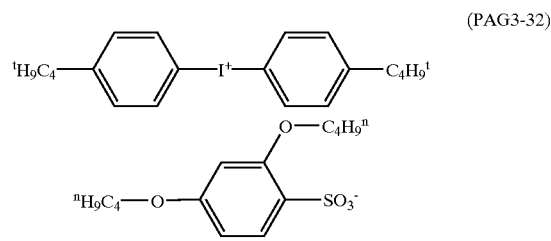
(PAG3-33)
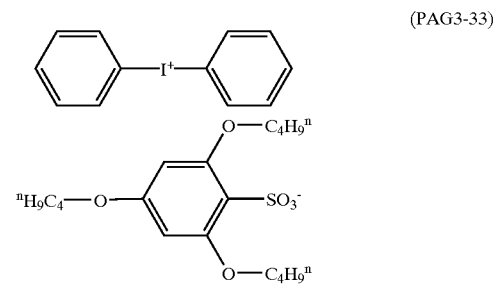
(PAG3-34)
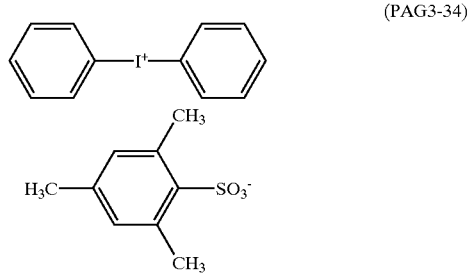
(PAG3-35)
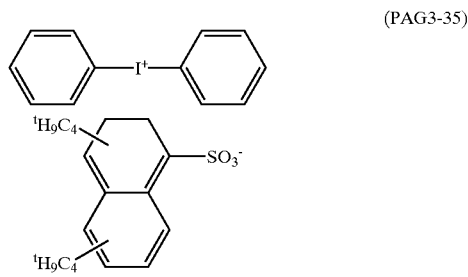

-continued
(PAG3-36)
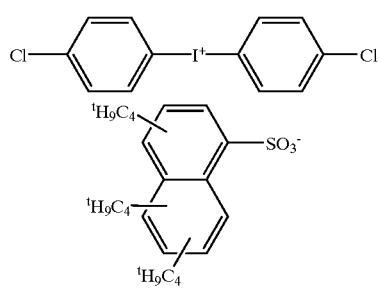
(PAG3-37)
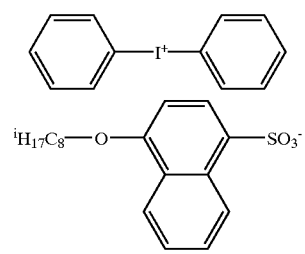
(PAG3-38)
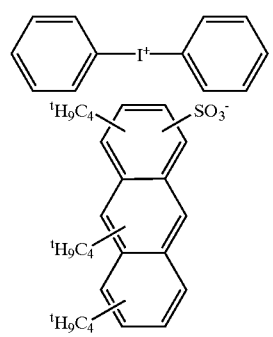
(PAG3-39)
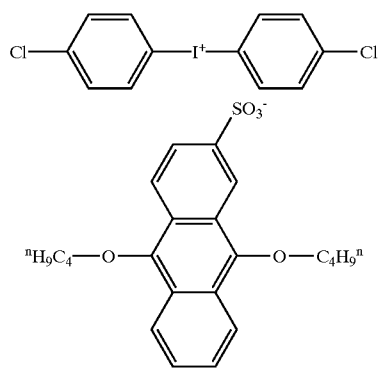
(PAG3-40)
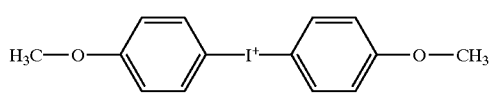
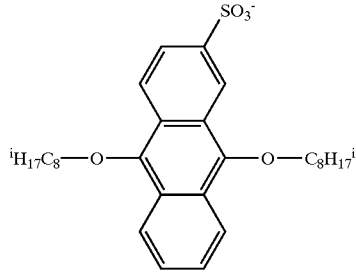
-continued
(PAG4-1)
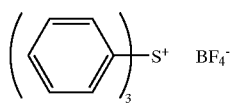
(PAG4-2)
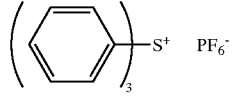
(PAG4-3)
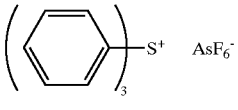
(PAG4-4)
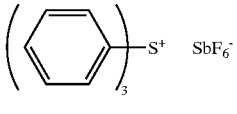
(PAG4-5)
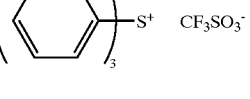
(PAG4-6)
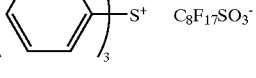
(PAG4-7)
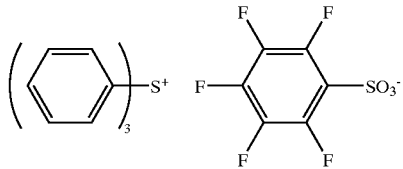
(PAG4-8)
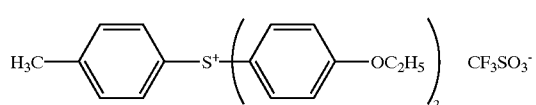
(PAG4-9)
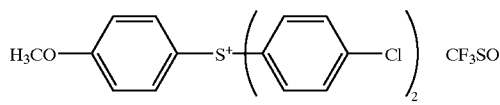
(PAG4-10)
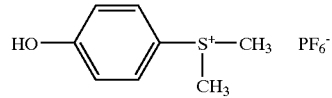
(PAG4-11)
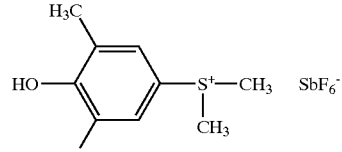
(PAG4-12)
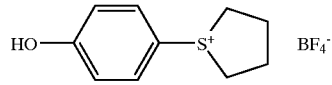

-continued
(PAG4-13)
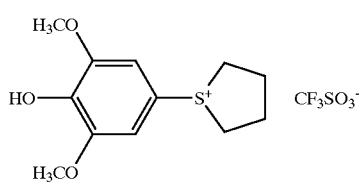
(PAG4-14)
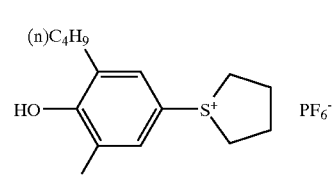
(PAG4-15)
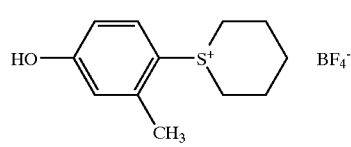
(PAG4-16)
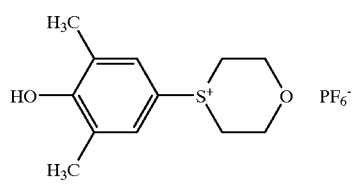
(PAG4-17)
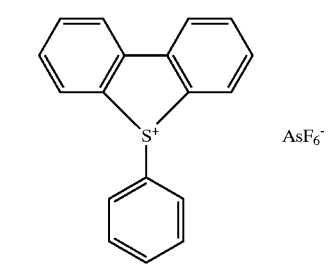
(PAG4-18)
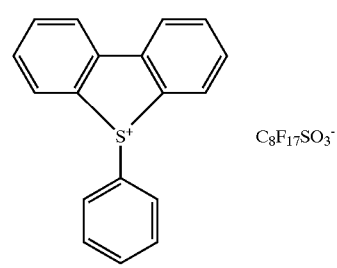
(PAG4-19)
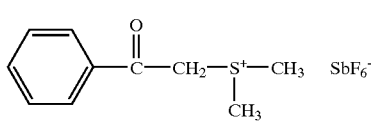
(PAG4-20)
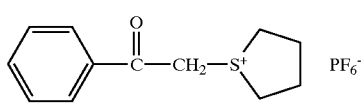
(PAG4-21)
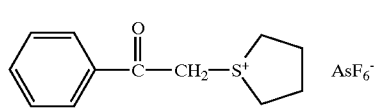
-continued
(PAG4-22)
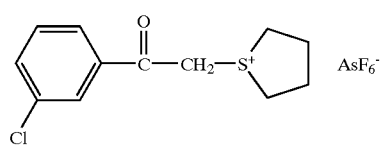
(PAG4-23)
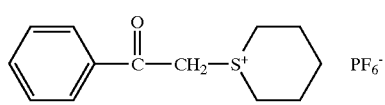
(PAG4-24)
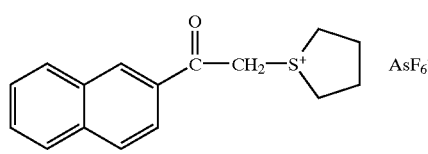
(PAG4-25)
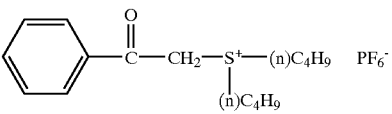
(PAG4-26)
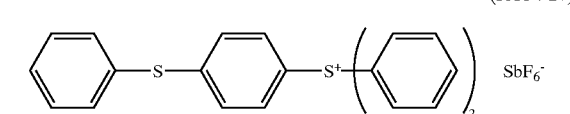
(PAG4-27)
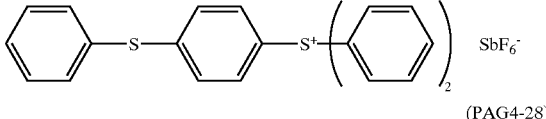
(PAG4-28)
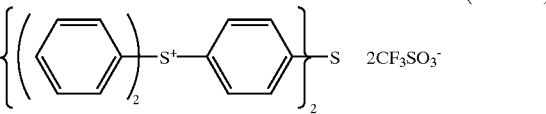
(PAG4-29)
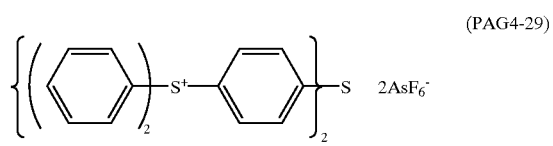
(PAG4-30)
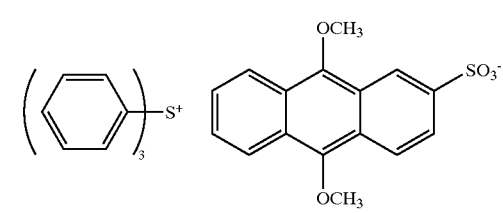
(PAG4-31)
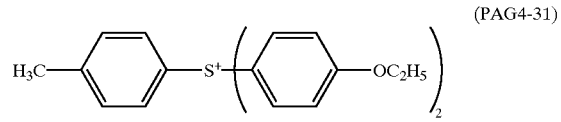
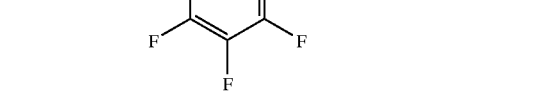

(PAG4-32)
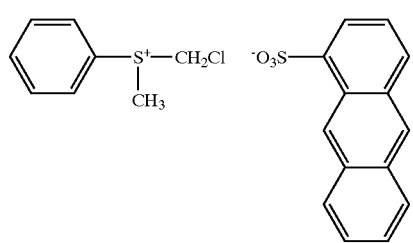
(PAG4-33)
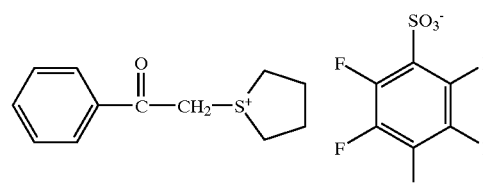
(PAG4-34)
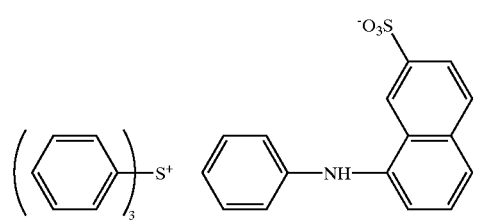
(PAG4-35)
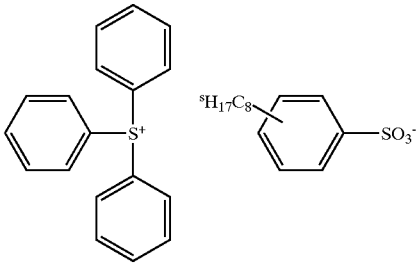
(PAG4-36)
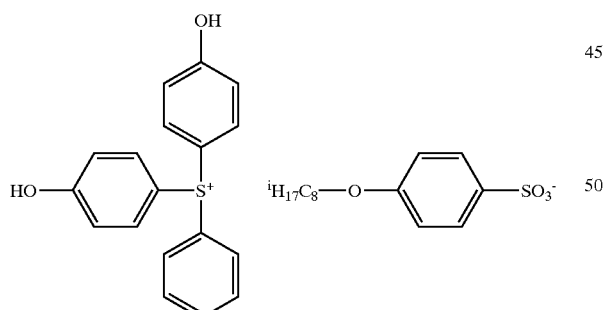
(PAG4-37)
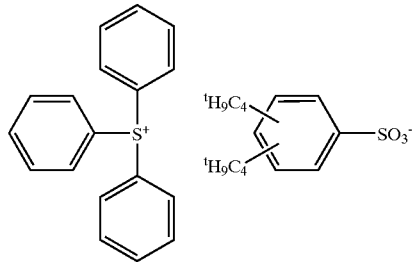
(PAG4-38)
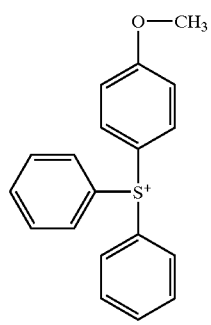
(PAG4-39)
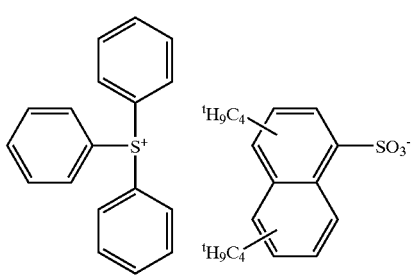
(PAG4-40)
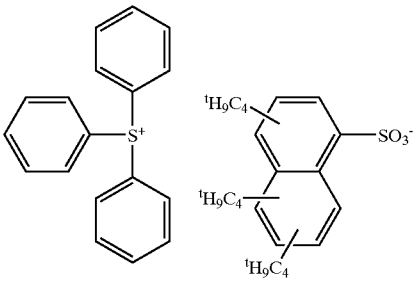
(PAG4-41)
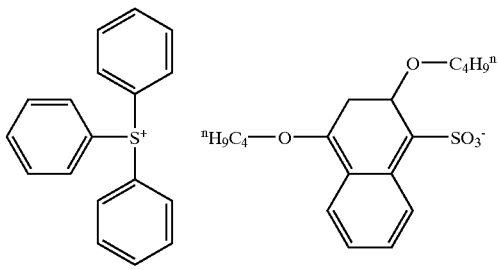
(PAG4-42)
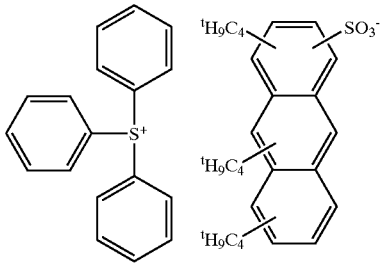

(PAG4-43)
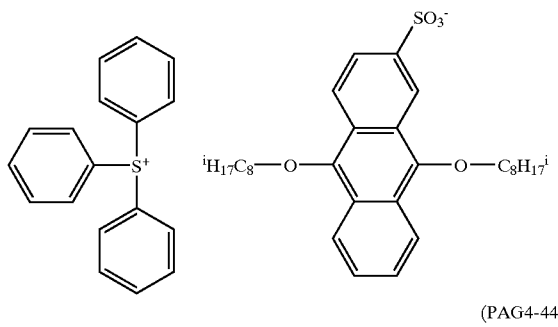

(PAG4-44)
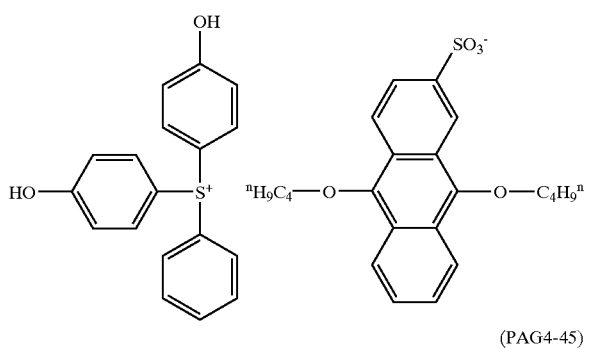

(PAG4-45)
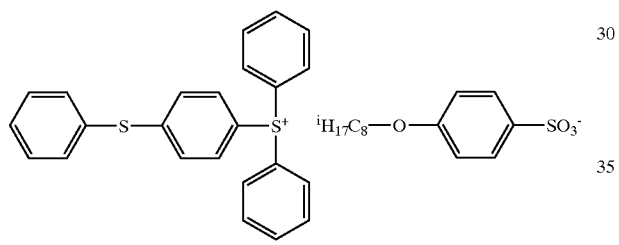

(PAG4-46)
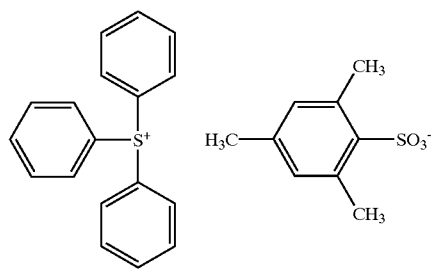

(PAG4-47)
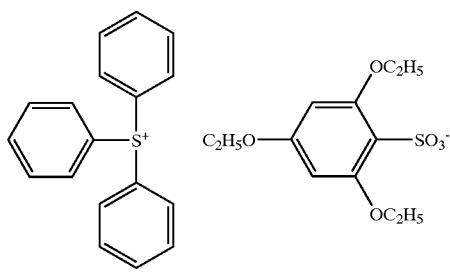

The above-mentioned onium salts represented by formulae (PAG3) and (PAG4) are known and can be synthesized by the method described, for example, in J. W. Knapczyl et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Am. Chem. Soc.*, 51, 3587 (1929), J. V. Crivello et al., *J. Polym. Chem. Ed.*, 18, 2677 (1980), U.S. Pat. Nos. 2,807,648 and 4,247,473, JP-A-53-101331, etc.

(3) Disulfonic Acid Derivative Represented by Formula (PAG5) and Iminosulfonate Derivative Represented by Formula (PAG6):

$$Ar^3—SO_2—SO_2—Ar^4 \quad (PAG5)$$

(PAG6)
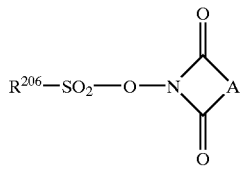

wherein $Ar^3$ and $Ar^4$ each independently represents a substituted or unsubstituted aryl group, $R^{206}$ represents a substituted or unsubstituted alkyl group or a substituted or unsubstituted aryl group, A represents a substituted or unsubstituted alkylene group, a substituted or unsubstituted alkenylene group or a substituted or unsubstituted arylene group.

Specific examples thereof include the following compounds, however, the present invention is by no means limited thereto.

(PAG5-1)
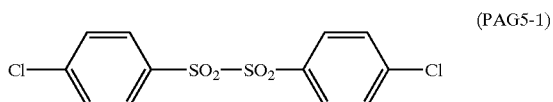

(PAG5-2)

(PAG5-3)
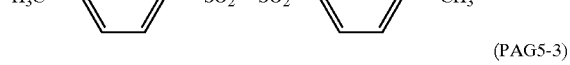

(PAG5-4)
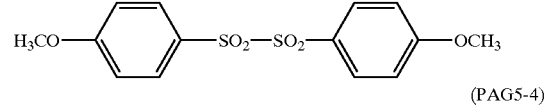

(PAG5-5)
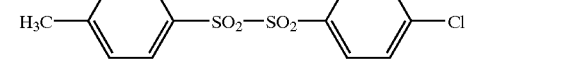

(PAG5-6)
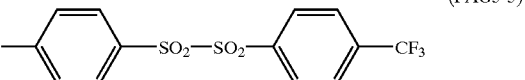

(PAG5-7)

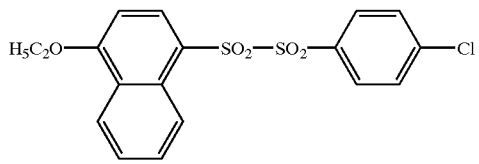

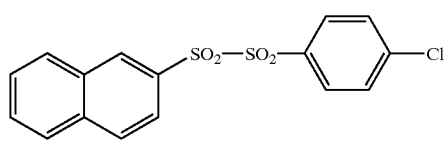
(PAG5-8)
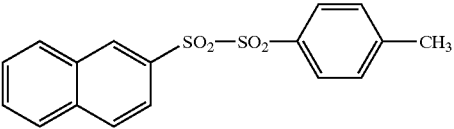
(PAG5-9)
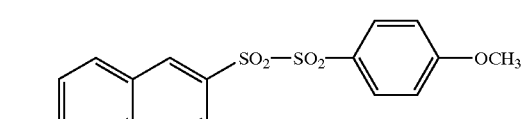
(PAG5-10)
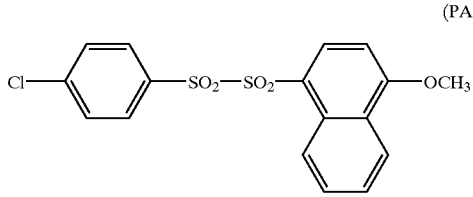
(PAG5-11)
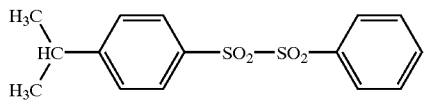
(PAG5-12)
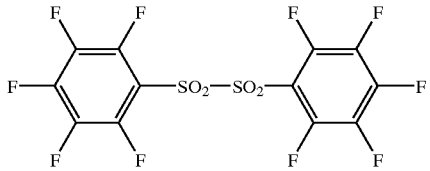
(PAG5-13)
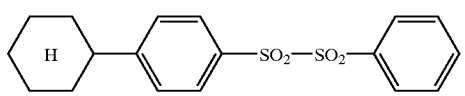
(PAG5-14)
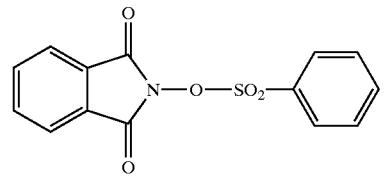
(PAG6-1)
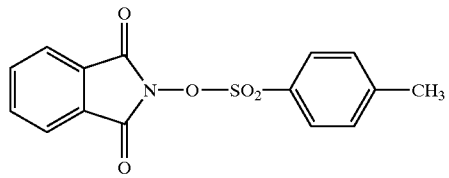
(PAG6-2)
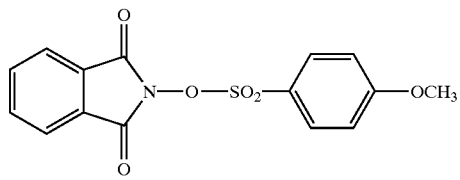
(PAG6-3)
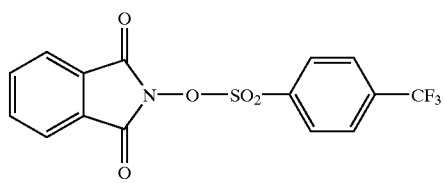
(PAG6-4)
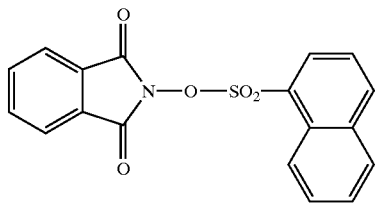
(PAG6-5)
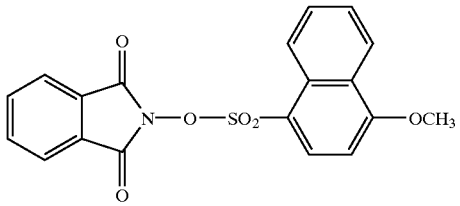
(PAG6-6)
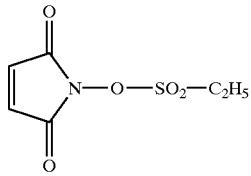
(PAG6-7)
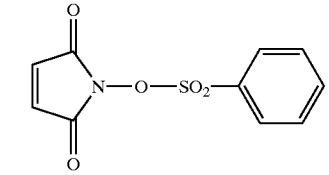
(PAG6-8)
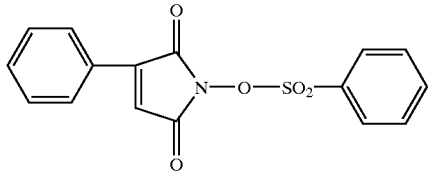
(PAG6-9)
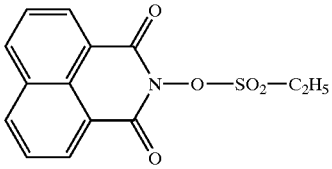
(PAG6-10)
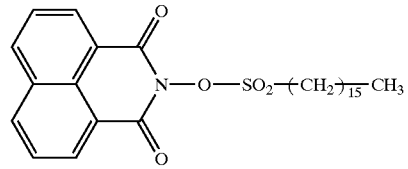
(PAG6-11)

-continued

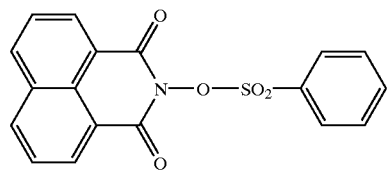
(PAG6-12)

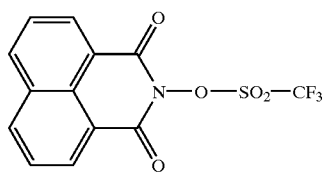
(PAG6-13)

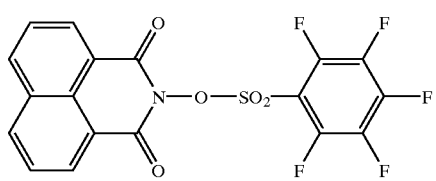
(PAG6-14)

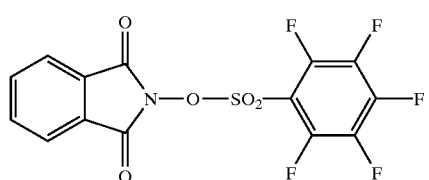
(PAG6-15)

In the present invention, the photo-acid generator (b) is preferably an onium salt, disulfone, 4-position DNQ (diazonaphthoquinone) sulfonic acid ester or a triazine compound.

The amount of the photo-acid generator (b) added is usually from 0.001 to 40 wt %, preferably from 0.01 to 20 wt %, more preferably from 0.1 to 5 wt %, based on the total weight of the positive photoresist composition (excluding the coating solvent) of the present invention. If the added amount of the compound capable of decomposing under irradiation with actinic ray or radiation and thereby generating an acid is less than 0.001 wt %, the sensitivity decreases, whereas if the added amount exceeds 40 wt %, the light absorption by the resist excessively increases and the profile changes for the worse or the process (particularly bake) margin is disadvantageously reduced.

Examples of the compound (c) for use in the present invention, namely, (c1) a phenolic compound in which at least a part of phenolic hydroxyl groups contained within the molecule are protected by an acid-decomposable group or (c2) an aromatic or aliphatic carboxylic acid compound in which at least a part of carboxyl group contained within the molecule are protected by an acid-decomposable group, include aromatic compounds containing from 2 to 7 aromatic rings and having a molecular weight of 186 to 1,500, and phenolic compounds selected from hydroxystyrene copolymers having a weight-average molecular weight determined by GPC of 2,000 to 20,000, in which from 20 to 100% of hydroxyl groups are protected by an acid-decomposable group.

The acid-decomposable group as used herein is the same as the acid-decomposable group acting as the protective group for protecting the phenolic hydroxyl group in the alkali-soluble polysiloxane represented by formula (II') or (II''') to form an acid-decomposable polysiloxane, and details thereon are already described above.

The amount of the component (c) added is preferably in the following range.

The amount of the component (c) added is preferably from 5 to 50 wt %, more preferably from 10 to 40 wt %, still more preferably from 20 to 30 wt %, based on the polysiloxane 1 or 3 of the present invention.

(i) In the case where the positive photoresist composition of the present invention contains an acid-decomposable polysiloxane as (a) the polysiloxane 2, the amount of the component (c) added is preferably, in terms of the weight ratio to the polysiloxane 2, from 1 to 40 wt %, more preferably from 2 to 30 wt %, still more preferably from 5 to 20 wt %.

(ii) In the case where the positive photoresist composition of the present invention contains an alkali-soluble polysiloxane and an acid-decomposable polysiloxane as (a) the polysiloxane 2, the amount of the component (c) added is preferably, in terms of the weight ratio to the polysiloxane 2, from 1 to 30 wt %, more preferably from 2 to 25 wt %, still more preferably from 5 to 15 wt %.

The amount of the component (c) added is preferably, in terms of the weight ratio to the. polysiloxane 4 of the present invention, from 1 to 40 wt %, more preferably from 2 to 30 wt %, still more preferably from 5 to 20 wt %.

Specific examples of the component (c) include the following compounds.

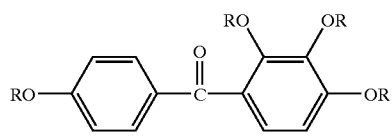
(1)

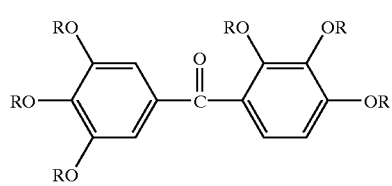
(2)

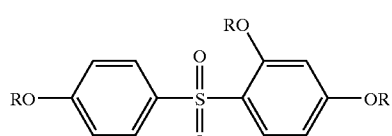
(3)

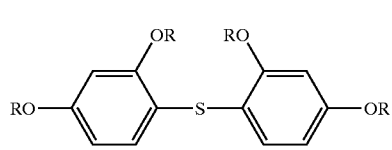
(4)

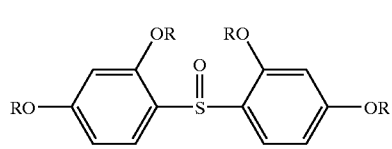
(5)

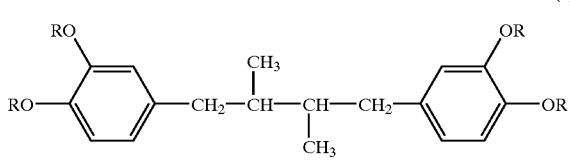
(6)

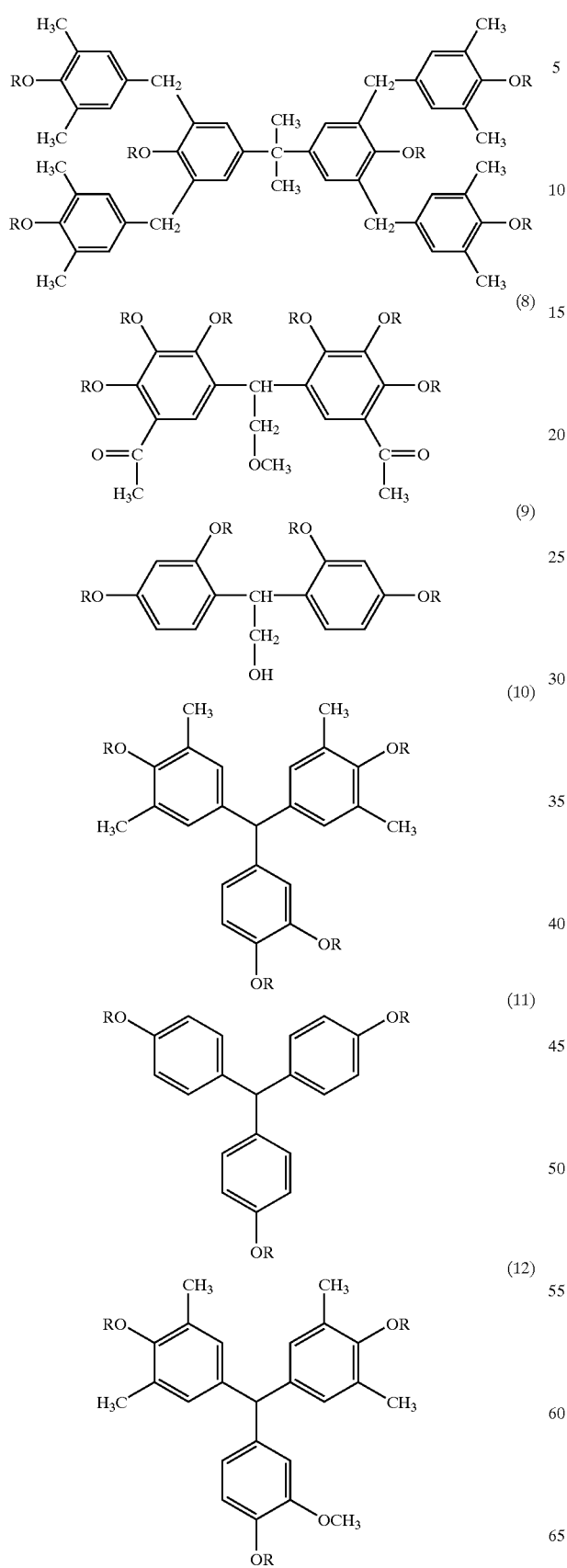
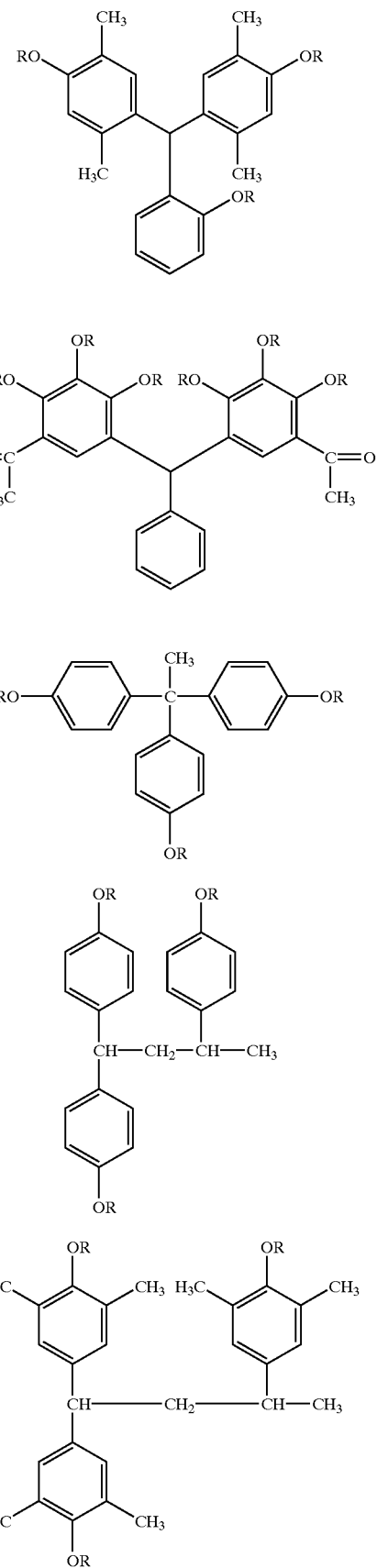

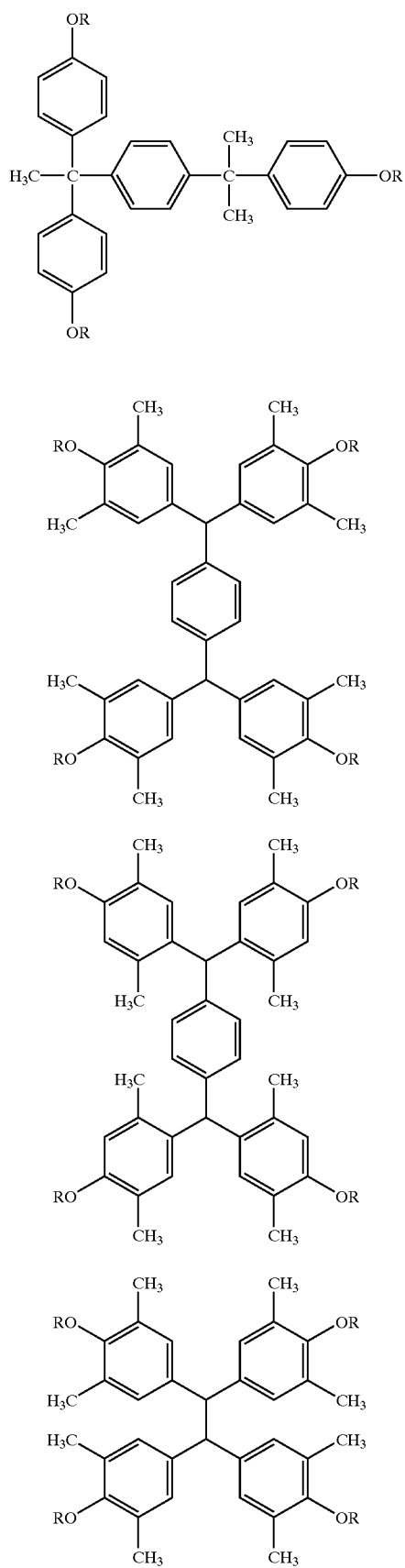
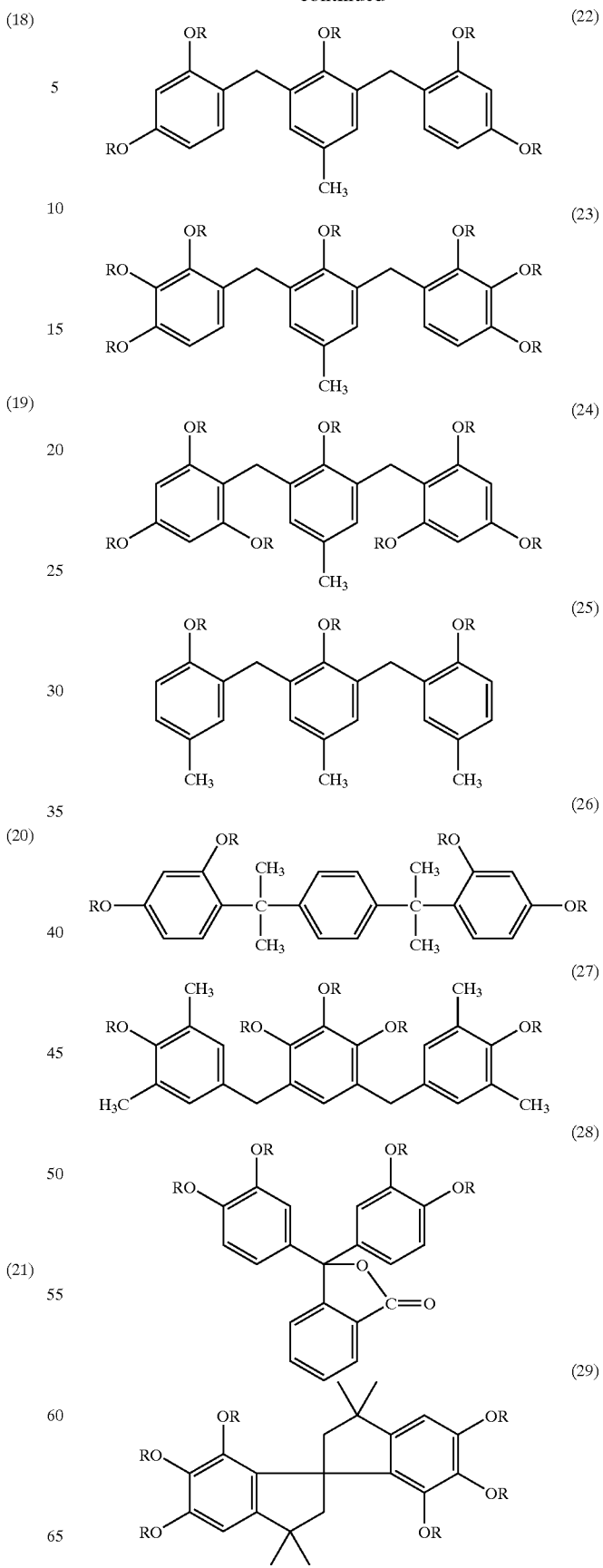

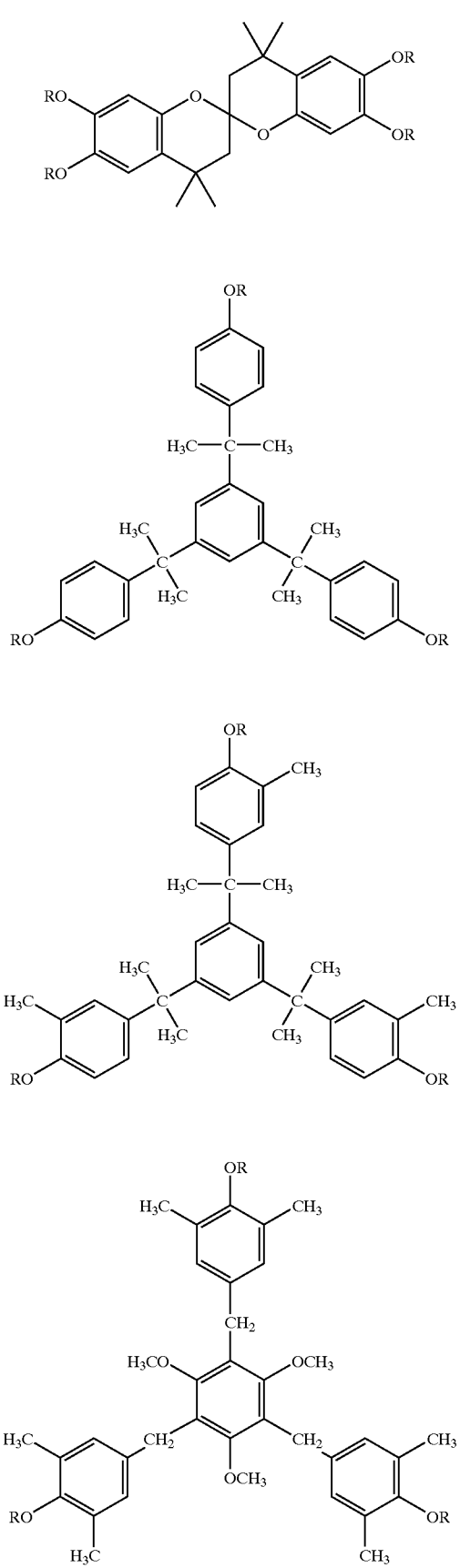
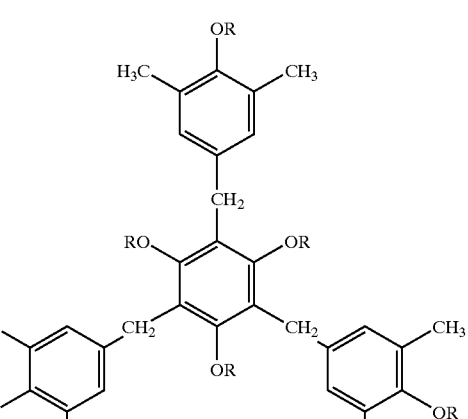
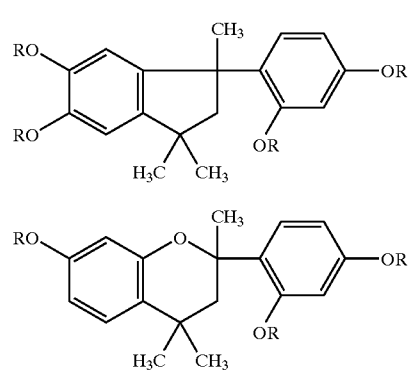
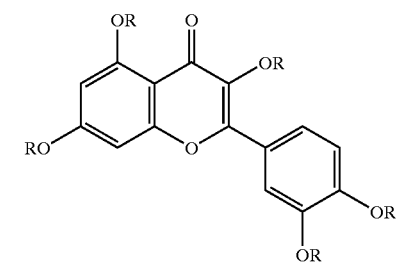
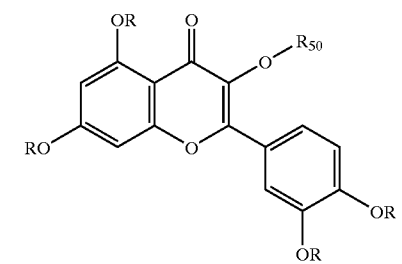
provides that $R_{50}$ is bonded to
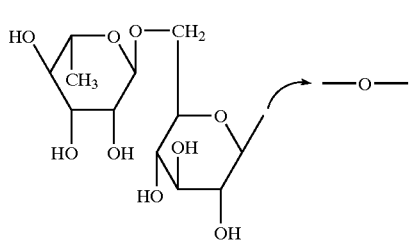

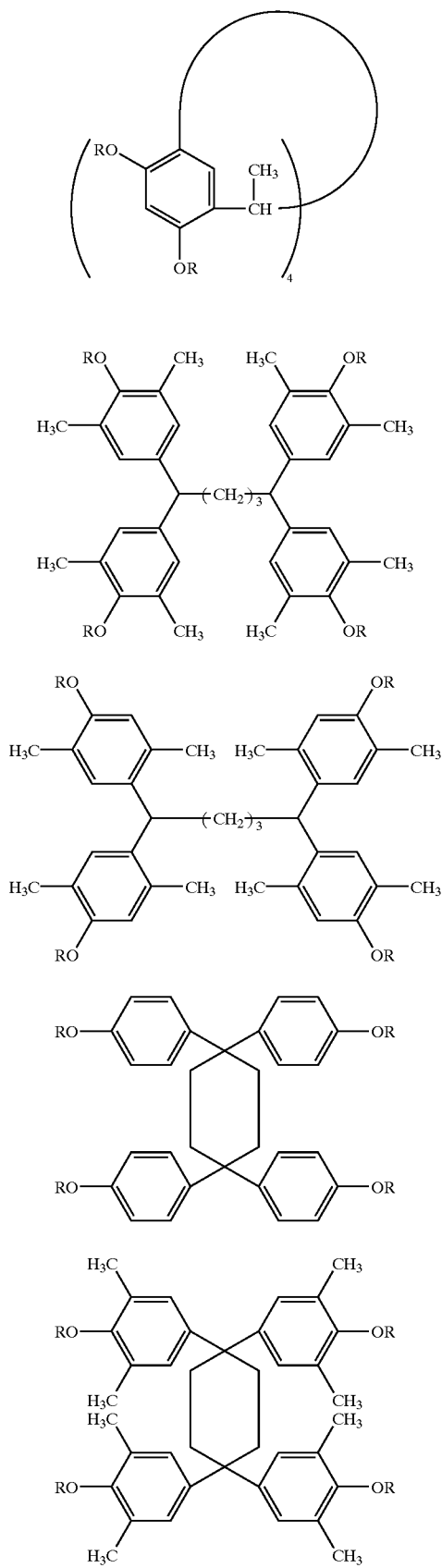
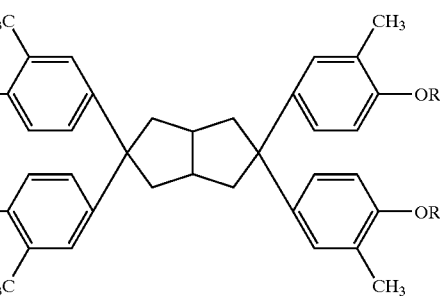
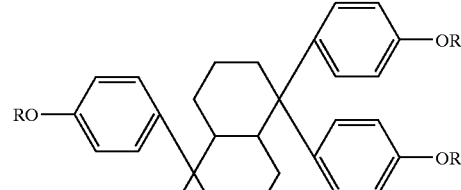
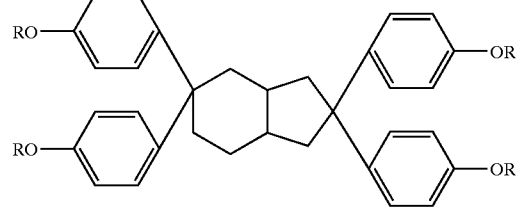
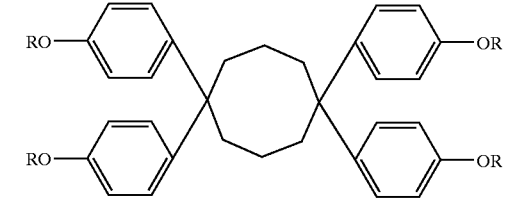
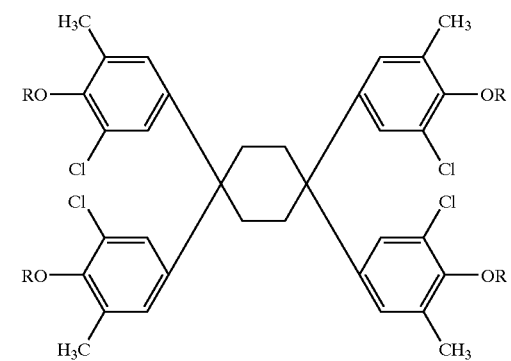

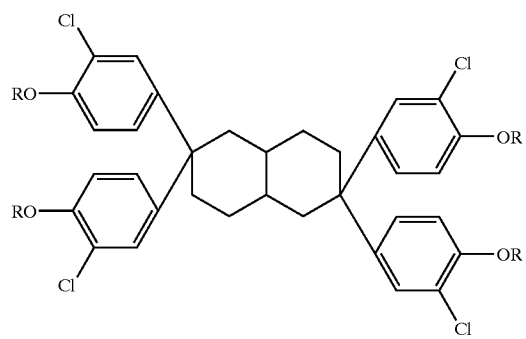
(50)
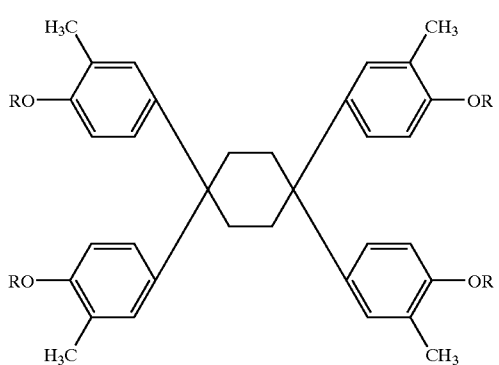
(51)
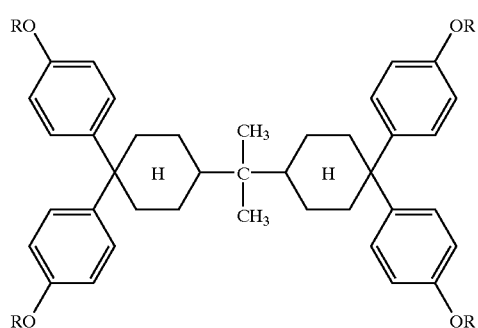
(52)
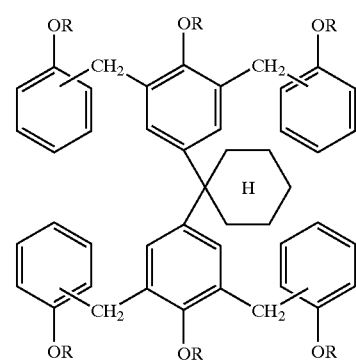
(53)
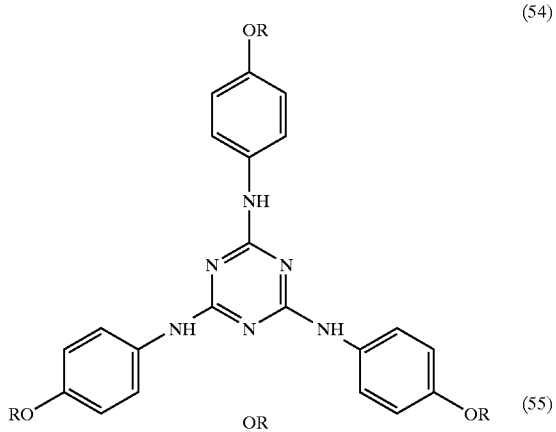
(54)
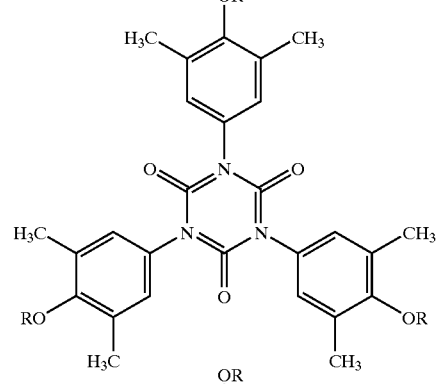
(55)
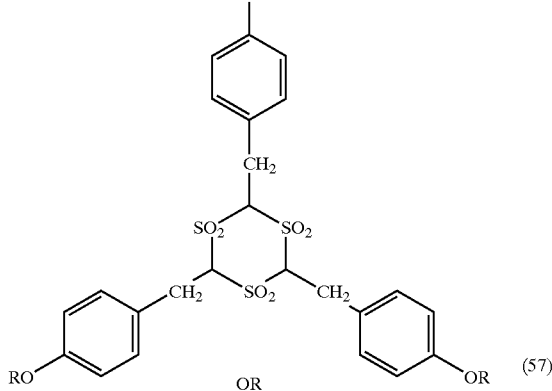
(56)
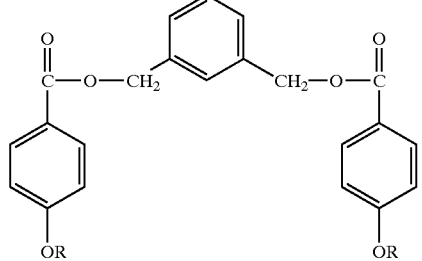
(57)

(58) 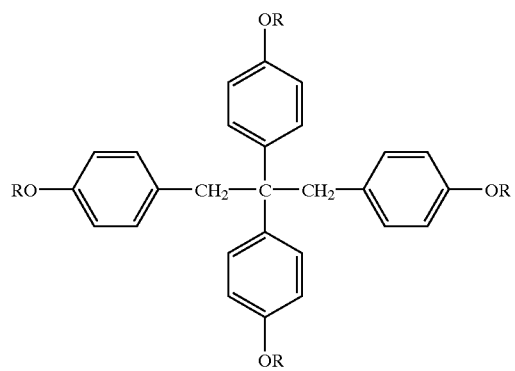
(59) 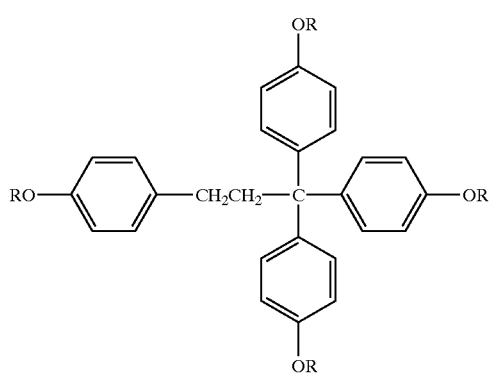
(60) 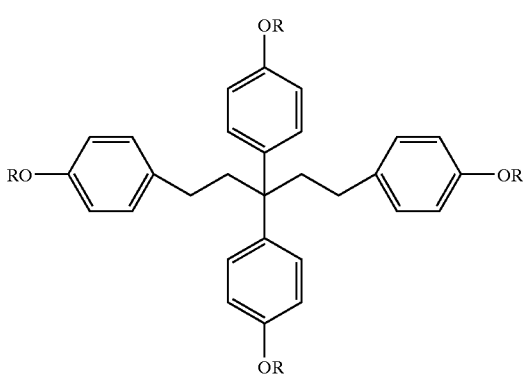
(61) 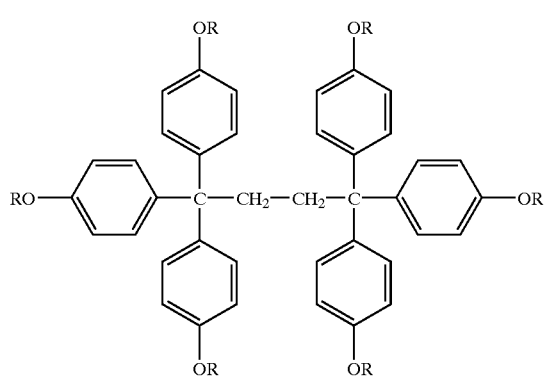
(62) 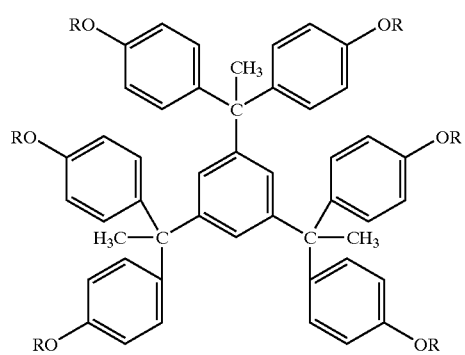
(63) 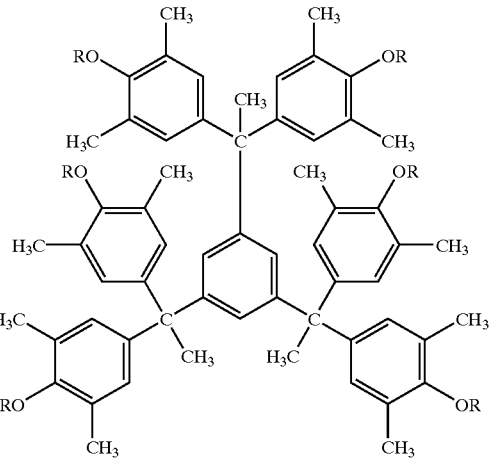
(in formulae (1) to (63), R represents hydrogen atom or a group selected from —CH$_2$—COO—C(CH$_3$)$_2$C$_6$H$_5$, —CH$_2$—COO—C$_4$H$_9^t$, —COO—C$_4$H$_9^t$ and
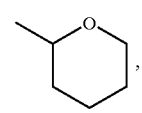,
provided that at least two groups, depending on the structure, three groups are a group other than hydrogen atom and respective substituents R may not be the same group).
(64) 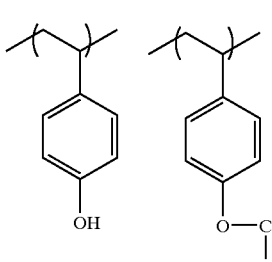

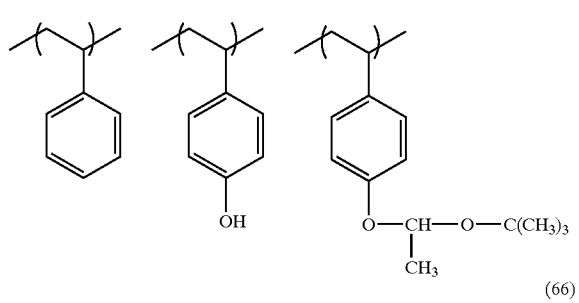
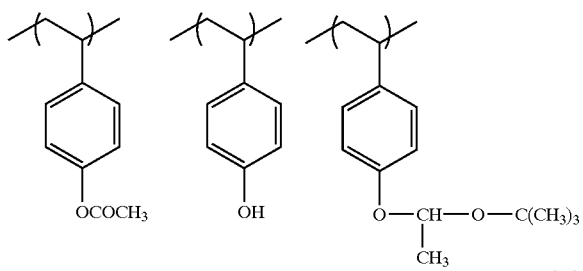
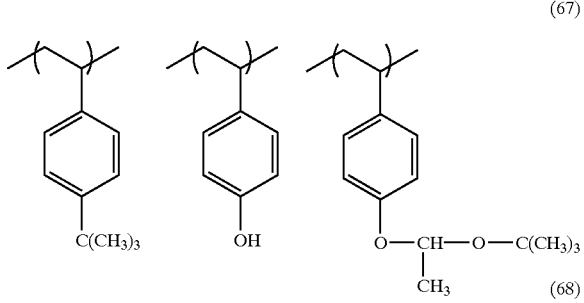
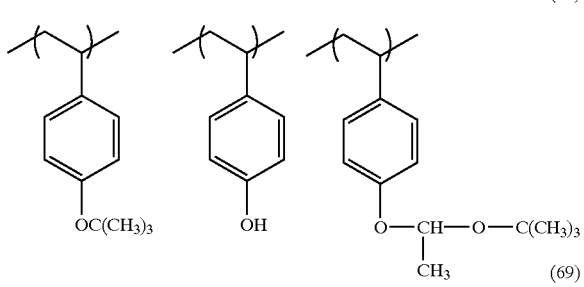
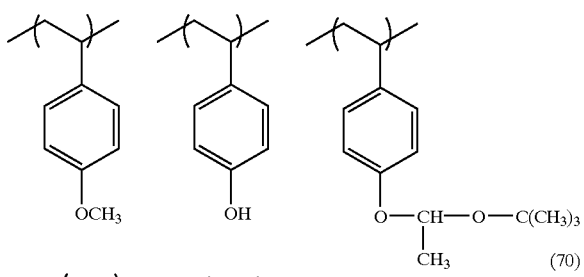
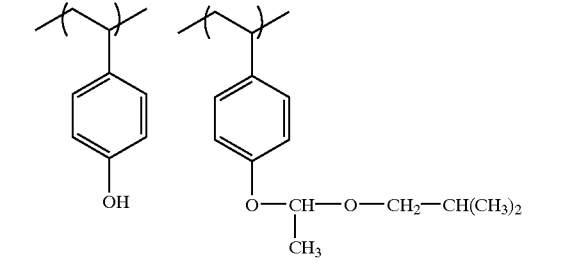
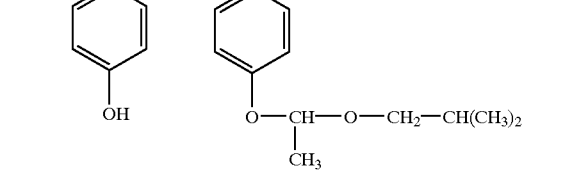

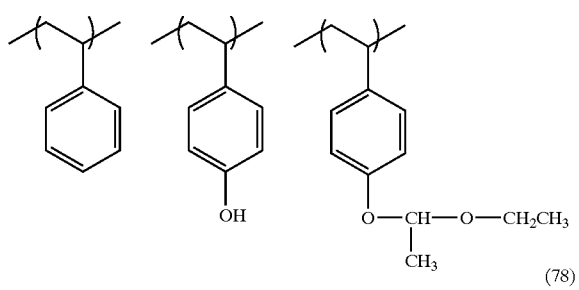
(77)

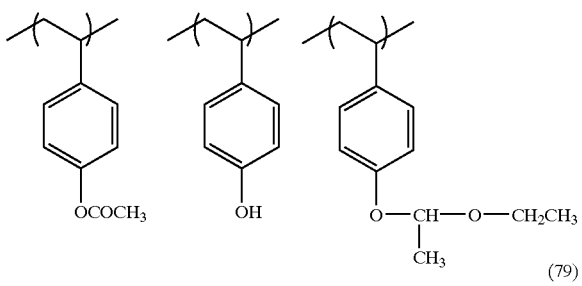
(78)

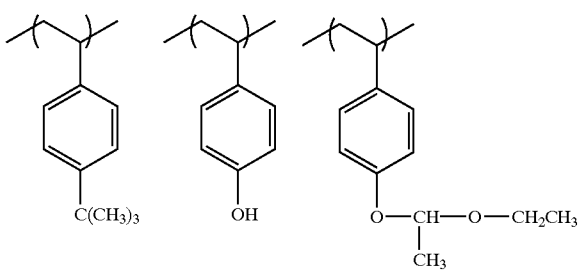
(79)

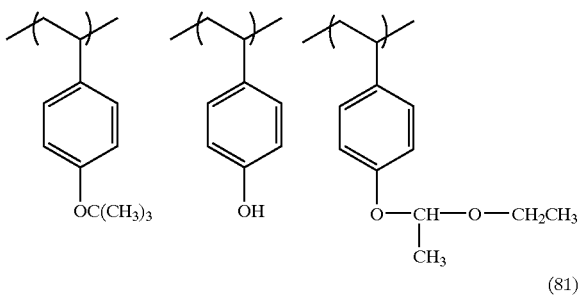
(80)

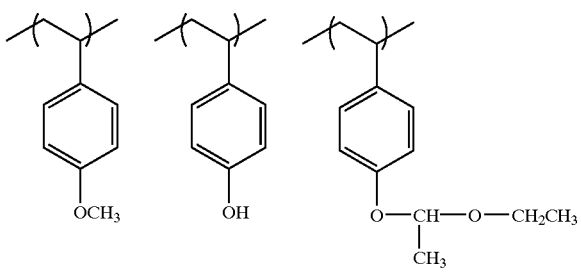
(81)

In the composition of the present invention, an organic basic compound may be blended. This is preferred because the stability during storage can be improved and the change in the line width due to PED can be reduced. The organic basic compound which can be used in the present invention is preferably a compound having stronger basicity than that of phenol, more preferably a nitrogen-containing basic compound. Preferred chemical environments include the following structures (A) to (E):

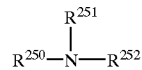
(A)

wherein $R^{250}$, $R^{251}$ and $R^{252}$ which may be the same or different, each represents hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, provided that $R^{251}$ and $R^{252}$ may combine with each other to form a ring.

(B)

(C)

(D)

(E)

In formula (E), $R^{253}$, $R^{254}$, $R^{255}$ and $R^{256}$, which may be the same or different, each represents an alkyl group having from 1 to 6 carbon atoms.

The compound is more. preferably a nitrogen-containing basic compound having two or more nitrogen atoms different in the chemical environment within one molecule, still more preferably a compound having both a substituted or unsubstituted amino group and a ring structure containing nitrogen atom, or a compound having an alkylamino group. Specific preferred examples thereof include substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted iridazoline, substituted or unsubstituted pyrazoline, substituted or unsubstituted piperazine, substituted or unsubstituted aminomorpholine and substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Particularly preferred examples of the compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)5pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)

pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine, however, the present invention is by no means limited thereto.

These nitrogen-containing basic compounds may be used either individually or in combination of two or more thereof. The amount of the nitrogen-containing basic compound used is usually from 0.001 to 10 parts by weight, preferably from 0.01 to 5 parts by weight, per 100 parts by weight of the photosensitive resin composition (excluding the solvent). If the amount used is less than 0.001 part by weight, the above-described effect may not be obtained, whereas if it exceeds 10 parts by weight, the sensitivity is liable to decrease or the developability in the non-exposed area is readily deteriorated.

The positive photoresist composition of the present invention may additionally contain, if desired, a surfactant, a dye, a plasticizer, a photosensitizer, a compound having two or more phenolic OH groups, which can accelerate the solubility in the developer, and the like.

Specific examples of suitable surfactants include nonionic surfactants including polyoxyethylene alkyl ethers such as polyoxyethylene lauryl ether, polyoxyethylene stearyl ether, polyoxyethylene cetyl ether and polyoxyethylene oleyl ether, polyoxyethylene alkylaryl ethers such as polyoxyethylene octyl phenol ether and polyoxyethylene nonyl phenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine-containing surfactants such as EFtop EF301, EF303 and EF352 (produced by Shin-Akita Kasei K.K.), Megafac F171 and F173 (produced by Dainippon Ink & Chemicals, Inc.), Florad FC430 and FC431 (produced by Sumitomo 3M Inc.), and Asahi-Guard AG710, Surflon S-382, SC101, SC102, SC103, SC104, SC105 and SC106 (produced by Asahi Glass Co., Ltd.); organosiloxane polymer KP-341 (produced by Shin-Etsu Chemical Co., Ltd.); and acrylic acid- or methacrylic acid-based (co)polymers Polyflow No. 75 and No. 95 (produced by Kyoei Sha Yushi Kagaku Kogyo K.K.).

These surfactants may be added individually or may be added in combination of some thereof. The amount of the surfactant added is preferably from 0.0005 to 0.01 part by weight per 100 parts by weight of the composition (excluding the solvent). Suitable examples of the dye include oil dyes and basic dyes. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all are produced by Orient Kagaku Kogyo K.K.), Crystal Violet (CI42555), Methyl Violet (CI42535), Rhodamine B (CI45170B), Malachite Green (CI42000) and Methylene Blue (CI52015).

Furthermore, a spectral sensitizer described below may be added to sensitize the composition to a wavelength region longer than the far ultraviolet region, where the photo-acid generator used does not have absorption, whereby the chemically amplified positive resist of the present invention can have sensitivity to the i-line or g-line. Specific examples of suitable spectral sensitizers include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzyl, Acridine Orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene. The present invention is, however, not limited to these compounds.

The compound having two or more phenolic hydroxyl groups, which accelerates the solubility in the developer, includes polyhydroxy compounds. Preferred examples of the polyhydroxy compound include phenols, resorcin, phloroglucin, phloroglucide, 2,3,4-trihydroxybenzophenone, 2,3,4,4'-tetrahydroxybenzophenone, α,α',α"-tris(4-hydroxyphenyl)-1,3,5-triisopropylbenzene, tris(4-hydroxyphenyl)methane, tris(4-hydroxyphenyl)ethane and 1,1'-bis(4-hydroxyphenyl) cyclohexane.

The positive photosensitive composition of the present invention is coated on a support after dissolving it in a solvent which dissolves the above-described components. Preferred examples of the solvent which can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofurane. These solvents are used individually or in combination.

The positive photoresist composition of the present invention is coated on a substrate (a substrate coated, for example, with silicon/silicon dioxide) for use in the production of precision integrated circuit devices by an appropriate coating method such as spinner and coater, exposed through a predetermined mask, baked and then developed, whereby a good resist pattern can be obtained.

Examples of the developer for the positive photoresist composition of the present invention include an aqueous solution of alkalis including inorganic alkalis such as sodium hydroxide, potassium hydroxide, sodium carbonate, sodium silicate, sodium phosphate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimetylethanolamine and triethanolamine, amides such as formamide and acetamide, quaternary ammonium salts such as tetramethylammonium hydroxide, trimethyl(2-hydroxyethyl) ammonium hydroxide, tetraethylammonium hydroxide, tributylmethylammonium hydroxide, tetraethanolammonium hydroxide, methyltriethanolammonium hydroxide, benzylmethyldiethanolammonium hydroxide, benzyldimethylethanolammonium hydroxide, benzyltriethanolammonium hydroxide, tetrapropylammonium hydroxide and tetrabutylammonium hydroxide, and cyclic amines such as pyrrole and piperidine.

The positive photoresist composition of the present invention is fundamentally constructed by the above-described components (a) and (b) and additionally, the component (c). However, in order to improve the film property, heat resistance and the like, an alkali-soluble resin other than the component (a) may be added. This alkali-soluble resin is preferably a polymer containing an acidic hydrogen atom having a pKa of 11 or less, such as phenolic hydroxyl group, a carboxylic acid group, a sulfonic acid group, an imido group, an sulfonamide group, an N-sulfonylamide group, an N-sulfonylurethane group and active methylene group.

The alkali-soluble polymer is suitably a novolak phenol resin and specific examples thereof include phenol formaldehyde resin, o-cresol formaldehyde resin, m-cresol formaldehyde resin, p-cresol formaldehyde resin, xylenol formaldehyde resin and co-condensation product thereof. Furthermore, a condensation product of a phenol substituted by an alkyl group having from 3 to 8 carbon atoms or cresol with formaldehyde, such as t-butylphenol formaldehyde resin, may be used in combination with the following phenol resin, as described in JP-A-50-125806. In addition, a polymer using as a copolymerization component a phenolic hydroxy group-containing monomer such as N-(4-hydroxyphenyl)methacrylamide, a homo- or copolymer of p-hydroxystyrene, o-hydroxystyrene, m-isopropenylphenol and p-isopropenylphenol, and a polymer resulting from the partial etherification or partial esterification of these polymers may also be used.

In the case where the resist formed of the positive photoresist composition of the present invention is used as the upper resist of a two-layer resist, this upper resist exhibits sufficiently high resistance against the oxygen plasma in the etching of the lower layer organic polymer film by oxygen plasma using the upper resist pattern as the protective mask. The oxygen plasma resistance of the positive photoresist composition of the present invention varies depending on the silicon content of the upper resist, the etching apparatus or the etching conditions, however, the etching selectivity ratio (etching rate ratio between the lower layer resist and the upper layer resist) can be from 10 to 100 and this is large enough.

In the formation of a pattern using the positive photoresist composition of the present invention, an organic polymer film is first formed on a substrate to be worked. This organic polymer film may be a known photoresist and examples thereof include various series such as FH series and FHi series produced by Fuji Film Olin, OiR series produced by Olin, and PFI series produced by Sumitomo Chemical Co., Ltd. The organic polymer film is formed by dissolving such a known material in an appropriate solvent and coating the obtained solution by the spin coating method, spraying method or the like. On the first layer of this organic polymer film, a film of the positive photoresist composition of the present invention is formed. In the same manner as the fist layer, the resist material is dissolved in an appropriate solvent and the obtained solution is coated by the spin coating method, spraying method or the like.

The thus-formed two-layer resist is then subjected to the pattern formation step. In the first stage, a pattern is formed on the photoresist composition film of the second layer, namely, the upper layer. More specifically, a mask is positioned, if desired, and then a high energy ray is irradiated through the mask, as a result, the photoresist composition in the irradiated area becomes soluble in an alkali aqueous solution and after the development with an alkali aqueous solution, a pattern is formed.

In the second stage, the organic polymer film is etched. This operation is performed by oxygen plasma etching using the pattern on the resist composition film as the mask to form a fine pattern having a high aspect ratio. This etching of the organic polymer film by oxygen plasma etching is completely the same technique as the plasma ashing used at the time of peeling off the resist film after the completion of the etching work of a substrate by the conventional photoetching operation. The oxygen plasma etching operation may be performed, for example, using oxygen as the reactive gas, namely, etching gas by a cylindrical plasma etching apparatus or a parallel plate-type plasma etching apparatus.

Thereafter, the substrate is worked using the resist pattern as the mask. For this working, a dry etching method such as sputter-etching, gas plasma etching and ion beam etching may be used.

The etching process by the two-layer film resist method containing the resist film of the present invention is completed by the operation of peeling off the resist film. The resist layer can be peeled off by dissolving the organic polymer material of the first layer. This organic polymer layer is a freely selected photoresist and not modified (cured or the like) at all by the above-described photoetching operation, therefore, a known organic solvent of the photoresist itself may be used. Also, the resist film may be peeled off by the plasma etching or the like without using a solvent.

The present invention is described in greater detail below by referring to the Synthesis Examples, Examples and Comparative Examples, however, the present invention should not be construed as being limited to the Examples.

SYNTHESIS EXAMPLE 1

Synthesis of Polysiloxane (C1–14)

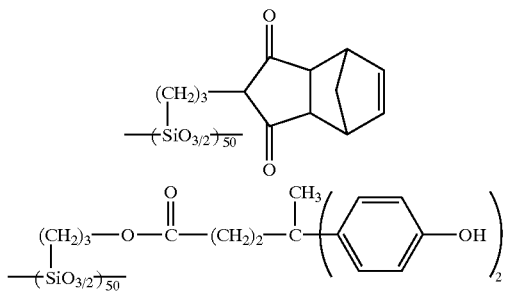

22.1 g of 3-aminopropyltrimethoxysilane was added to 200 ml of dried N,N-dimethylacetamide and thereto, 16.4 g of norbornenedicarboxylic acid anhydride was added. The resulting mixture was reacted at 140° C. for 15 hours in a dry nitrogen atmosphere and then, the reaction solution was returned to room temperature (this is referred to as "reaction intermediate solution A").

Separately, 20 g of 3-chloropropyltrimethoxysilane was added to 200 ml of dried N,N-dimethylacetamide and thereto, 28.7 g of diphenolic acid, 3.0 g of potassium iodide and 16.0 g of DBU (1,8-diazabicyclo[5.4.0]-7-undecene) were added. The resulting mixture was reacted at 70 to 90° C. for 5 hours in a dry nitrogen atmosphere (this is referred to as "reaction intermediate solution B").

The solution B was returned to room temperature and after adding thereto the solution A, 2 g of dimethylaminopyridine and 15 g of distilled water were added and reacted at 50° C. for 3 hours and then at 130 to 140° C. for 12 hours. The reaction solution was neutralized with diluted hydrochloric acid and poured into 3 L of distilled water while stirring to obtain a powdered white polymer. This polymer was dissolved in 200 ml of acetone, distilled water was added thereto while stirring to remove by fractionation the oligomer component of the polymer, and the lower layer was reprecipitated in 2 L of distilled water to obtain a white polymer. This polymer was measured on the average molecular weight by GPC (polystyrene standard) and found to have a weight-average molecular weight of 8,300. The content of the components having a molecular weight of 1,000 or less was 8% in terms of the GPC area ratio.

EXAMPLE 1

1.6 g of polysiloxane (C1-14) as the alkali-soluble siloxane (component (a)), 0.12 g of triphenylsulfonium-2,4,6-triisopropylphenyl sulfonate as the acid-generating compound (component (b)), and 0.012 g of triphenylimidazole and 0.4 g of Compound (60) (where R is —$CH_2COOC(CH_3)_3$) as the component (c) were dissolved in 19.2 g of propylene glycol monomethyl ether acetate and the resulting mixture was precision-filtered through a 0.1-$\mu$m membrane filter.

FHi-028D resist (resist for i-line, produced by Fuji Film Olin) was coated on a silicon wafer using a coater CDS-650 manufactured by Canon and baked at 90° C. for 90 seconds to form a uniform film having a thickness of 0.83 $\mu$m. This was further heated at 200° C. for 3 minutes and then the film thickness was reduced to 0.71 $\mu$m. On this film, the silicon-containing resist prepared above was coated and baked at 90° C. for 90 seconds to provide a layer having a thickness of 0.20 $\mu$m.

The thus-obtained wafer was exposed by KrF excimer laser stepper FPA-3000EX3 manufactured by Canon in which a resolution mask was loaded, while varying the exposure amount and the focus. Thereafter, the wafer was heated at 120° C. for 90 seconds in a clean room, developed with tetramethylammonium hydroxide developer (2.38%) for 60 seconds, rinsed with distilled water and dried to obtain a pattern. This pattern was observed by a scanning-type electron microscope, as a result, a line/space of 0.16 $\mu$m was resolved with a sensitivity of 30 mJ/cm$^2$. The rectangularity of the section was rated A.

The rectangularity of the section was compared according to the three-stage evaluation as follows. The angle of the substrate and resist pattern to the side wall was measured and those having an angle of 80° to 90° were rated A, those of 700 to less than 80° were rated B, and those of less than 70° were rated C. The wafer was further etched with oxygen as the etching gas using a parallel plate-type reactive ion etching apparatus manufactured by Albak for 15 minutes under the conditions that the pressure was 20 mTorr and the applied power was 100 mW/cm$^2$, and then observed through a scanning-type electron microscope. As a result, the dimensional shift of the 0.16-$\mu$m pattern was 0.009 $\mu$m.

EXAMPLES 2 TO 17

Positive photoresists were prepared thoroughly in the same manner as in Example 1 except for using the polysiloxane (component (a)), the component (b) and the component (c) shown in Table 1 in place of the alkali-soluble siloxane (component (a)), the component (b) and the component (c) of Example 1. These were exposed, developed and etched in the same manner as in Example 1. The resist capabilities obtained are shown together in Table 2.

COMPARATIVE EXAMPLE 1

A resist shown in Table 3 was prepared using polysiloxane (D-1) shown below in place of the polysiloxane of Example 1. This was coated, exposed, developed and etched thoroughly in the same manner as in Example 1 and observed through a scanning-type electron microscope in the same manner as in Example 1. The results are shown in Table 3.

COMPARATIVE EXAMPLE 2

A resist shown in Table 3 was prepared using polysiloxane (D-2) shown below in place of the polysiloxane of Example 1. This was coated, exposed, developed and etched thoroughly in the same manner as in Example 1 and observed through a scanning-type electron microscope in the same manner as in Example 1. The results are shown in Table 3.

Compounds used in Comparative Examples

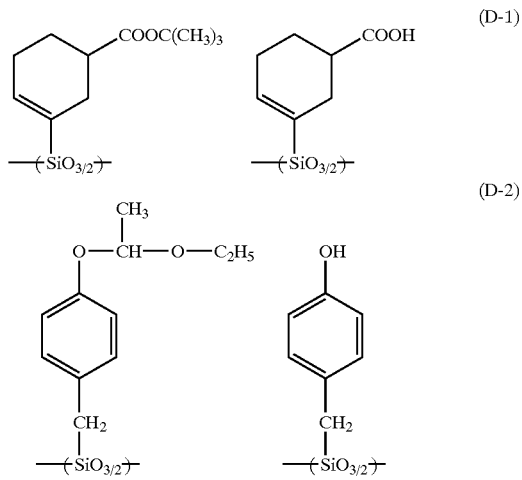

TABLE 1

| Example | Siloxane Polymer (Component a) | | Component c | Amount Added of Component c (based on Component a, wt %) | Acid-Generating Agent (Component b) |
|---|---|---|---|---|---|
| 1 | C1-14 *1 siloxane unit copolymerization ratio Mw = 7200 | 30/70 | (60) R = —$CH_2COOC(CH_3)_3$ | 35 | triphenylsulfonium-2,4,6-triisopropylphenyl sulfonate |
| 2 | C1-16 siloxane unit copolymerization ratio Mw = 8300 | 25/60/15 | (60) R = —$CH_2COOC(CH_3)_3$ | 40 | triphenylsulfonium-2,4,6-triisopropylphenyl sulfonate |
| 3 | C1-8 siloxane unit copolymerization ratio Mw = 12200 | 50/50 | (60) R = —$CH_2COOC(CH_3)_3$ | 25 | triphenylsulfonium-2,4,6-triisopropylphenyl sulfonate |

TABLE 1-continued

| Example | Siloxane Polymer (Component a) | | Component c | Amount Added of Component c (based on Component a, wt %) | Acid-Generating Agent (Component b) |
|---|---|---|---|---|---|
| 4 | C1-15 siloxane unit copolymerization ratio | 20/60/20 | (60) R = —CH$_2$COOC(CH$_3$)$_3$ | 35 | triphenylsulfonium-2,4,6-triisopropylphenyl sulfonate |
| | Mw = 6900 | | | | |
| 5 | C1-11 siloxane unit copolymerization ratio | 30/50/20 | (60) R = —CH$_2$COOC(CH$_3$)$_3$ | 40 | triphenylsulfonium-2,4,6-triisopropylphenyl sulfonate |
| | Mw = 8200 | | | | |
| 6 | C1-15 siloxane unit copolymerization ratio | 40/50/10 | (18) R = —CH$_2$COOC(CH$_3$)$_3$ | 40 | triphenylsulfoniumpenta-fluorophenyl sulfonate |
| | Mw = 7200 | | | | |
| 7 | C1-14 siloxane unit copolymerization ratio | 40/60 | (18) R = —CH$_2$COOC(CH$_3$)$_3$ | 35 | triphenylsulfoniumpenta-fluorophenyl sulfonate |
| | Mw = 11900 | | | | |
| 8 | C1-16 siloxane unit copolymerization ratio | 40/40/20 | (18) R = —CH$_2$COOC(CH$_3$)$_3$ | 25 | triphenylsulfoniumpenta-fluorophenyl sulfonate |
| | Mw = 6800 | | | | |
| 9 | C1-17 siloxane unit copolymerization ratio | 10/60/30 | (70) | 30 | triphenylsulfonium-2,4,6-triisopropylphenyl sulfonate |
| | Mw = 9200 | | | | |
| 10 | C1-5 siloxane unit copolymerization ratio | 30/70 | (70) | 30 | triphenylsulfonium-2,4,6-triisopropylphenyl sulfonate |
| | Mw = 7300 | | | | |
| 11 | C1-2 siloxane unit copolymerization ratio | 10/70/20 | (70) | 30 | triphenylsulfonium-2,4,6-triisopropylphenyl sulfonate |
| | Mw = 18100 | | | | |
| 12 | C1-11 siloxane unit copolymerization ratio | 20/65/15 | (73) | 35 | triphenylsulfonium-2,4,6-triisopropylphenyl sulfonate |
| | Mw = 6500 | | | | |
| 13 | C1-15 siloxane unit copolymerization ratio | 30/50/20 | (73) | 35 | triphenylsulfonium-2,4,6-triisopropylphenyl sulfonate |
| | Mw = 7100 | | | | |
| 14 | C1-28 siloxane unit copolymerization ratio | 20/10/60/10 | (73) | 35 | triphenylsulfonium-2,4,6-triisopropylphenyl sulfonate |
| | Mw = 8300 | | | | |
| 15 | C1-9 siloxane unit copolymerization ratio | 70/30 | (70) | 35 | triphenylsulfonium-2,4,6-triisopropylphenyl sulfonate |
| | Mw = 8900 | | | | |
| 16 | C1-15 siloxane unit copolymerization ratio | 50/30/20 | (70) | 35 | triphenylsulfonium-2,4,6-triisopropylphenyl sulfonate |
| | Mw = 12300 | | | | |
| 17 | C1-15 siloxane unit copolymerization ratio | 40/10/50 | (73) | 35 | triphenylsulfonium-2,4,6-triisopropylphenyl sulfonate |
| | Mw = 8600 | | | | |

*1: copolymerization molar ratio before the protection with an acid-decomposable group.

TABLE 2

| Example | Resolution, μm | Sensitivity, mJ/cm² | Rectangularity, observed by SEM | Dimensional Shift after Etching, μm |
|---|---|---|---|---|
| 1 | 0.19 | 25 | B | 0.009 |
| 2 | 0.18 | 19 | B | 0.008 |
| 3 | 0.17 | 24 | A | 0.010 |
| 4 | 0.17 | 24 | A | 0.011 |
| 5 | 0.18 | 28 | B | 0.009 |
| 6 | 0.16 | 23 | A | 0.009 |
| 7 | 0.18 | 25 | B | 0.008 |
| 8 | 0.17 | 26 | B | 0.008 |
| 9 | 0.17 | 27 | A | 0.007 |
| 10 | 0.16 | 23 | A | 0.008 |
| 11 | 0.18 | 25 | A | 0.008 |
| 12 | 0.16 | 25 | B | 0.009 |
| 13 | 0.17 | 27 | B | 0.009 |
| 14 | 0.17 | 22 | A | 0.008 |
| 15 | 0.17 | 26 | A | 0.009 |
| 16 | 0.17 | 26 | B | 0.010 |
| 17 | 0.17 | 29 | B | 0.008 |

TABLE 3

| Comparative Example | Resolution, μm | Sensitivity, mJ/cm² | Rectangularity, observed by SEM | Dimensional Shift after Etching, μm |
|---|---|---|---|---|
| 1 | 0.21 | 38 | B | 0.016 |
| 2 | 0.19 | 32 | C | 0.012 |

From the results shown in Tables 1 to 3, the wings are apparently seen.

The positive photoresist composition using the polysiloxane of the present invention gives a resist having good balance in the properties with high resolution, good rectangularity and small dimensional shift after the etching.

On the other hand, in Comparative Examples 1 and 2 where the polysiloxane of the present invention is not used, the balance in the above-described properties is bad.

SYNTHESIS EXAMPLE 2

Synthesis of Polysiloxane (C2-57')

22.1 g of 3-aminopropyltrimethoxysilane was added to 200 ml of dried N,N-dimethylacetamide and thereto, 16.4 g of norbornenedicarboxylic acid anhydride was added. The resulting mixture was reacted at 140° C. for 15 hours in a dry nitrogen atmosphere and then, the reaction solution was returned to room temperature (this is referred to as "reaction intermediate solution A").

Separately, 20 g of 3-chloropropyltrimethoxysilane was added to 200 ml of dried N,N-dimethylacetamide and thereto, 28.7 g of diphenolic acid, 3.0 g of potassium iodide and 16.0 g of DBU (1,8-diazabicyclo[5.4.0]-7-undecene) were added. The resulting mixture was reacted at 70 to 90° C. for 5 hours in a dry nitrogen atmosphere (this is referred to as "reaction intermediate solution B").

The solution B was returned to room temperature and after adding thereto the solution A, 2 g of dimethylaminopyridine and 15 g of distilled water were added and reacted at 50° C. for 3 hours and then at 130 to 140° C. for 12 hours. The reaction solution was neutralized with diluted hydrochloric acid and poured into 3 L of distilled water while stirring to obtain a powdered white polymer. This polymer was dissolved in 200 ml of acetone, distilled water was added thereto while stirring to remove by fractionation the oligomer component of the polymer, and the lower layer was reprecipitated in 2 L of distilled water to obtain a white polymer (C2-57'). This polymer was measured on the average molecular weight by GPC (polystyrene standard) and found to have a weight-average molecular weight of 8,300. The content of the components having a molecular weight of 1,000 or less was 8% in terms of the GPC area ratio.

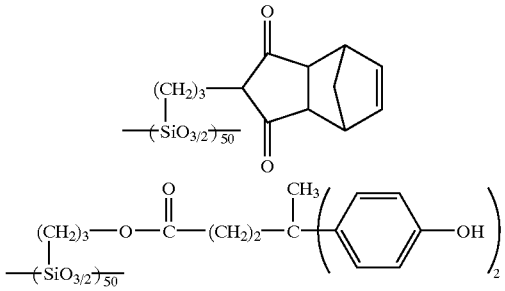

SYNTHESIS EXAMPLE 3

Synthesis of Polysiloxane (C2-57)

20 g of vacuum dried polysiloxane (C2-57') was dissolved in 100 ml of THF and thereto 4.3 g of ethyl vinyl ether and 20 mg of p-toluenesulfonic acid monohydrate were added, followed by reaction at room temperature for 10 hours.

The reaction was quenched by adding triethylamine and the reaction solution was added to 2 L of distilled water to precipitate a polymer. The polymer obtained was vacuum dried at room temperature to obtain 19 g of the objective polysiloxane (C2-57).

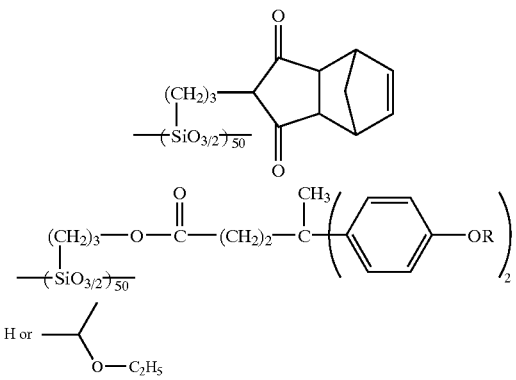

SYNTHESIS EXAMPLE 4

Synthesis of Polysiloxane (C2-60)

Polysiloxane (C2-57') obtained in Synthesis Example 2 was vacuum dried and 20 g thereof was dissolved in 100 ml of THF. After adding 2.8 g of di-tert-butyl dicarbonate thereto, 1.3 g of triethylamine was added dropwise over 1 hour and reacted at room temperature for 10 hours. The reaction solution was poured into 2 L of distilled water while stirring to precipitate a polymer and the polymer was dried under reduced pressure at room temperature to obtain 18.2 g of the objective polysiloxane (C2-60).

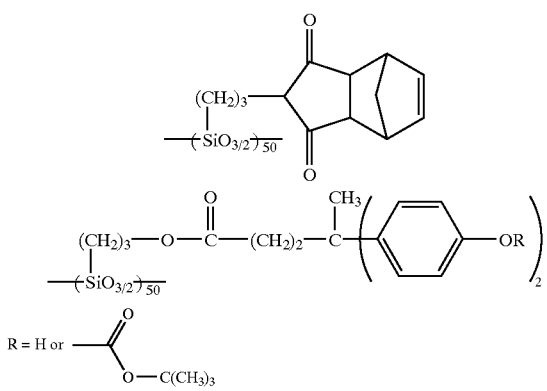

EXAMPLE 18

1.6 g of polysiloxane (C2-57) as the acid-decomposable siloxane (component (a)), 0.12 g of triphenylsulfonium-2,4,6-triisopropylphenyl sulfonate as the acid-generating compound (component (b)), and 0.012 g of triphenylimidazole and 0.4 g of Compound (60) (where R is —CH$_2$COOC(CH$_3$)$_3$) as the component (c) were dissolved in 19.2 g of propylene glycol monomethyl ether acetate and the resulting mixture was precision-filtered through a 1.0-μm membrane filter.

FHi-028D resist (resist for i-line, produced by Fuji Film Olin) was coated on a silicon wafer using a coater CDS-650 manufactured by Canon and baked at 90° C. for 90 seconds to form a uniform film having a thickness of 0.83 μm. This was further heated at 200° C. for 3 minutes and then the film thickness was reduced to 0.71 μm. On this film, the silicon-containing resist prepared above was coated and baked at 90° C. for 90 seconds to provide a layer having a thickness of 0.20 μm.

The thus-obtained wafer was exposed by KrF excimer laser stepper FPA-3000EX3 manufactured by Canon in which a resolution mask was loaded, while varying the exposure amount and the focus. Thereafter, the wafer was heated at 120° C. for 90 seconds in a clean. room, developed with tetramethylammonium hydroxide developer (2.38%) for 60 seconds, rinsed with distilled water and dried to obtain a pattern. This pattern was observed by a scanning-type electron microscope, as a result, a line/space of 0.16 μm was resolved with a sensitivity of 30 mJ/cm$^2$. The rectangularity of the section was rated A.

The rectangularity of the section was compared according to the three-stage evaluation as follows. The angle of the substrate and resist pattern to the side wall was measured and those having an angle of 80° to 90° were rated A, those of 70° to less than 80° were rated B, and those of less than 70° were rated C. The wafer was further etched with oxygen as the etching gas using a parallel plate-type reactive ion etching apparatus manufactured by Albak for 15 minutes under the conditions that the pressure was 20 mTorr and the applied power was 100 mW/cm$^2$, and then observed through a scanning-type electron microscope. As a result, the dimensional shift of the 0.16-μm pattern was 0.009 μm.

EXAMPLES 19 TO 33

Positive photoresists were prepared thoroughly in the same manner as in Example 18 except for using the polysiloxane (component (a)), the component (b) and the component (c) shown in Table 4 in place of the acid-decomposable siloxane (component (a)), the component (b) and the component (c) of Example 1 These were exposed, developed and etched in the same manner as in Example 18. The resist capabilities obtained are shown together in Table 5.

EXAMPLE 34

A positive photoresist was prepared thoroughly in the same manner as in Example 18 except for using 1.9 g of polysiloxane (C2-57) as the acid-decomposable polysiloxane (component (a)), 0.12 g of triphenylsulfonium-2,4,6-triisopropylphenyl sulfonate as the acid-generating compound (component (b)) and 0.012 g of triphenylimidazole and 0.143 g of Compound (60) (where R is —CH$_2$COOC(CH$_3$)$_3$) as the component (c). This resist coated, exposed, developed and etched in the same manner as in Example 18 and observed by a scanning-type electron microscope. The resist prepared is shown in Table 6 and the evaluation results are shown in Table 7.

EXAMPLES 35 TO 49

Positive photoresists were prepared thoroughly in the same manner as in Example 34 except for using the siloxane, the component (b) and the component (c) shown in Table 6 in place of the acid-decomposable siloxane, the component (b) and the component (c) of Example 34. These were exposed, developed and etched in the same manner as in Example 34. The resist capabilities obtained are shown together in Table 7.

COMPARATIVE EXAMPLE 3

A resist was prepared, coated, exposed, developed and etched thoroughly in the same manner as in Example 18 except for using polysiloxane (D-1) shown below in place of the polysiloxane of Example 18 and observed through a scanning-type electron microscope in the same manner as in Example 18. The results are shown in Table 8.

COMPARATIVE EXAMPLE 4

A resist was prepared, coated, exposed, developed and etched thoroughly in the same manner as in Example 18 except for using polysiloxane (D-2) shown below in place of the polysiloxane of Example 18 and observed through a scanning-type electron microscope in the same manner as in Example 18. The results are shown in Table 8.

Compounds used in Comparative Examples

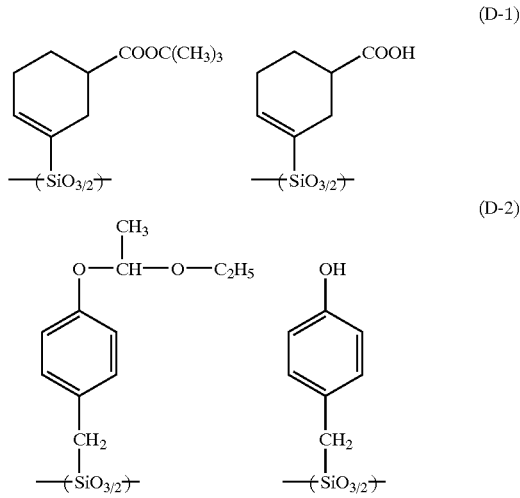

TABLE 4

| Example | Siloxane Polymer (Component a) | | Acid-Generating Agent (Component b) |
|---|---|---|---|
| 18 | C2-57<br>*1 siloxane unit copolymerization ratio<br>protection ratio by acid-decomposable group<br>Mw = 9900 | 50/50<br>48% | triphenylsulfonium-2,4,6-triisopropylphenyl sulfonate |
| 19 | C2-15<br>siloxane unit copolymerization ratio<br>protection ratio by acid-decomposable group<br>Mw = 13200 | 40/60<br>63% | triphenylsulfonium-2,4,6-triisopropylphenyl sulfonate |
| 20 | C2-21<br>siloxane unit copolymerization ratio<br>protection ratio by acid-decomposable group<br>Mw = 6300 | 30/70<br>79% | triphenylsulfonium-2,4,6-triisopropylphenyl sulfonate |
| 21 | C2-60<br>siloxane unit copolymerization ratio<br>protection ratio by acid-decomposable group<br>Mw = 9200 | 50/50<br>40% | triphenylsulfonium-2,4,6-triisopropylphenyl sulfonate |
| 22 | C2-24<br>siloxane unit copolymerization ratio<br>protection ratio by acid-decomposable group<br>Mw = 12200 | 25/75<br>55% | triphenylsulfonium-2,4,6-triisopropylphenyl sulfonate |
| 23 | C2-58<br>siloxane unit copolymerization ratio<br>protection ratio by acid-decomposable group<br>Mw = 8600 | 40/60<br>61% | triphenylsulfoniumpentafluorophenyl sulfonate |
| 24 | C2-59<br>siloxane unit copolymerization ratio<br>protection ratio by acid-decomposable group<br>Mw = 7300 | 50/50<br>72% | triphenylsulfonium-p-dodecylphenyl sulfonate |
| 25 | C2-62<br>siloxane unit copolymerization ratio<br>protection ratio by acid-decomposable group<br>Mw = 5200 | 50/20/30<br>85% | bis(p-t-amylphenyl)iodonium-p-toluene sulfonate |
| 26 | C2-81<br>siloxane unit copolyaerization ratio<br>protection ratio by acid-decomposable group<br>Mw = 6900 | 60/20/20<br>63% | diphenyliodoniumtrifluoromethane sulfonate |
| 27 | C2-67<br>siloxane unit copolymerization ratio<br>protection ratio by acid-decomposable group<br>Mw = 4600 | 60/40<br>41% | triphenylsulfoniumnanofluorobutane sulfonate |
| 28 | C2-72<br>siloxane unit copolymerization ratio<br>protection ratio by acid-decomposable group<br>Mw = 36300 | 50/25/25<br>35% | triphenylsulfonium-2,4,6-triisopropylphenyl sulfonate |
| 29 | C2-74<br>siloxane unit copolymerization ratio<br>protection ratio by acid-decomposable group<br>Mw = 7200 | 70/10/20<br>72% | bis(p-t-amylphenyl)iodoniumpentafluoro-phenyl sulfonate |
| 30 | C2-75<br>siloxane unit copolymerization ratio<br>protection ratio by acid-decomposable group<br>Mw = 3900 | 20/70/10<br>65% | triphenylsulfonium-2,4,6-triisopropylphenyl sulfonate |
| 31 | C2-70<br>siloxane unit copolymerization ratio<br>protection ratio by acid-decomposable group<br>Mw = 5800 | 70/30<br>60% | diphenyliodoniumtrifluoromethane sulfonate |
| 32 | C2-78<br>siloxane unit copolymerization ratio<br>protection ratio by acid-decomposable group<br>Mw = 6300 | 40/40/20<br>80% | diphenyliodoniumtrifluoromethane sulfonate |
| 33 | C2-85<br>siloxane unit copolymerization ratio<br>protection ratio by acid-decomposable group<br>Mw = 7200 | 40/20/40<br>85% | diphenyliodoniumtrifluoromethane sulfonate |

*1: copolymerization molar ratio before the protection with an acid-decomposable group.

TABLE 5

| Example | Resolution, μm | Sensitivity, mJ/cm² | Rectangularity, observed by SEM | Dimensional Shift after Etching, μm |
|---|---|---|---|---|
| 18 | 0.16 | 40 | A | 0.006 |
| 19 | 0.16 | 44 | A | 0.007 |
| 20 | 0.15 | 29 | A | 0.005 |
| 21 | 0.15 | 41 | B | 0.005 |
| 22 | 0.15 | 27 | A | 0.006 |
| 23 | 0.16 | 34 | A | 0.005 |
| 24 | 0.16 | 40 | A | 0.005 |
| 25 | 0.15 | 44 | B | 0.008 |
| 26 | 0.17 | 38 | A | 0.006 |
| 27 | 0.15 | 33 | A | 0.006 |
| 28 | 0.15 | 41 | A | 0.006 |
| 29 | 0.16 | 35 | A | 0.007 |
| 30 | 0.16 | 32 | B | 0.006 |
| 31 | 0.16 | 28 | A | 0.007 |
| 32 | 0.16 | 36 | B | 0.007 |
| 33 | 0.16 | 36 | A | 0.007 |

TABLE 6

| Example | Siloxane Polymer (Component a) | | Component c | Amount Added of Component c (based on Component a, wt %) | Acid-Generating Agent (Component b) |
|---|---|---|---|---|---|
| 34 | C2-57 *1 siloxane unit copolymerization ratio | 40/60 | (60) R = —CH$_2$COOC(CH$_3$)$_3$ | 10 | triphenylsulfonium-2,4,6-triisopropylphenyl sulfonate |
| | protection ratio by acid-decomposable group | 72% | | | |
| | Mw = 4800 | | | | |
| 35 | C2-60 siloxane unit copolymerization ratio | 60/40 | (60) R = —CH$_2$COOC(CH$_3$)$_3$ | 10 | triphenylsulfonium-2,4,6-triisopropylphenyl sulfonate |
| | protection ratio by acid-decomposable group | 61% | | | |
| | Mw = 9200 | | | | |
| 36 | C2-15 siloxane unit copolymerization ratio | 50/50 | (60) R = —CH$_2$COOC(CH$_3$)$_3$ | 10 | triphenylsulfonium-2,4,6-triisopropylphenyl sulfonate |
| | protection ratio by acid-decomposable group | 39% | | | |
| | Mw = 17300 | | | | |
| 37 | C2-21 siloxane unit copolymerization ratio | 40/60 | (60) R = —CH$_2$COOC(CH$_3$)$_3$ | 7.5 | triphenylsulfonium-2,4,6-triisopropylphenyl sulfonate |
| | protection ratio by acid-decomposable group | 52% | | | |
| | Mw = 5800 | | | | |
| 38 | C2-60 siloxane unit copolymerization ratio | 35/65 | (60) R = —CH$_2$COOC(CH$_3$)$_3$ | 7.5 | diphenyliodoniumtri-fluoromethane sulfonate |
| | protection ratio by acid-decomposable group | 68% | | | |
| | Mw = 12200 | | | | |
| 39 | C2-24 siloxane unit copolymerization ratio | 40/60 | (60) R = —CH$_2$COOC(CH$_3$)$_3$ | 10 | diphenyliodoniumtri-fluoromethane sulfonate |
| | protection ratio by acid-decomposable group | 43% | | | |
| | Mw = 14200 | | | | |

TABLE 6-continued

| Example | Siloxane Polymer (Component a) | | Component c | Amount Added of Component c (based on Component a, wt %) | Acid-Generating Agent (Component b) |
|---|---|---|---|---|---|
| 40 | C2-58 | | (70) | 10 | triphenylsulfoniumpenta-fluorophenyl sulfonate |
| | siloxane unit copolymerization ratio | 20/80 | | | |
| | protection ratio by acid-decomposable group | 68% | | | |
| | Mw = 3900 | | | | |
| 41 | C2-62 | | (18) | 12.5 | triphenylsulfoniumpenta-fluorophenyl sulfonate |
| | siloxane unit copolymerization ratio | 60/20/20 | $R = -CH_2COOC(CH_3)_3$ | | |
| | protection ratio by acid-decomposable group | 54% | | | |
| | Mw = 5300 | | | | |
| 42 | C2-64 | | (18) | 10 | triphenylsulfonium-2,4,6-triisopropylphenyl sulfonate |
| | siloxane unit copolymerization ratio | 50/30/20 | $R = -CH_2COOC(CH_3)_3$ | | |
| | protection ratio by acid-decomposable group | 67% | | | |
| | Mw = 8300 | | | | |
| 43 | C2-72 | | (18) | 10 | triphenylsulfonium-2,4,6-triisopropylphenyl sulfonate |
| | siloxane unit copolymerization ratio | 60/20/20 | $R = -CH_2COOC(CH_3)_3$ | | |
| | protection ratio by acid-decompsable group | 48% | | | |
| | Mw = 11000 | | | | |
| 44 | C2-57 | | (70) | 20 | triphenylsulfonium-2,4,6-triisopropylphenyl sulfonate |
| | siloxane unit copolymerization ratio | 50/50 | | | |
| | protection ratio by acid-decomposable group | 71% | | | |
| | Mw = 13500 | | | | |
| 45 | C2-60 | | (70) | 15 | triphenylsulfonium-2,4,6-triisopropylphenyl sulfonate |
| | siloxane unit copolymerization ratio | 50/50 | | | |
| | protection ratio by acid-decomposable group | 81% | | | |
| | Mw = 23000 | | | | |
| 46 | C2-15 | | (73) | 15 | triphenylsulfonium-2,4,6-triisopropylphenyl sulfonate |
| | siloxane unit copolymerization ratio | 35/65 | | | |
| | protection ratio by acid-decomposable group | 65% | | | |
| | Mw = 8600 | | | | |
| 47 | C2-68 | | (18) | 8 | bis(p-t-amylphenyl)-iodonium-p-toluene sulfonate |
| | siloxane unit copolymerization ratio | 80/20 | $R = -CH_2COOC(CH_3)_3$ | | |
| | protection ratio by acid-decomposable group | 62% | | | |
| | Mw = 7300 | | | | |
| 48 | C2-78 | | (70) | 20 | triphenylsulfoniumpenta-fluorophenyl sulfonate |
| | siloxane unit copolymerization ratio | 50/30/20 | | | |
| | protection ratio by acid-decomposable group | 80% | | | |
| | Mw = 7200 | | | | |

TABLE 6-continued

| Example | Siloxane Polymer (Component a) | | Component c | Amount Added of Component c (based on Component a, wt %) | Acid-Generating Agent (Component b) |
|---|---|---|---|---|---|
| 49 | C2-85 | | (70) | 20 | triphenylsulfoniumpentafluorophenyl sulfonate |
| | siloxane unit copolymerization ratio | 40/40/20 | | | |
| | protection ratio by acid-decomposable group | 80% | | | |
| | Mw = 7200 | | | | |

*1: copolymerization molar ratio before the protection with an acid-decomposable group.

TABLE 7

| Example | Resolution, μm | Sensitivity, mJ/cm² | Rectangularity, observed by SEM | Dimensional Shift after Etching, μm |
|---|---|---|---|---|
| 34 | 0.15 | 35 | A | 0.007 |
| 35 | 0.16 | 42 | B | 0.005 |
| 36 | 0.16 | 40 | A | 0.007 |
| 37 | 0.16 | 36 | A | 0.008 |
| 38 | 0.16 | 32 | B | 0.006 |
| 39 | 0.17 | 33 | A | 0.007 |
| 40 | 0.16 | 33 | A | 0.008 |
| 41 | 0.17 | 36 | A | 0.008 |
| 42 | 0.15 | 40 | B | 0.007 |
| 43 | 0.16 | 38 | B | 0.008 |
| 44 | 0.16 | 35 | A | 0.010 |
| 45 | 0.15 | 33 | A | 0.009 |
| 46 | 0.16 | 40 | B | 0.009 |
| 47 | 0.16 | 43 | A | 0.006 |
| 48 | 0.16 | 40 | B | 0.008 |
| 49 | 0.16 | 40 | B | 0.009 |

TABLE 8

| Comparative Example | Resolution, μm | Sensitivity, mJ/cm² | Rectangularity, observed by SEM | Dimensional Shift after Etching, μm |
|---|---|---|---|---|
| 3 | 0.21 | 38 | B | 0.016 |
| 4 | 0.19 | 32 | C | 0.012 |

From the results shown in Tables 4 to 8, the followings are apparently seen.

The positive photoresist composition using the polysiloxane of the present invention gives a resist having good balance in the properties with high resolution, good rectangularity and small dimensional shift after the etching.

On the other hand, in Comparative Examples 3 and 4 where the polysiloxane of the present invention is not used, the balance in the above-described properties is bad.

SYNTHESIS EXAMPLE 5

Synthesis of Polysiloxane (C3-5)

22.1 g of 3-aminopropyltrimethoxysilane was added to 200 ml of dried N,N-dimethylacetamide and thereto, 16.1 g of norbornenedicarboxylic acid anhydride was added. The resulting mixture was reacted at 100° C. for 5 hours in a dry nitrogen atmosphere and then, the reaction solution was returned to room temperature (this is referred to as "reaction intermediate solution A"). To the solution A, 20 g phenyltrimethoxysilane, 2 g of dimethylaminopyridine and 15 g of distilled water were added and reacted at 50° C. for 3 hours and at 130 to 140° C. for 12 hours. The reaction solution was neutralized with diluted hydrochloric acid and poured into 3 L of distilled water while stirring to obtain a powdered white polymer. This polymer was measured on the average molecular weight by GPC (polystyrene standard) and found to have a weight-average molecular weight of 3,900. The content of the components having a molecular weight of 1,000 or less was 14% in terms-of the GPC area ratio

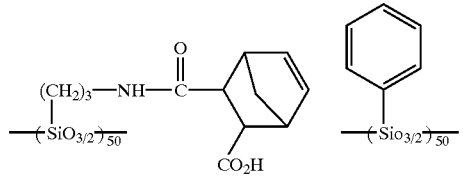

SYNTHESIS EXAMPLE 6

Synthesis of Polysiloxane (C3-8)

20 g of 3-chloropropyltrimethoxysilane was added to 200 ml of dried N,N-dimethylacetamide and thereto, 28.7 g of diphenolic acid, 3.0 g of potassium iodide and 16.0 g of DBU (1,8-diazabicyclo[5.4.0]-7-undecene) were added. The resulting mixture was reacted at 70 to 90° C. for 5 hours in a dry nitrogen atmosphere (this is referred to as "reaction intermediate solution B"). The reaction solution was returned to room temperature and added to the Solution A described in Synthesis Example 5 and thereto, 2 g of dimethylaminopyridine and 15 g of distilled water were added and reacted at 50° C. for 3 hours and then at 130 to 140° C. for 12 hours. The reaction solution was neutralized with diluted hydrochloric acid and poured into 3 L of distilled water while stirring to obtain a powdered white polymer. This polymer was measured on the average molecular weight by GPC (polystyrene standard) and found to have a weight-average molecular weight of 3,300. The content of the components having a molecular weight of 1,000 or less was 8% in terms of the GPC area ratio.

SYNTHESIS EXAMPLE 7

Synthesis of Polysiloxane (C3-12)

To the intermediate solution A of Synthesis Example 5, the intermediate B of Synthesis Example 2, 20 g of phenyltrimethoxysilane, 2 g of dimethylaminopyridine and 23 g of distilled water were added and reacted at 50° C. for 3 hours and then at 130 to 140° C. for 12 hours. The reaction solution was neutralized with diluted hydrochloric acid and poured into 3 L of distilled water while stirring to recover a powdered white polymer.

This polymer was dissolved in 200 ml of acetone, distilled water was added thereto while stirring to remove by fractionation the oligomer component of the polymer, and the lower layer was reprecipitated in 2 L of distilled water to obtain a white polymer. This polymer was measured on the average molecular weight by GPC (polystyrene standard) and found to have a weight-average molecular weight of 4,500. The content of the components having a molecular weight of 1,000 or less was 8% in terms of the GPC area ratio.

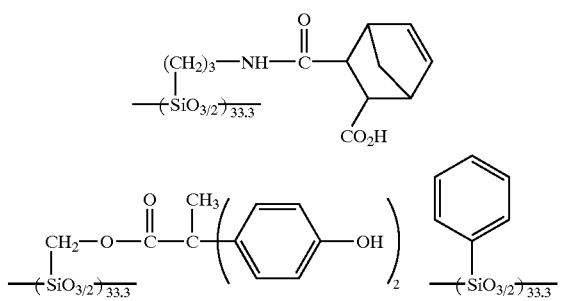

EXAMPLE 50

1.6 g of polysiloxane (C3-8) as the alkali-soluble siloxane (component (a)), 0.12 g of triphenylsulfonium-2,4,6-triisopropylphenyl sulfonate as the acid-generating compound (component (b)), and 0.012 g of triphenylimidazole and 0.48 g of Compound (60) (where R is —$CH_2COOC(CH_3)_3$) as the component (c) were dissolved in 19.2 g of propylene glycol monomethyl ether acetate and the resulting mixture was precision-filtered through a 0.1-$\mu$m membrane filter.

FHi-028D resist (resist for i-line, produced by Fuji Film Olin) was coated on a silicon wafer using a coater CDS-650 manufactured by Canon and baked at 90° C. for 90 seconds to form a uniform film having a thickness of 0.83 $\mu$m. This was further heated at 200° C. for 3 minutes and then the film thickness was reduced to 0.71 $\mu$m. On this film, the silicon-containing resist prepared above was coated and baked at 90° C. for 90 seconds to provide a layer having a thickness of 0.20 $\mu$m.

The thus-obtained wafer was exposed by KrF excimer laser stepper FPA-3000EX3 manufactured by Canon in which a resolution mask was loaded, while varying the exposure amount and the focus. Thereafter, the wafer was heated at 120° C. for 90 seconds in a clean room, developed with tetramethylammonium hydroxide developer (2.38%) for 60 seconds, rinsed with distilled water and dried to obtain a pattern. This pattern was observed. by a scanning-type electron microscope, as a result, a line/space of 0.15 $\mu$m was resolved with a sensitivity of 37 mJ/cm$^2$. The rectangularity of the section was rated A.

The rectangularity of the section was compared according to the three-stage evaluation as follows. The angle of the substrate and resist pattern to the side wall was measured and those having an angle of 80° to 90° were rated A, those of 70° to less than 80° were rated B, and those of less than 70° were rated C. The wafer was further etched with oxygen as the etching gas using a parallel plate-type reactive ion etching apparatus manufactured by Albak for 15 minutes under the conditions that the pressure was 20 mTorr and the applied power was 100 mW/cm$^2$, and then observed through a scanning-type electron microscope. As a result, the dimensional shift of the 0.16-$\mu$m pattern was 0.007 $\mu$m.

EXAMPLES 51 TO 63

Positive photoresists were prepared thoroughly in the same manner as in Example 50 except for using the polysiloxane (component (a)), the component (b) and the component (c) shown in Table 9 in place of the alkali-soluble siloxane (component (a)), the component (b) and the component (c) of Example 50. These were exposed, developed and etched in the same manner as in Example 1. The resist capabilities obtained are shown together in Table 10.

COMPARATIVE EXAMPLE 5

A resist shown in Table 10 was prepared using polysiloxane (D-1) shown below in place of the polysiloxane of Example 50. This was coated, exposed, developed and etched thoroughly in the same manner as in Example 50 and observed through a scanning-type electron microscope in the same manner as in Example 50. The results are shown in Table 10.

COMPARATIVE EXAMPLE 6

A resist shown in Table 10 was prepared using polysiloxane (D-2) shown below in place of the polysiloxane of Example 50. This was coated, exposed, developed and etched thoroughly in the same manner as in Example 50 and observed through a scanning-type electron microscope in the same manner as in Example 50. The results are shown in Table 10.

Compounds used in Comparative Examples

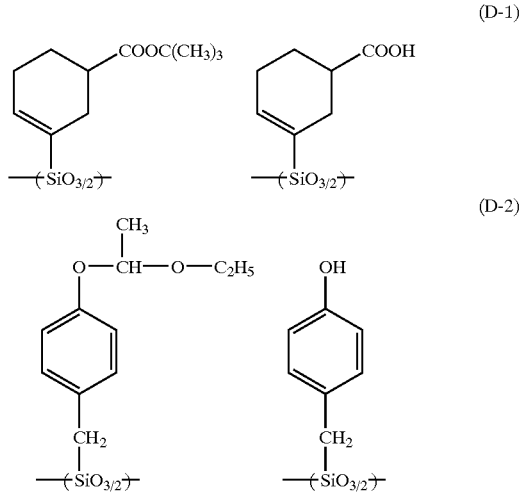

TABLE 9

| Example | Siloxane Polymer (Component a) | | Component c | | Amount Added of Component c (based on Component a, wt %) | Acid-Generating Agent (Component b) |
|---|---|---|---|---|---|---|
| 50 | C3-8 *1 siloxane unit copolymerization ratio<br>Mw = 3100 | 50/50 | (18) | R = —CH$_2$COOC(CH$_3$)$_3$ | 30 | triphenylsulfonium-2,4,6-triisopropylphenyl sulfonate |
| 51 | C3-8 siloxane unit copolymerization ratio<br>Mw = 7200 | 50/50 | (60) | R = —CH$_2$COOC(CH$_3$)$_3$ | 25 | triphenylsulfonium-2,4,6-triisopropylphenyl sulfonate |
| 52 | C3-5 siloxane unit copolymerization ratio<br>Mw = 5400 | 40/60 | (60) | R = —CH$_2$COOC(CH$_3$)$_3$ | 25 | triphenylsulfonium-2,4,6-triisopropylphenyl sulfonate |
| 53 | C3-5 siloxane unit copolymerization ratio<br>Mw = 6600 | 60/40 | (60) | R = —CH$_2$COOC(CH$_3$)$_3$ | 30 | triphenylsulfonium-2,4,6-triisopropylphenyl sulfonate |
| 54 | C3-12 siloxane unit copolymerization ratio<br>Mw = 7200 | 45/35/20 | (60) | R = —CH$_2$COOC(CH$_3$)$_3$ | 25 | triphenylsulfonium-2,4,6-triisopropylphenyl sulfonate |
| 55 | C3-12 siloxane unit copolymerization ratio<br>Mw = 7200 | 45/35/20 | (70) | | 25 | triphenylsulfoniumpentafluorophenyl sulfonate |
| 56 | C3-9 siloxane unit copolymerization ratio<br>Mw = 3900 | 60/40 | (18) | R = —CH$_2$COOC(CH$_3$)$_3$ | 30 | triphenylsulfonium-2,4,6-triisopropylphenyl sulfonate |
| 57 | C3-11 siloxane unit copolymerization ratio<br>Mw = 5500 | 40/40/20 | (18) | R = —CH$_2$COOC(CH$_3$)$_3$ | 25 | triphenylsulfonium-2,4,6-triisopropylphenyl sulfonate |
| 58 | C3-14 siloxane unit copolymerization ratio<br>Mw = 6600 | 55/30/15 | (60) | R = —CH$_2$COOC(CH$_3$)$_3$ | 25 | triphenylsulfonium-2,4,6-triisopropylphenyl sulfonate |
| 59 | C3-6 siloxane unit copolymerization ratio<br>Mw = 7900 | 50/50 | (60) | R = —CH$_2$COOC(CH$_3$)$_3$ | 25 | triphenylsulfonium-2,4,6-triisopropylphenyl sulfonate |
| 60 | C3-4 siloxane unit compolymerization ratio<br>Mw = 12300 | 50/50 | (60) | R = —CH$_2$COOC(CH$_3$)$_3$ | 25 | triphenylsulfonium-2,4,6-triisopropylphenyl sulfonate |
| 61 | C3-5 siloxane unit copolymerization ratio<br>Mw = 5600 | 50/50 | (70) | | 35 | triphenylsulfonium-2,4,6-triisopropylphenyl sulfonate |
| 62 | C3-10 siloxane unit copolymerization ratio<br>Mw = 8000 | 60/40 | (70) | | 25 | triphenylsulfonium-2,4,6-triisopropylphenyl sulfonate |
| 63 | C3-13 siloxane unit copolymerization ratio<br>Mw = 4900 | 50/35/15 | (73) | | 25 | triphenylsulfonium-2,4,6-triisopropylphenyl sulfonate |

*1: copolymerization molar ratio before the protection with an acid-decomposable group.

TABLE 10

| Example | Resolution, μm | Sensitivity, mJ/cm² | Rectangularity, observed by SEM | Dimensional Shift after Etching, μm |
|---|---|---|---|---|
| 50 | 0.17 | 22 | B | 0.007 |
| 51 | 0.17 | 25 | A | 0.007 |
| 52 | 0.16 | 24 | A | 0.009 |
| 53 | 0.17 | 25 | B | 0.010 |
| 54 | 0.17 | 23 | B | 0.011 |
| 55 | 0.16 | 25 | A | 0.007 |
| 56 | 0.16 | 26 | A | 0.007 |
| 57 | 0.17 | 25 | A | 0.006 |
| 58 | 0.16 | 23 | B | 0.007 |
| 59 | 0.16 | 22 | A | 0.006 |
| 60 | 0.17 | 24 | B | 0.009 |
| 61 | 0.17 | 23 | B | 0.010 |
| 62 | 0.18 | 25 | A | 0.007 |
| 63 | 0.17 | 23 | B | 0.009 |

TABLE 11

| Comparative Example | Resolution, μm | Sensitivity, mJ/cm² | Rectangularity, observed by SEM | Dimensional Shift after Etching, μm |
|---|---|---|---|---|
| 5 | 0.21 | 38 | B | 0.016 |
| 6 | 0.19 | 32 | C | 0.012 |

From the results shown in Tables 9 to 11, the followings are apparently seen.

The positive photoresist composition using the polysiloxane of the present invention gives a resist having good balance in the properties with high resolution, good rectangularity and small dimensional shift after the etching.

On the other hand, in Comparative Examples 5 and 6 where the polysiloxane of the present invention is not used, the balance in the above-described properties is bad.

SYNTHESIS EXAMPLE 8

Synthesis of Polysiloxane (C4-4')

22.1 g of 3'-aminopropyltrimethoxysilane was added to 200 ml of dried N,N-dimethylacetamide and thereto, 16.1 g of norbornenedicarboxylic acid anhydride was added. The resulting mixture was reacted at 100° C. for 15 hours in a dry nitrogen atmosphere and then, the reaction solution was returned to room temperature (this is referred to as "reaction intermediate solution A"). To the solution A, 20 g of phenyltrimethoxysilane, 2 g of dimethylaminopyridine and 15 g of distilled water were added and reacted at 50° C. for 3 hours and then at 130 to 140° C. for 12 hours. The reaction solution was neutralized with diluted hydrochloric acid and poured into 3 L of distilled water while stirring to obtain a powdered white polymer. This polymer was dissolved in 200 ml of acetone, distilled water was added thereto while stirring to remove by fractionation the oligomer component of the polymer, and the lower layer was reprecipitated in 2 L of distilled water to obtain a white polymer. This polymer was measured on the average molecular weight by GPC (polystyrene standard) and found to have a weight-average molecular weight of 3,900. The content of the components having a molecular weight of 1,000 or less was 14% in terms of the GPC area ratio.

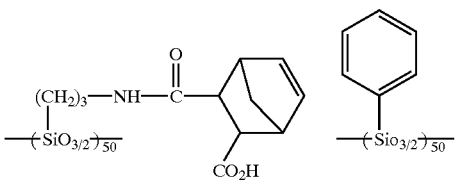

(C4-4')

SYNTHESIS EXAMPLE 9

Synthesis of Polysiloxane (C4-4)

20 g of vacuum dried polysiloxane (C4-4') was dissolved in 100 ml of THF and thereto 4.3 g of tetrahydropyranyl ether and 20 mg of p-toluenesulfonic acid monohydrate were added, followed by reaction at room temperature for 10 hours.

The reaction was quenched by adding triethylamine and the reaction solution was added to 2 L of distilled water to precipitate a polymer. The polymer obtained was vacuum dried at room temperature to obtain 19 g of the objective polysiloxane (C4-4).

The protection ratio with tetrahydropyranyl ether was determined by NMR and found to be 91%. This polymer was measured on the average molecular weight in the same manner as in Synthesis Example 8 and found to have a weight-average molecular weight of 4,600.

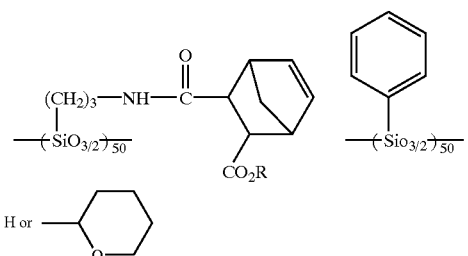

(C4-4)

SYNTHESIS EXAMPLE 10

Synthesis of Polysiloxane (C4-11')

20 g of 3-chloropropyltrimethoxysilane was added to 200 ml of dried N,N-dimethylacetamide and thereto, 38.7 g of diphenolic acid, 3.0 g of potassium iodide and 16.0 g of DBU (1,8-diazabicyclo[5.4.0]-7-undecene) were added. The resulting mixture was reacted at 70 to 90° C. for 5 hours in a dry nitrogen atmosphere (this is referred to as "reaction intermediate solution B"). The solution B was returned to room temperature and added to the Solution A described in Synthesis Example 8 and thereto, 2 g of dimethylaminopyridine and 15 g of distilled water were added and reacted at 50° C. for 3 hours and then at 130 to 140° C. for 12 hours. The reaction solution was neutralized with diluted hydrochloric acid and poured into 3 L of distilled water while stirring to obtain a powdered white polymer. This polymer was dissolved in 200 ml of acetone, distilled water was added thereto while stirring to remove by fractionation the oligomer component of the polymer, and the lower layer was reprecipitated in 2 L of distilled water to obtain a white polymer. This polymer was measured on the average molecular weight by GPC (polystyrene standard) and found to have a weight-average molecular weight of 3,300. The content of the components having a molecular weight of 1,000 or less was 8% in terms of the GPC area ratio.

(C4-11')

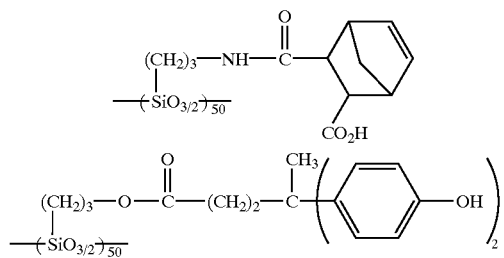

SYNTHESIS EXAMPLE 11

Synthesis of Polysiloxane (C4-11)

20 g of vacuum dried polysiloxane (C4-11') was dissolved in 100 ml of THF and thereto 3.3 g of ethyl vinyl ether and 20 mg of p-toluenesulfonic acid monohydrate were added, followed by reaction at room temperature for 10 hours.

The reaction was quenched by adding triethylamine and the reaction solution was poured while stirring into 2 L of distilled water to precipitate a polymer. The polymer obtained was dried under reduced pressure at room temperature to obtain 17 g of the objective polysiloxane (C4-11).

The protection ratio with ethyl vinyl ether was determined by NMR and found to be 65%. This polymer was measured on the average molecular weight in the same manner as in Synthesis Example 10 and found to have a weight-average molecular weight of 3,650.

(C4-11)

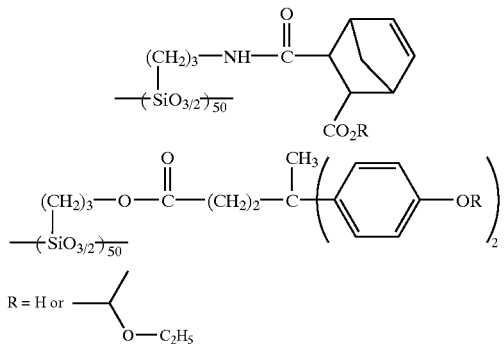

SYNTHESIS EXAMPLE 12

Synthesis of Polysiloxane (C4-18')

To the intermediate solution A of Synthesis Example 8, the intermediate B of Synthesis Example 10, 20 g of phenyltrimethoxysilane, 2 g of dimethylaminopyridine and 23 g of distilled water were added and reacted at 50° C. for 3 hours and then at 130 to 140° C. for 12 hours. The reaction solution was neutralized with diluted hydrochloric acid and poured into 3 L of distilled water while stirring to obtain a powdered white polymer. This polymer was dissolved in 200 ml of acetone, distilled water was added thereto while stirring to remove by fractionation the oligomer component of the polymer, and the lower layer was reprecipitated in 2 L of distilled water to obtain a white polymer. This polymer was measured on the average molecular weight by GPC (polystyrene standard) and found to have a weight-average molecular weight of 4,500. The content of the components having a molecular weight of 1,000 or less was 8% in terms of the GPC area ratio.

(C4-18')

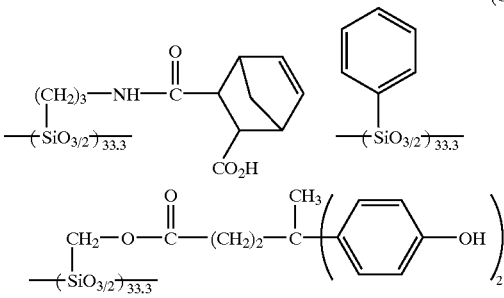

SYNTHESIS EXAMPLE 13

Synthesis of Polysiloxane (C4-18)

Polysiloxane (C4-18') was vacuum dried and 20 g thereof was dissolved in 100 ml of THF. After adding 4.8 g of di-tert-butyl dicarbonate thereto, 2.8 g of triethylamine was added dropwise over 1 hour and reacted at room temperature for 10 hours. The reaction solution was poured into 2 L of distilled water while stirring to precipitate a polymer and the polymer was dried under reduced pressure at room temperature to obtain 18.2 g of the objective polysiloxane (C4-18).

The conversion into t-BOC was determined by NMR and found to be 72%. This polymer was measured on the average molecular weight in the same manner as in Synthesis Example 12 and found to have a weight-average molecular weight of 5,100.

(C4-18)

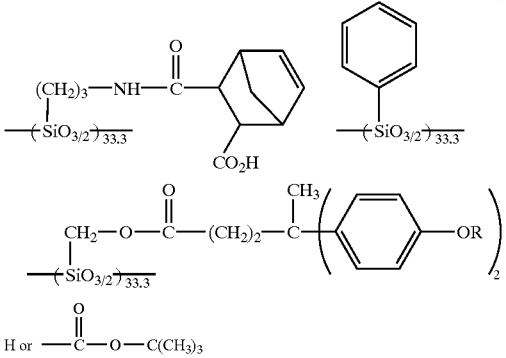

EXAMPLE 64

2 g of polysiloxane (C4-4) as the acid-decomposable siloxane (component (a)), 0.08 g of triphenylsulfonium-2, 4,6-triisopropylphenyl sulfonate as the compound capable of generating an acid upon exposure (component (b)) and 0.012 g of triphenylimidazole were dissolved in 19.2 g of propylene glycol monomethyl ether acetate and the resulting mixture was precision-filtered through a 0.1-μm membrane filter.

FHi-028D resist (resist for i-line, produced by Fuji Film Olin) was coated on a silicon wafer using a coater CDS-650 manufactured by Canon and baked at 90° C. for 90 seconds to form a uniform film having a thickness of 0.83 µm. This was further heated at 200° C. for 3 minutes and then the film thickness was reduced to 0.71 µm. On this film, the silicon-containing resist prepared above was coated and baked at 90° C. for 90 seconds to provide a layer having a thickness of 0.20 µm.

The thus-obtained wafer was exposed by KrF excimer laser stepper FPA-3000EX3 manufactured by Canon in which a resolution mask was loaded, while varying the exposure amount and the focus. Thereafter, the wafer was heated at 120° C. for 90 seconds in a clean room, developed with tetramethylammonium hydroxide developer (2.38%) for 60 seconds, rinsed with distilled water and dried to obtain a pattern. This pattern was observed by a scanning-type electron microscope, as a result, a line/space of 0.15 µm was resolved with a sensitivity of 37 mJ/cm². The rectangularity of the section was rated A.

The rectangularity of the section was compared according to the three-stage evaluation as follows. The angle of the substrate and resist pattern to the side wall was measured and those having an angle of 80° to 80° were rated A, those of 70° to less than 80° were rated B. and those of less than 70° were rated C. The wafer was further etched with oxygen as the etching gas using a parallel plate-type reactive ion etching apparatus manufactured by Albak for 15 minutes under the conditions that the pressure was 20 mTorr and the applied power was 100 mW/cm2, and then observed through a scanning-type electron microscope. As a result, the dimensional shift of the 0.15-µm pattern was 0.005 µm.

EXAMPLES 65 TO 77

Positive photoresists were prepared thoroughly in the same manner as in Example 64 except for using the polysiloxane (component (a)) and the component (b) shown in Table 12 in place of the acid-decomposable siloxane (component (a)) and the component (b) of Example 64. These were exposed, developed and etched in the same manner as in Example 64.

The resist capabilities obtained are shown together in Table 13.

EXAMPLE 78

A positive photoresist was prepared thoroughly in the same manner as in Example 64 except for using 1.9 g of polysiloxane (C4-11) as the acid-decomposable siloxane (component (a)), 0.12 g of triphenylsulfonium-2,4,6-triisopropylphenyl sulfonate as the acid-generating compound (component (b)), and 0.012 g of triphenylimidazole and 0.143 g of Compound (60) (where R is —CH$_2$COOC(CH$_3$)$_3$) as the component (c). This was coated, exposed, developed and etched in the same manner as in Example 64 and observed through a scanning-type electron microscope. The resist prepared is shown in Table 14 and the evaluation results are shown in Table 15.

EXAMPLES 79 TO 91

Positive photoresists were prepared thoroughly in the same manner as in Example 78 except for using the siloxane, the component (b) and the component (c) shown in Table 14 in place of the acid-decomposable siloxane, the component (b) and the component (c) of Example 78. These were exposed, developed and etched in the same manner as in Example 78. The resist capabilities obtained are shown together in Table 15.

COMPARATIVE EXAMPLE 7

A resist shown in Table 16 was prepared using polysiloxane (D-1) shown below in place of the polysiloxane of Example 64. This was coated, exposed, developed and etched thoroughly in the same manner as in Example 64 and observed through a scanning-type electron microscope in the same manner as in Example 64. The results are shown in Table 16.

COMPARATIVE EXAMPLE 8

A resist shown in Table 16 was prepared using polysiloxane (D-2) shown below in place of the polysiloxane of Example 64. This was coated, exposed, developed and etched thoroughly in the same manner as in Example 64 and observed through a scanning-type electron microscope in the same manner as in Example 64. The results are shown in Table 16.

The polysiloxanes used in Comparative :Examples are shown below.

Compounds used in Comparative Examples

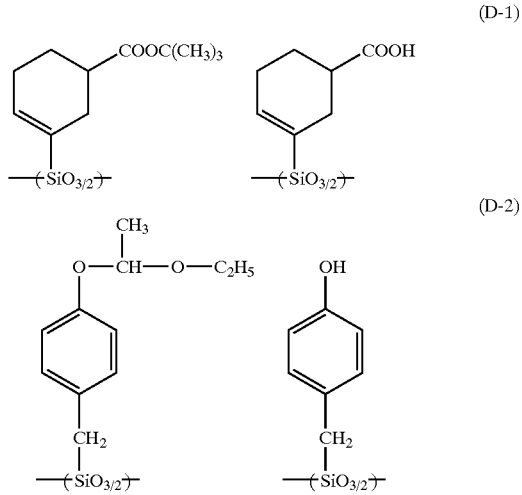

TABLE 12

| Example | Siloxane Polymer (Component a) | | Acid-Generating Agent (Component b) |
|---|---|---|---|
| 64 | C4-4 | | triphenylsulfonium-2,4,6-triisopropylphenyl sulfonate |
| | siloxane unit copolymerization ratio | 50/50 | |
| | protection ratio by acid-decomposable group | 81% | |
| | Mw = 4600 | | |

TABLE 12-continued

| Example | Siloxane Polymer (Component a) | | Acid-Generating Agent (Component b) |
|---|---|---|---|
| 65 | C4-4<br>siloxane unit copolymerization ratio<br>protection ratio by acid-decomposable group<br>Mw = 3900 | 40/60<br>91% | triphenylsulfoniumpentafluorophenyl sulfonate |
| 66 | C4-1<br>siloxane unit copolymerization ratio<br>protection ratio by acid-decomposable group<br>Mw = 5600 | 50/50<br>75% | triphenylsulfonium-2,4,6-triisopropylphenyl sulfonate |
| 67 | C4-11<br>siloxane unit copolymerization ratio<br>protection ratio by acid-decomposable group<br>Mw = 6400 | 50/50<br>55% | bis(p-t-amylphenyl)iodonium-p-toluene sulfonate |
| 68 | C4-11<br>siloxane unit copolymerization ratio<br>protection ratio by acid-decomposable group<br>Mw = 5800 | 50/50<br>65% | diphenyliodoniumtrifluoromethane sulfonate |
| 69 | C4-11<br>siloxane unit copolymerization ratio<br>protection ratio by acid-decomposable group<br>Mw = 5600 | 50/50<br>46% | triphenylsulfonium-2,4,6-triisopropylphenyl sulfonate |
| 70 | C4-12<br>siloxane unit copolymerization ratio<br>protection ratio by acid-decomposable group<br>Mw = 8600 | 50/50<br>53% | triphenylsulfonium-p-dodecylphenyl sulfonate |
| 71 | C4-12<br>siloxane unit copolymerization ratio<br>protection ratio by acid-decomposable group<br>Mw = 7300 | 50/50<br>74% | triphenylsulfonium-2,4,6-triisopropylphenyl sulfonate |
| 72 | C4-18<br>siloxane unit copolymerization ratio<br>protection ratio by acid-decomposable group<br>Mw = 5800 | 40/40/20<br>48% | triphenylsulfonium-2,4,6-triisopropylphenyl sulfonate |
| 73 | C4-18<br>siloxane unit copolymerization ratio<br>protection ratio by acid-decomposable group<br>Mw = 5900 | 30/50/20<br>64% | triphenylsulfoniumnanofluorobutane sulfonate |
| 74 | C4-19<br>siloxane unit copolymerization ratio<br>protection ratio by acid-decomposable group<br>Mw = 5500 | 40/40/20<br>51% | triphenylsulfonium-2,4,6-triisopropylphenyl sulfonate |
| 75 | C4-19<br>siloxane unit copolymerization ratio<br>protection ratio by acid-decomposable group<br>Mw = 2600 | 30/50/20<br>51% | bis(p-t-amylphenyl)iodoniumpenta-fluorophenyl sulfonate |
| 76 | C4-21<br>siloxane unit copolymerization ratio<br>protection ratio by acid-decomposable group<br>Mw = 4800 | 50/30/20<br>64% | triphenylsulfonium-2,4,6-triisopropylphenyl sulfonate |
| 77 | C4-21<br>siloxane unit copolymerization ratio<br>protection ratio by acid-decomposable group<br>Mw = 7600 | 25/55/20<br>48% | diphenyliodoniumtrifluoromethane sulfonate |

TABLE 13

| Example | Resolution, μm | Sensitivity, mJ/cm² | Rectangularity, observed by SEM | Dimensional Shift after Etching, μm |
|---|---|---|---|---|
| 64 | 0.15 | 37 | A | 0.005 |
| 65 | 0.16 | 28 | A | 0.006 |
| 66 | 0.15 | 33 | A | 0.005 |
| 67 | 0.15 | 42 | A | 0.005 |
| 66 | 0.16 | 29 | A | 0.006 |
| 69 | 0.16 | 35 | A | 0.005 |
| 70 | 0.17 | 52 | A | 0.007 |
| 71 | 0.16 | 38 | A | 0.006 |
| 72 | 0.16 | 36 | A | 0.006 |
| 73 | 0.15 | 30 | B | 0.007 |
| 74 | 0.16 | 33 | A | 0.005 |
| 75 | 0.17 | 41 | B | 0.007 |
| 76 | 0.17 | 34 | A | 0.006 |
| 77 | 0.16 | 34 | B | 0.007 |

TABLE 14

| Example | Siloxane Polymer (Component a) | | Component c | Amount Added of Component c (based on Component a, wt %) | Acid-Generating Agent (Component b) |
|---|---|---|---|---|---|
| 78 | C4-11 | | (60) | 7.5 | triphenylsulfonium-2,4,6-triisopropyl-phenyl sulfonate |
| | siloxane unit copolymerization ratio | 50/50 | R = —CH$_2$COOC(CH$_3$)$_3$ | | |
| | protection ratio by acid-decomposable group | 42% | | | |
| | Mw = 8100 | | | | |
| 79 | C4-11 | | (60) | 15 | triphenylsulfonium-2,4,6-triisopropyl-phenyl sulfonate |
| | siloxane unit copolymerization ratio | 50/50 | R = —CH$_2$COOC(CH$_3$)$_3$ | | |
| | protection ratio by acid-decomposable group | 60% | | | |
| | Mw = 8500 | | | | |
| 80 | C4-11 | | (60) | 2 | triphenylsulfonium-2,4,6-triisopropyl-phenyl sulfonate |
| | siloxane unit copolymerization ratio | 50/50 | R = —CH$_2$COOC(CH$_3$)$_3$ | | |
| | protection ratio by acid-decomposable group | 81% | | | |
| | Mw = 8600 | | | | |
| 81 | C4-11 | | (60) | 10 | triphenylsulfonium-pentafluorophenyl sulfonate |
| | siloxane unit copolymerization ratio | 60/40 | R = —CH$_2$COOC(CH$_3$)$_3$ | | |
| | protection ratio by acid-decomposable group | 35% | | | |
| | Mw = 6500 | | | | |
| 82 | C4-11 | | (72) | 10 | triphenylsulfonium-2,4,6-triisopropyl-phenyl sulfonate |
| | siloxane unit copolymerization ratio | 60/40 | | | |
| | protection ratio by acid-decomposable group | 50% | | | |
| | Mw = 7200 | | | | |
| 83 | C4-12 | | (60) | 10 | triphenylsulfonium-2,4,6-triisopropyl-phenyl sulfonate |
| | siloxane unit copolymerization ratio | 60/40 | R = —CH$_2$COOC(CH$_3$)$_3$ | | |
| | protection ratio by acid-decomposable group | 45% | | | |
| | Mw = 5800 | | | | |
| 84 | C4-19 | | (70) | 15 | triphenylsulfonium-2,4,6-triisopropyl-phenyl sulfonate |
| | siloxane unit copolymerization ratio | 40/40/20 | | | |
| | protection ratio by acid-decomposable group | 60% | | | |
| | Mw = 8100 | | | | |
| 85 | C4-19 | | (18) | 10 | triphenylsulfonium-2,4,6-triisopropyl-phenyl sulfonate |
| | siloxane unit copolymerization ratio | 40/40/20 | R = —CH$_2$COOC(CH$_3$)$_{32}$ | | |
| | protection ratio by acid-decomposable group | 58% | | | |
| | Mw = 5300 | | | | |
| 86 | C4-18 | | (60) | 2 | triphenylsulfonium-2,4,6-triisopropyl-phenyl sulfonate |
| | siloxane unit copolymerization ratio | 50/30/20 | R = —CH$_2$COOC(CH$_3$)$_3$ | | |
| | protection ratio by acid-decomposable group | 65% | | | |
| | Mw = 3100 | | | | |

TABLE 14-continued

| Example | Siloxane Polymer (Component a) | | Component c | Amount Added of Component c (based on Component a, wt %) | Acid-Generating Agent (Component b) |
|---|---|---|---|---|---|
| 87 | C4-18 siloxane unit copolymerization ratio | 50/30/20 | (60) R = —CH$_2$COOC(CH$_3$)$_3$ | 12 | triphenylsulfonium-2,4,6-triisopropyl-phenyl sulfonate |
| | protection ratio by acid-decomposable group | 80% | | | |
| | Mw = 8900 | | | | |
| 88 | C4-12 siloxane unit copolymerization ratio | 50/50 | (73) | 8 | triphenylsulfonium-2,4,6-triisopropyl-phenyl sulfonate |
| | protection ratio by acid-decomposable group | 65% | | | |
| | Mw = 3100 | | | | |
| 89 | C4-1 siloxane unit copolymerization ratio | 50/50 | (60) R = —CH$_2$COOC(CH$_3$)$_3$ | 8 | triphenylsulfonium-2,4,6-triisopropyl-phenyl sulfonate |
| | protection ratio by acid-decomposable group | 80% | | | |
| | Mw = 8900 | | | | |
| 90 | C4-4 siloxane unit copolymerization ratio | 60/40 | (60) R = —CH$_2$COOC(CH$_3$)$_3$ | 10 | triphenylsulfonium-2,4,6-triisopropyl-phenyl sulfonate |
| | protection ratio by acid-decomposable group | 63% | | | |
| | Mw = 6100 | | | | |
| 91 | C4-4 siloxane unit copolymerization ratio | 50/50 | (60) R = —CH$_2$COOC(CH$_3$)$_3$ | 8 | triphenylsulfonium-2,4,6-triisopropyl-phenyl sulfonate |
| | protection ratio by acid-decomposable group | 55% | | | |
| | Mw = 5000 | | | | |

TABLE 15

| Example | Resolution, μm | Sensitivity, mJ/cm$^2$ | Rectangularity, observed by SEM | Dimensional Shift after Etching, μm |
|---|---|---|---|---|
| 78 | 0.16 | 41 | A | 0.006 |
| 79 | 0.17 | 38 | A | 0.005 |
| 80 | 0.18 | 35 | B | 0.011 |
| 81 | 0.16 | 26 | A | 0.006 |
| 82 | 0.15 | 37 | A | 0.005 |
| 83 | 0.16 | 33 | A | 0.006 |
| 84 | 0.17 | 38 | B | 0.009 |
| 85 | 0.15 | 35 | A | 0.006 |
| 86 | 0.16 | 33 | A | 0.007 |
| 87 | 0.18 | 39 | B | 0.011 |
| 88 | 0.16 | 37 | A | 0.006 |
| 89 | 0.16 | 34 | A | 0.005 |
| 90 | 0.15 | 39 | A | 0.006 |
| 91 | 0.16 | 33 | A | 0.007 |

TABLE 16

| Comparative Example | Resolution, μm | Sensitivity, mJ/cm$^2$ | Rectangularity, observed by SEM | Dimensional Shift after Etching, μm |
|---|---|---|---|---|
| 7 | 0.22 | 36 | B | 0.020 |
| 8 | 0.019 | 35 | C | 0.012 |
| 9 | 0.20 | 38 | C | 0.011 |

From the results shown in Tables 13, 15 and 16, the followings are apparently seen. The positive photoresist composition of the present invention using the polysiloxane of the present invention gives a resist having good balance in the properties with high resolution, good rectangularity and small dimensional shift after the etching.

On the other hand, in Comparative Examples 7 and 8 where the polysiloxane of the present invention is not used, the balance in the above-described properties is bad.

From the positive photoresist composition of the present invention using the polysiloxane of the present invention, a high-sensitivity and high-resolution rectangular resist can be obtained. In the case of using the composition as the upper resist of a two-layer resist system, a fine pattern reduced in the dimensional shift and favored with a high aspect ratio can be formed at the transfer of a pattern to the lower layer using an oxygen-type plasma etching process.

While the invention has been described in detail and with reference to specific embodiments thereof, it will be apparent to one skilled in the art that various changes and modifications can be made therein without departing from the spirit and scope thereof.

This application is based on Japanese patent applications No. Hei-11-275332 filed on Sep. 28, 1999, No. Hei-11-275335 filed on Sep. 28, 1999, No. Hei-11-277016 filed on Sep. 29, 1999, and No. Hei-11-277017 filed on Sep. 29, 1999, the entire contents of which are incorporated herein by reference.

What is claimed is:

1. A positive photoresist composition comprising an alkali-soluble polysiloxane 3 containing as a copolymerization component at least a structural unit represented by the following formula (I'):

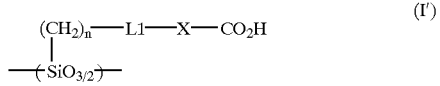

wherein L1 represents at least one divalent linking group selected from —A—OCO—, —A—COO—, —A—NHCO—, —A—NHCOO—, —A—NHCONH—, —A—CONH—, —A—OCONH— and —A—S—, A represents a single bond or an arylene group, X represents a divalent linking group, and n represents an integer of 1 to 6.

2. The positive photoresist composition as claimed in claim 1, wherein in the structural unit represented by formula (I'), X is an aromacyclic or alicyclic group.

3. The positive photoresist composition as claimed in claim 1, wherein the alkali-soluble polysiloxane 3 further contains as a copolymerization component a structural unit represented by the following formula (II"):

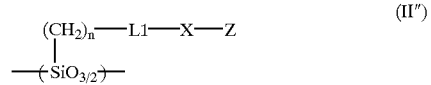

wherein L1 represents at least one divalent linking group selected from —A—OCO—, —A—COO—, —A—NHCO—, —A—NHCOO—, —A—NHCONH—, —A—CONH—, —A—OCONH— and —A—S—, A represents a single bond or an arylene group, X represents a divalent linking group, Z represents

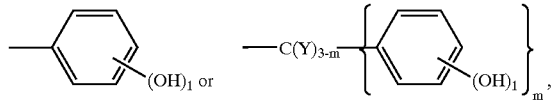

Y represents hydrogen atom, a linear, branched or cyclic alkyl group, an aryl group or an aralkyl group, 1 represents an integer of 1 to 3, m represents an integer of 1 to 3, and n represents an integer of 1 to 6.

4. A positive photoresist composition comprising:
(a) the polysiloxane 3 described in claim 1,
(b) a compound which decomposes upon exposure to generate an acid, and
(c) a phenolic compound in which phenolic hydroxyl groups contained within the molecule are partially or completely protected by a group capable of decomposing by an acid, or an aromatic or aliphatic carboxylic acid compound in which carboxyl groups contained within the molecule are partially or completely protected by a group capable of decomposing by an acid.

5. A positive photoresist composition comprising an acid-decomposable polysiloxane 4 containing at least a structural unit represented by the following formula (I"):

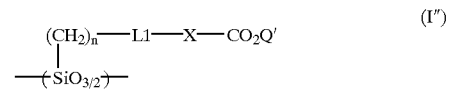

wherein L1 represents at least one divalent linking group selected from —A—OCO—, —A—COO—, —A—NHCO—, —A—NHCOO—, —A—NHCONH—, —A—CONH—, —A—OCONH— and —A—S—, A represents a single bond or an arylene group, X represents a divalent linking group, Q' represents hydrogen atom or an acid-decomposable group, provided that all Q' in the polysiloxane 4 containing the structural unit represented by formula (I") are not hydrogen atom at the same time, and n represents an integer of 1 to 6.

6. The positive photoresist composition as claimed in claim 5, wherein in the structural unit represented by formula (II"), X is an aromacyclic or alicyclic group.

7. The positive photoresist composition as claimed in claim 5, wherein the acid-decomposable polysiloxane 4 contains both a structural unit represented by formula (I") and a structural unit represented by the following formula (II'''):

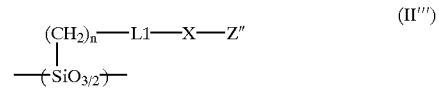

wherein L1 represents at least one divalent linking group selected from —A—OCO—, —A—COO—, —A—NHCO—, —A—NHCOO—, —A—NHCONH—., —A—CONH—, —A—OCONH— and —A—S—, A represents a single bond or an arylene group, X represents a divalent linking group, Z" represents

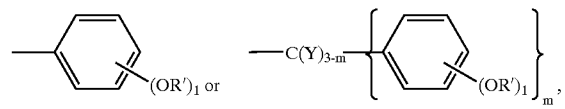

R' represents hydrogen atom or a group capable of decomposing by an acid, Y represents hydrogen atom, a linear, branched or cyclic alkyl group, an aryl group or an aralkyl group, 1 represents an integer of 1 to 3, m represents an integer of 1 to 3, and n represents an integer of 1 to 6.

8. A positive photoresist composition comprising:
(a) the acid-decomposable polysiloxane 4 described in claim 5, and
(b) a compound which decomposes upon exposure to generate an acid.

9. The positive photoresist composition as claimed in claim 8, which further contains (c) a phenolic compound in which phenolic hydroxyl groups contained within the molecule are partially or completely protected by a group capable of decomposing by an acid, or an aromatic or aliphatic carboxylic acid compound in which carboxyl groups contained within the molecule are partially or completely protected by a group capable of decomposing by an acid.

* * * * *